(12) United States Patent
Cheng et al.

(10) Patent No.: US 12,446,261 B2
(45) Date of Patent: Oct. 14, 2025

(54) MULTI-GATE DEVICES AND METHOD OF FORMING THE SAME

(71) Applicant: Taiwan Semiconductor Manufacturing Company, Ltd., Hsin-Chu (TW)

(72) Inventors: Ming-Lung Cheng, Kaohsiung County (TW); Huang-Hsuan Lin, Hsinchu (TW); Chih Chieh Yeh, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 550 days.

(21) Appl. No.: 17/832,338

(22) Filed: Jun. 3, 2022

(65) Prior Publication Data

US 2023/0395679 A1 Dec. 7, 2023

(51) Int. Cl.
| | |
|---|---|
| H01L 29/423 | (2006.01) |
| H01L 29/06 | (2006.01) |
| H10D 30/67 | (2025.01) |
| H10D 62/10 | (2025.01) |
| H10D 64/01 | (2025.01) |

(52) U.S. Cl.
CPC ..... H10D 30/6735 (2025.01); H10D 30/6757 (2025.01); H10D 62/118 (2025.01); H10D 64/017 (2025.01); H10D 64/018 (2025.01)

(58) Field of Classification Search
None
See application file for complete search history.

(56) References Cited

U.S. PATENT DOCUMENTS

| 10,256,301 B1* | 4/2019 | Reznicek ............. H01L 29/167 |
| 2020/0044087 A1 | 2/2020 | Guha |
| 2021/0367032 A1 | 11/2021 | Chen |
| 2021/0384310 A1 | 12/2021 | Yuan |
| 2022/0037493 A1 | 2/2022 | Feng |

FOREIGN PATENT DOCUMENTS

TW 202109636 A 3/2021

OTHER PUBLICATIONS

Chang et al. "Multi-Gate Device and Related Methods," U.S. Appl. No. 17/651,061, filed Feb. 14, 2022, Assignee: Taiwan Semiconductor Manufacturing Company, Ltd., 43 pages of Specification, 16 pages of Drawings.

* cited by examiner

Primary Examiner — Asok K Sarkar
(74) Attorney, Agent, or Firm — HAYNES AND BOONE, LLP

(57) ABSTRACT

Semiconductor structures and methods of forming the same are provided. In an embodiment, an exemplary semiconductor structure includes a vertical stack of channel members disposed over a substrate, a gate structure wrapping around each channel member of the vertical stack of channel members, a dielectric feature disposed directly on the substrate and in direct contact with a portion of the vertical stack of channel members, and a source/drain feature disposed directly on the dielectric feature and electrically coupled to a remaining portion of the vertical stack of channel members.

20 Claims, 46 Drawing Sheets

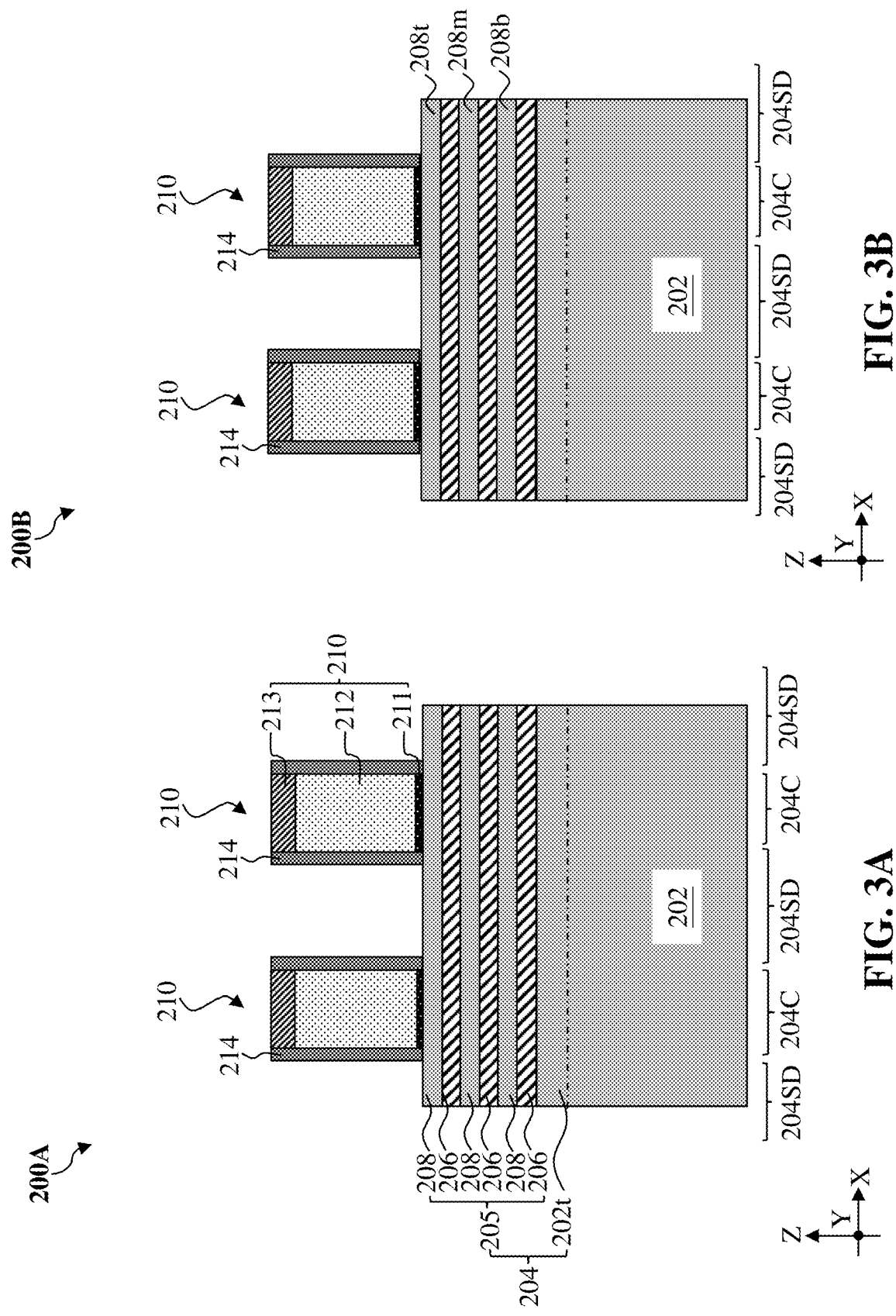

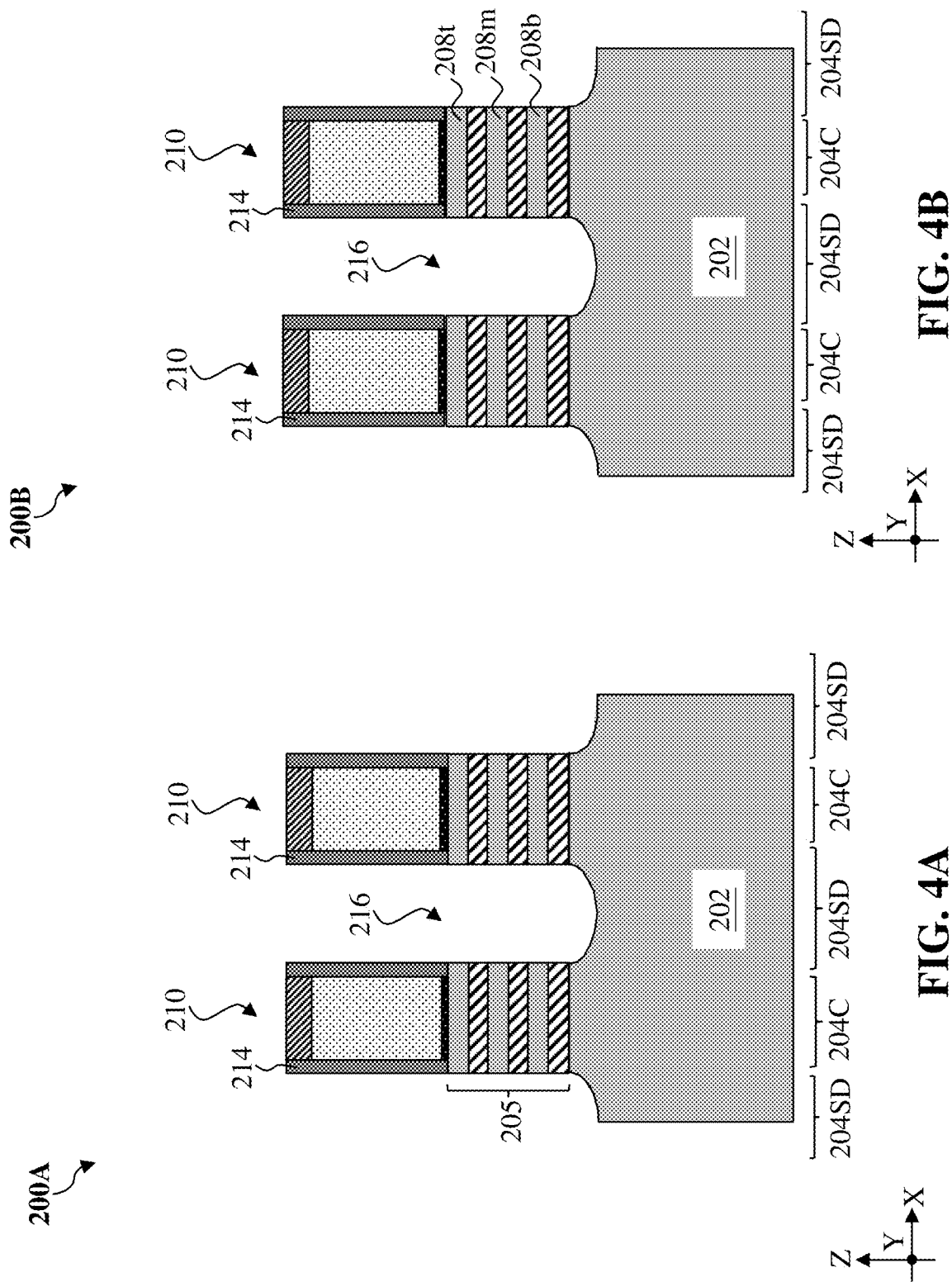

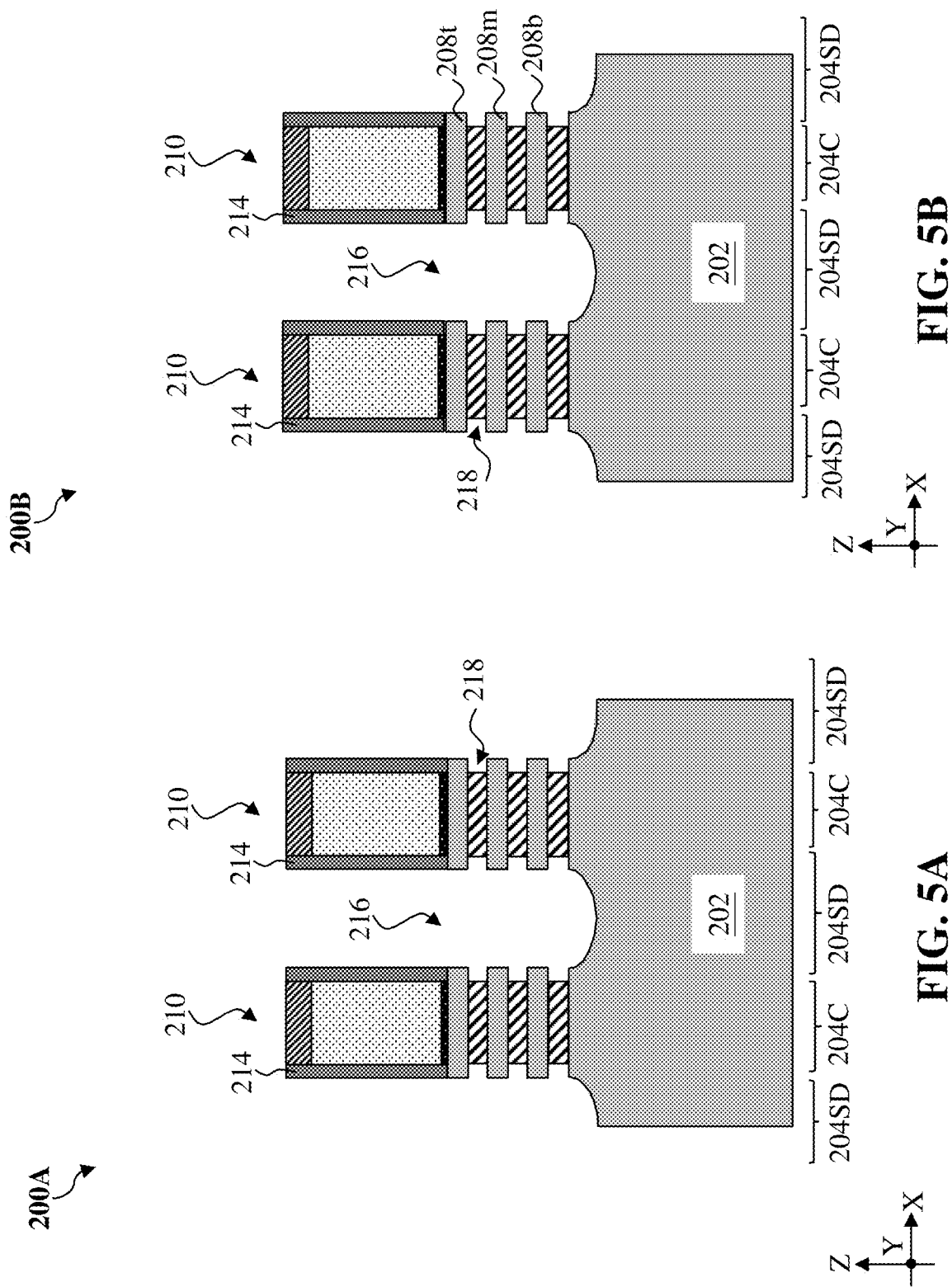

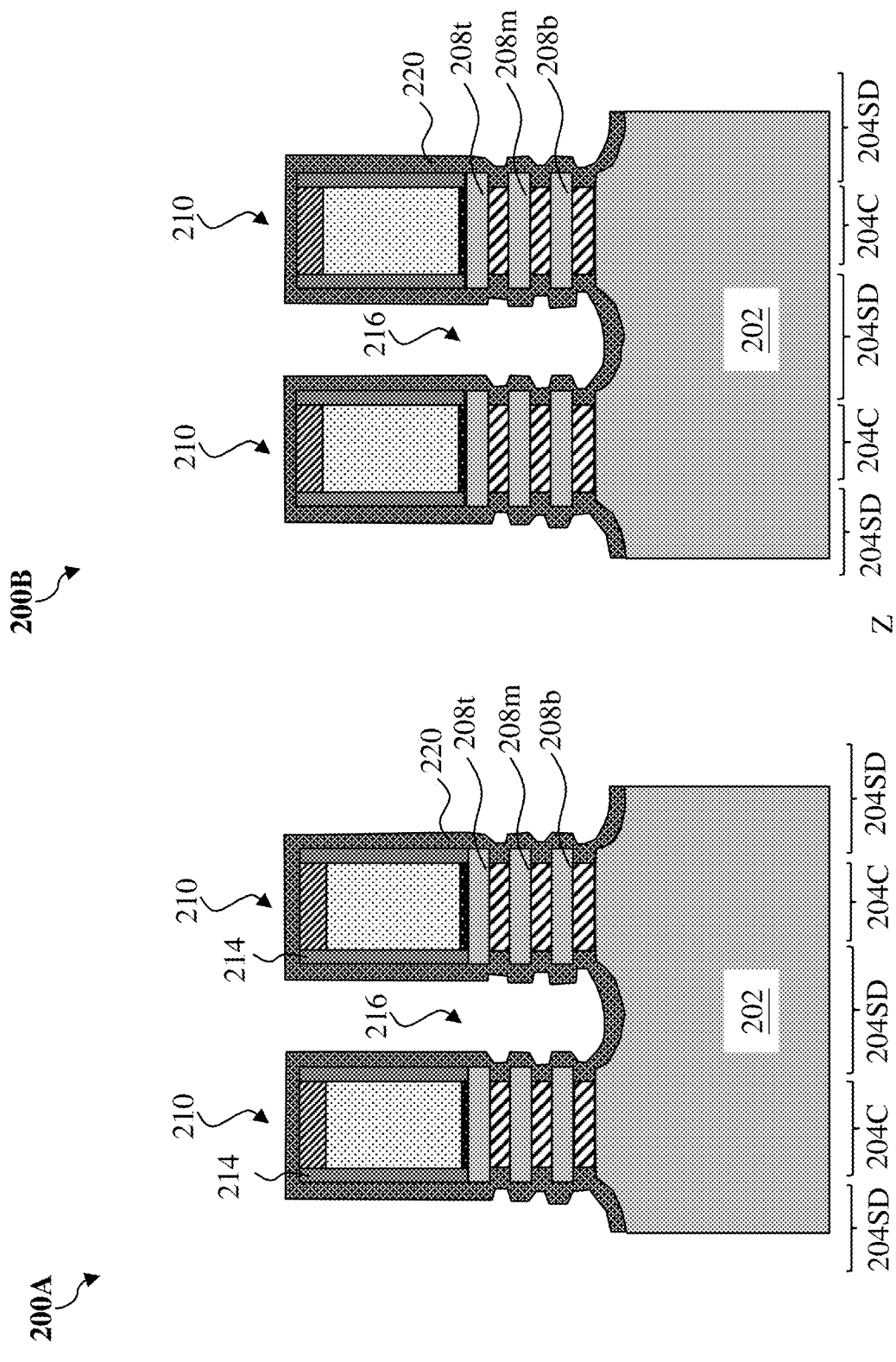

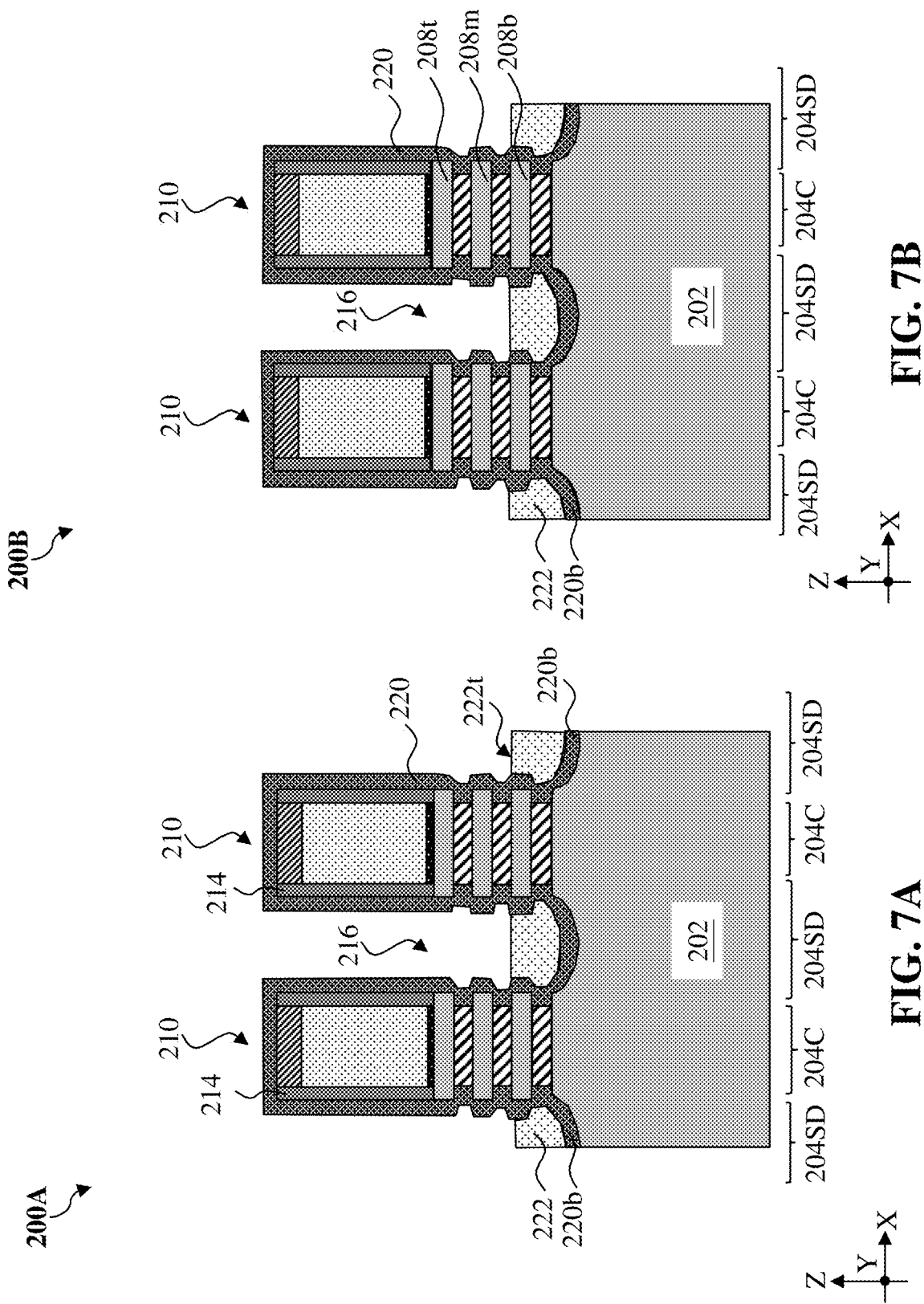

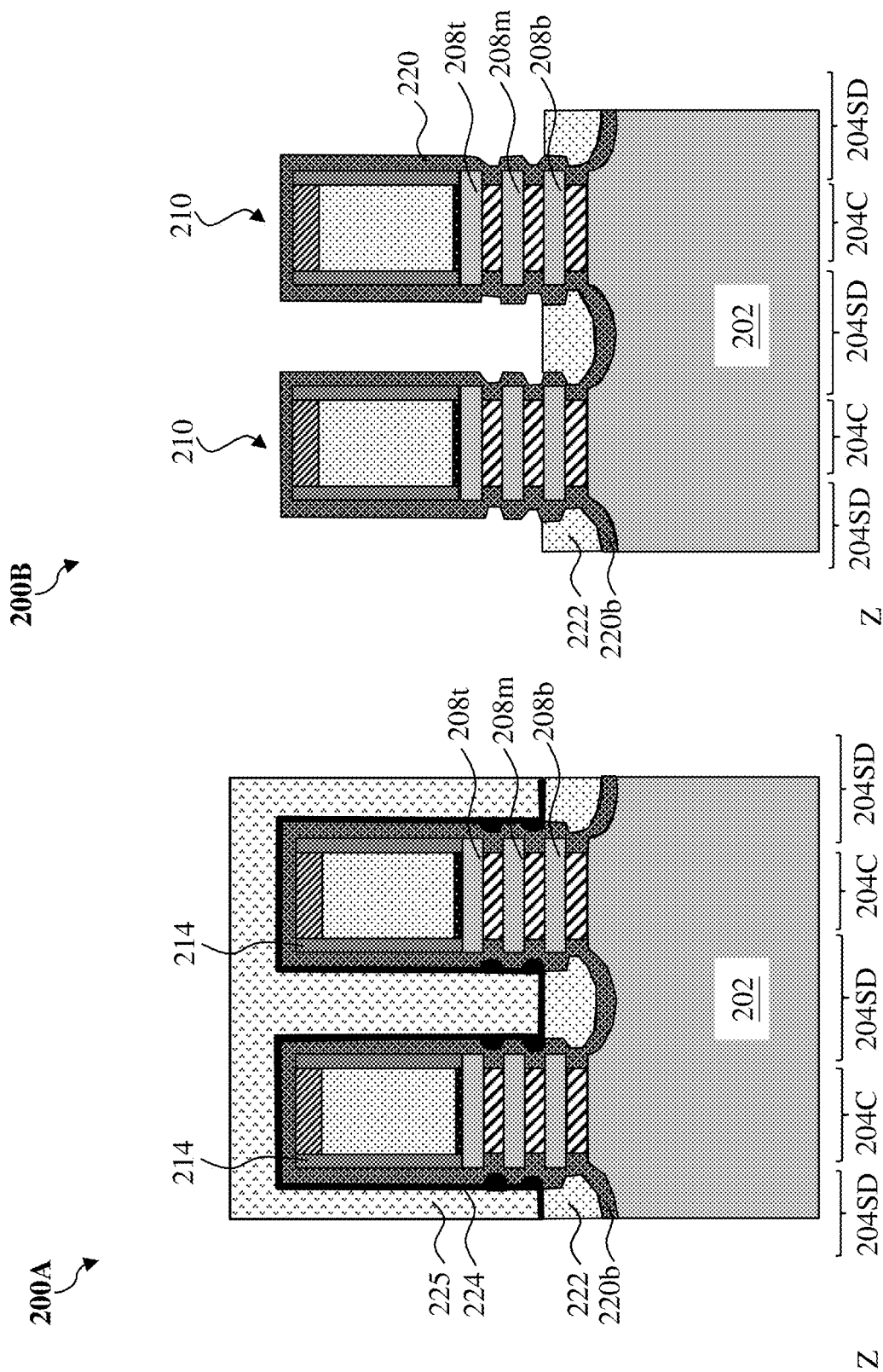

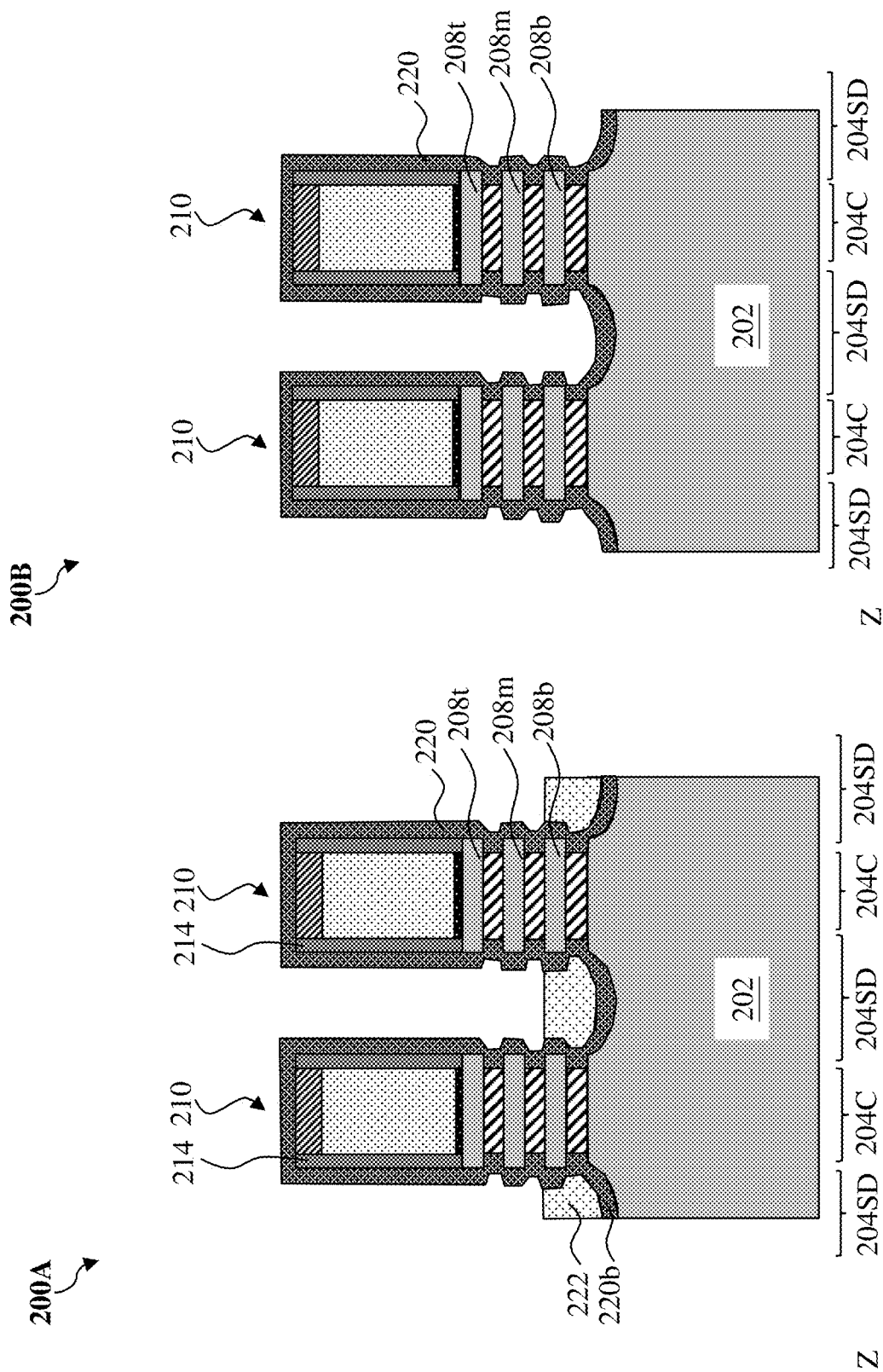

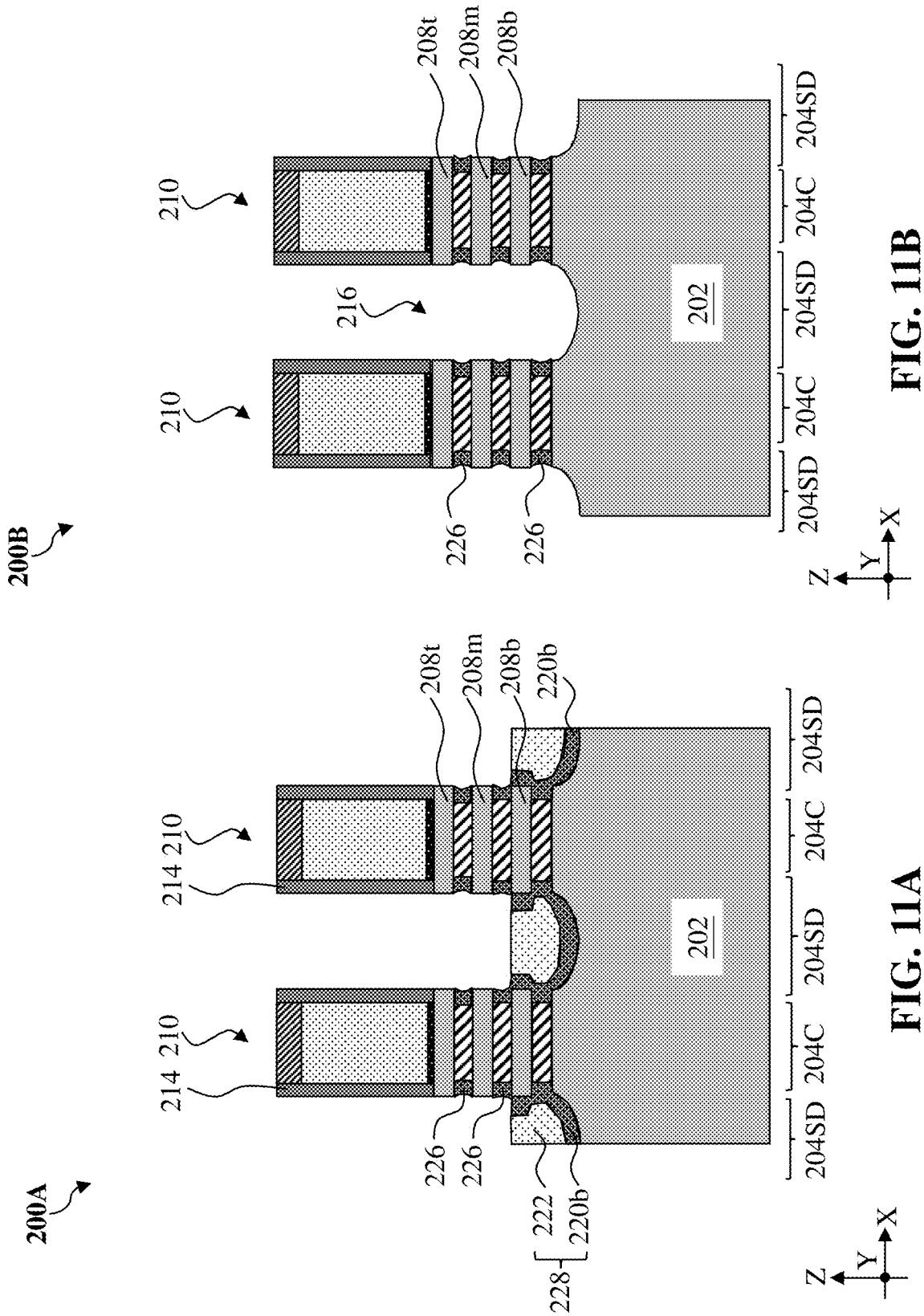

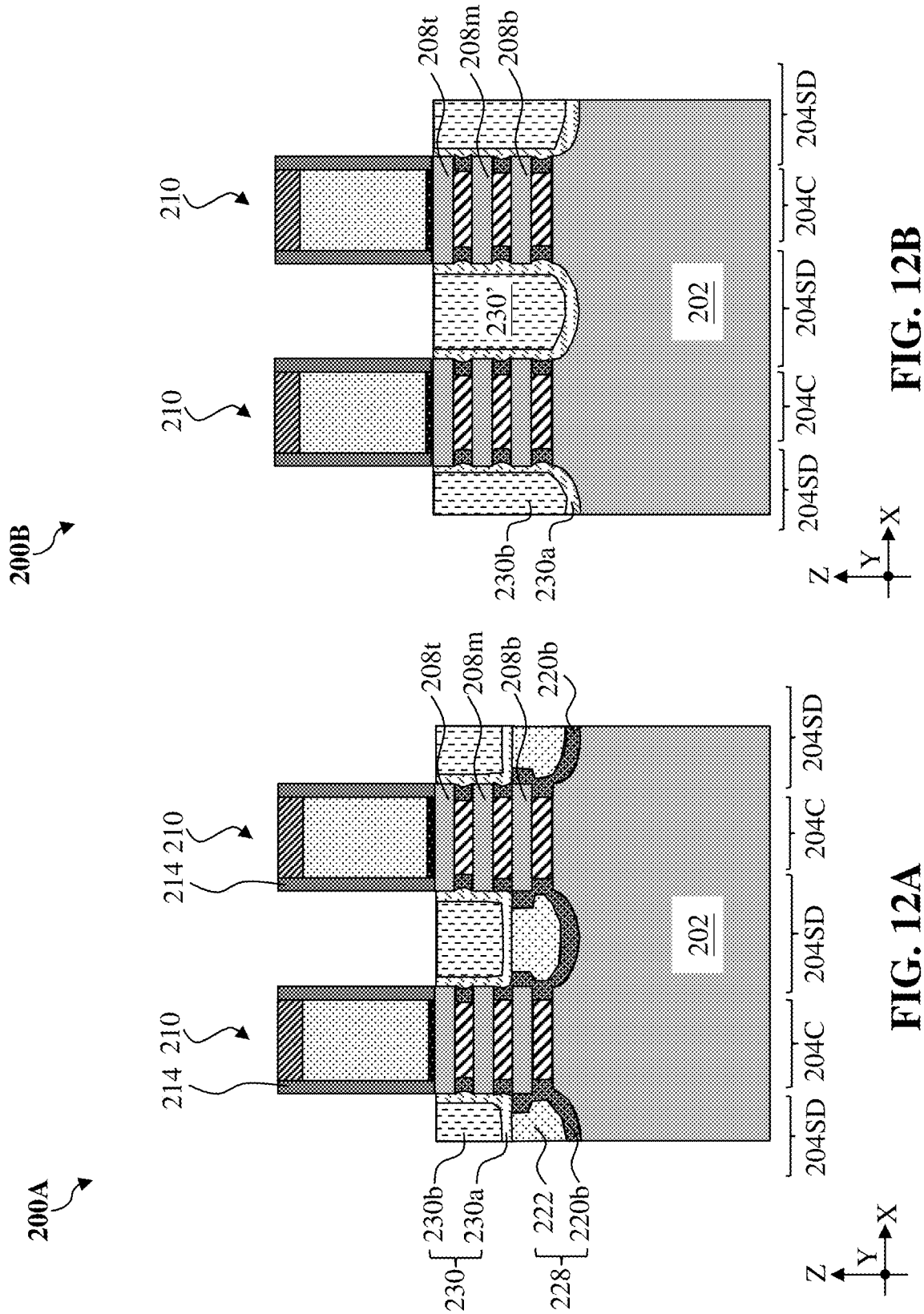

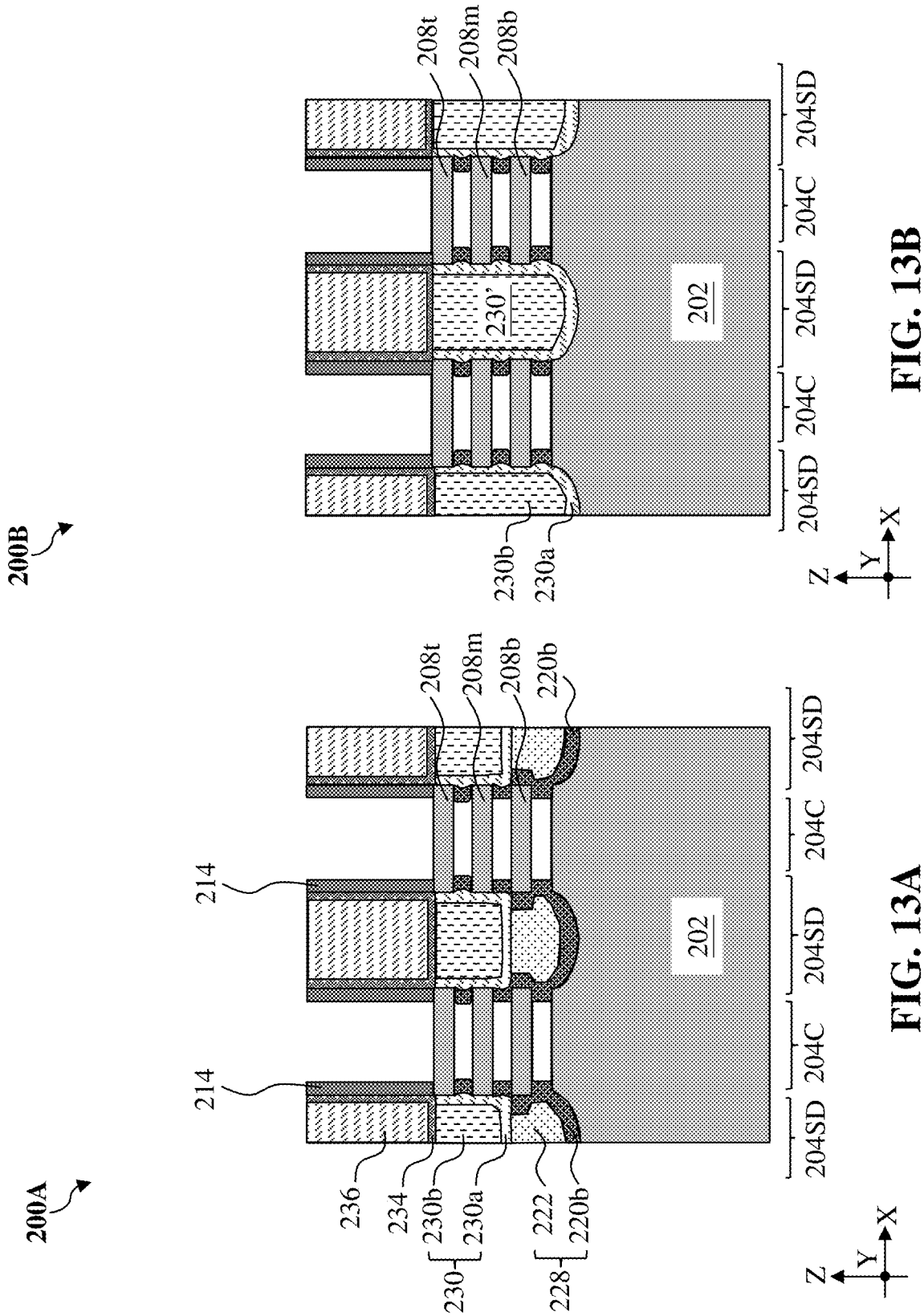

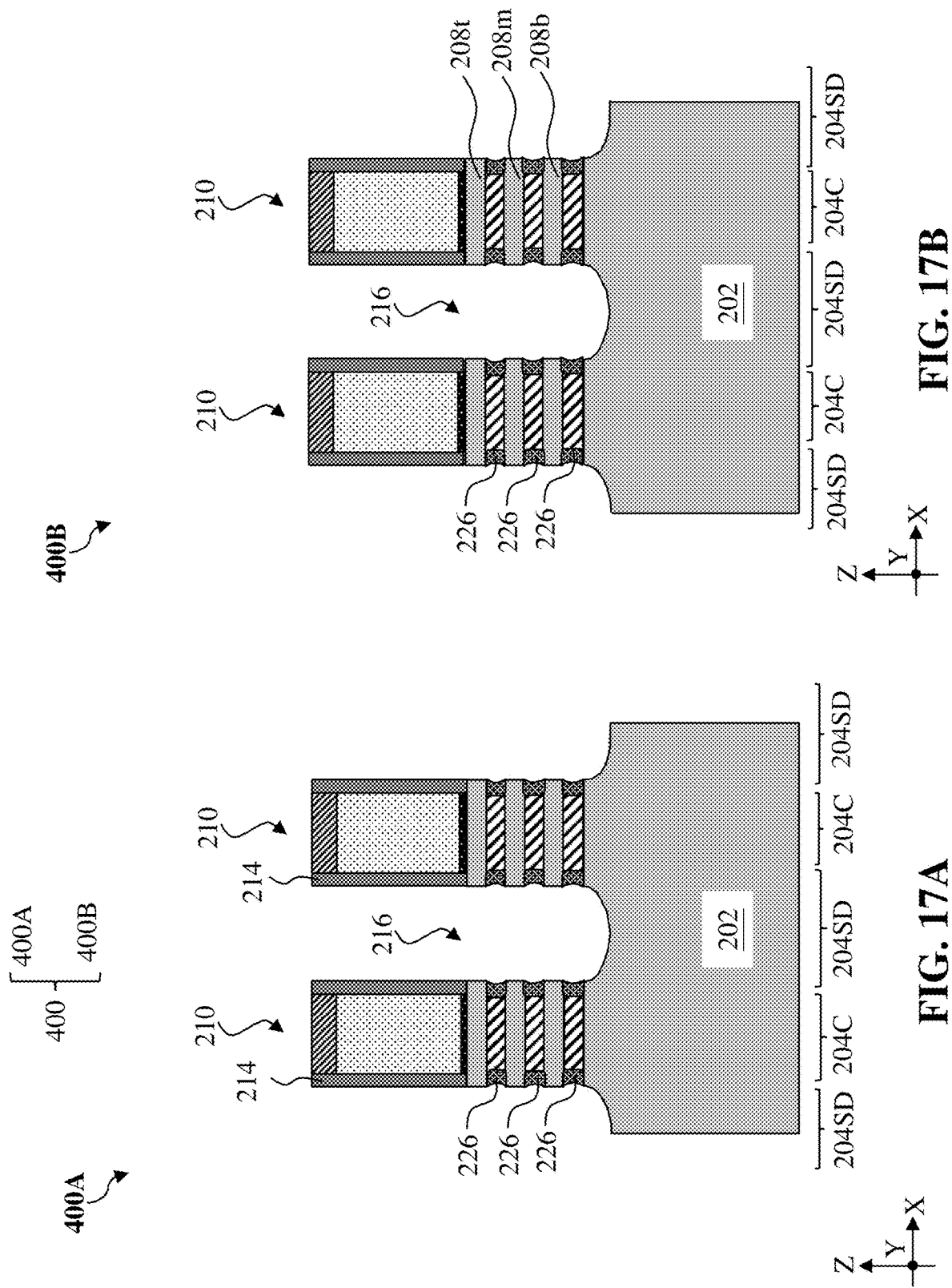

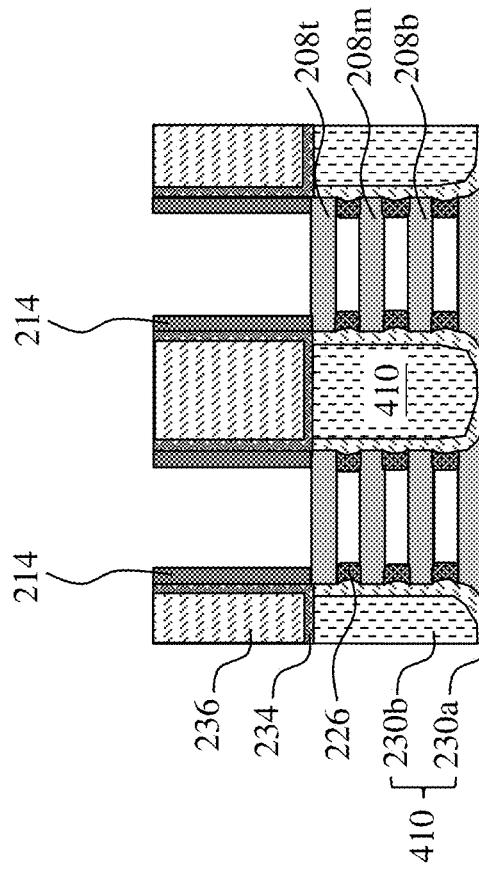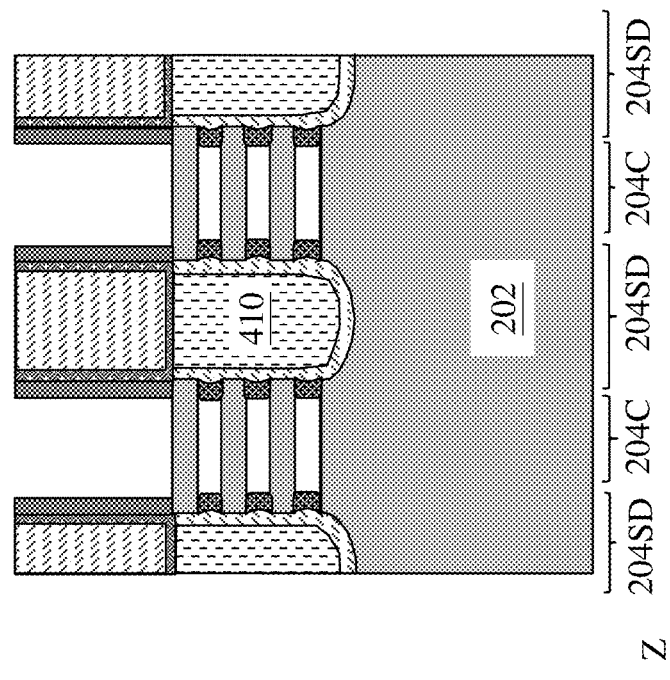

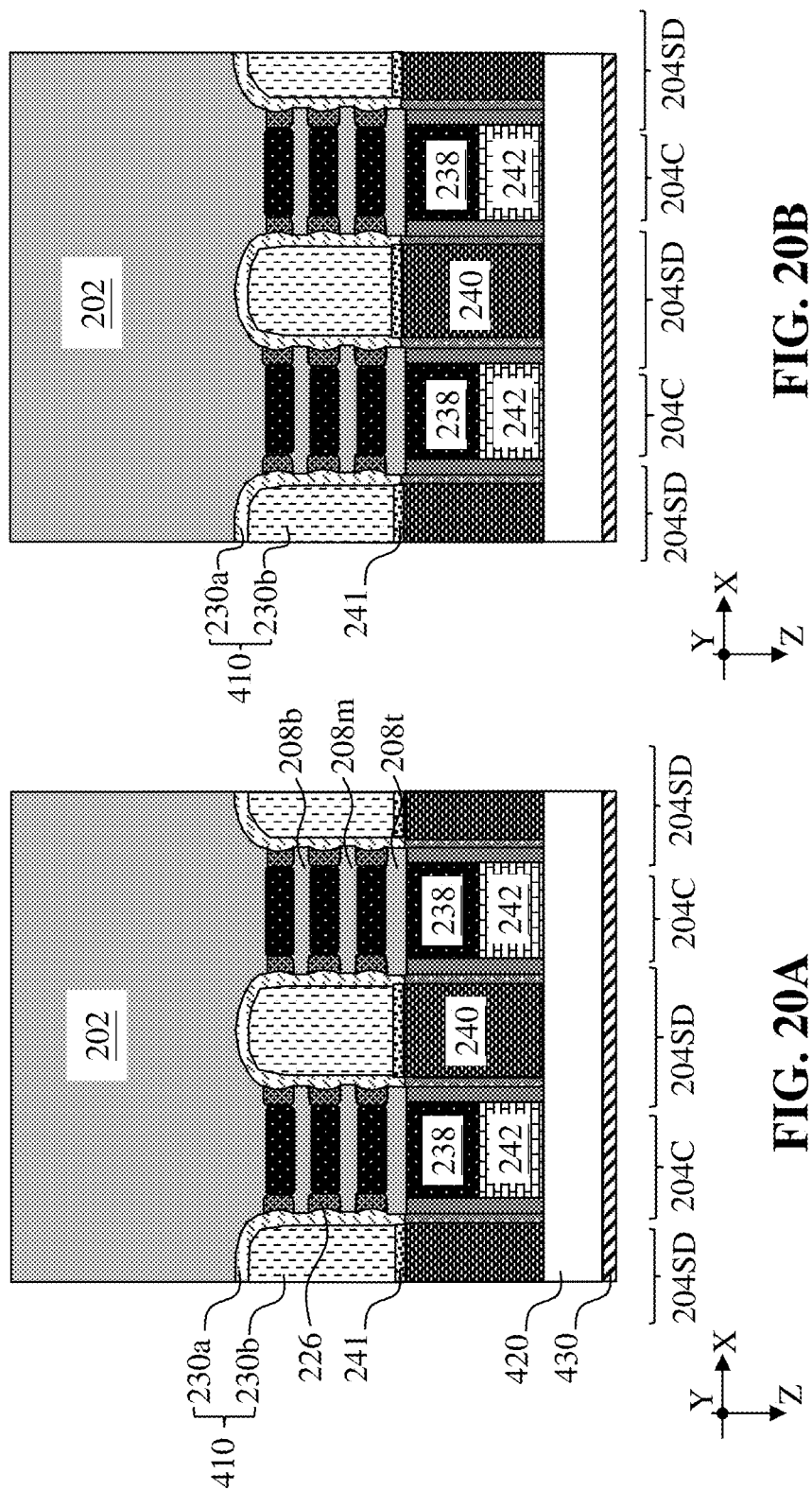

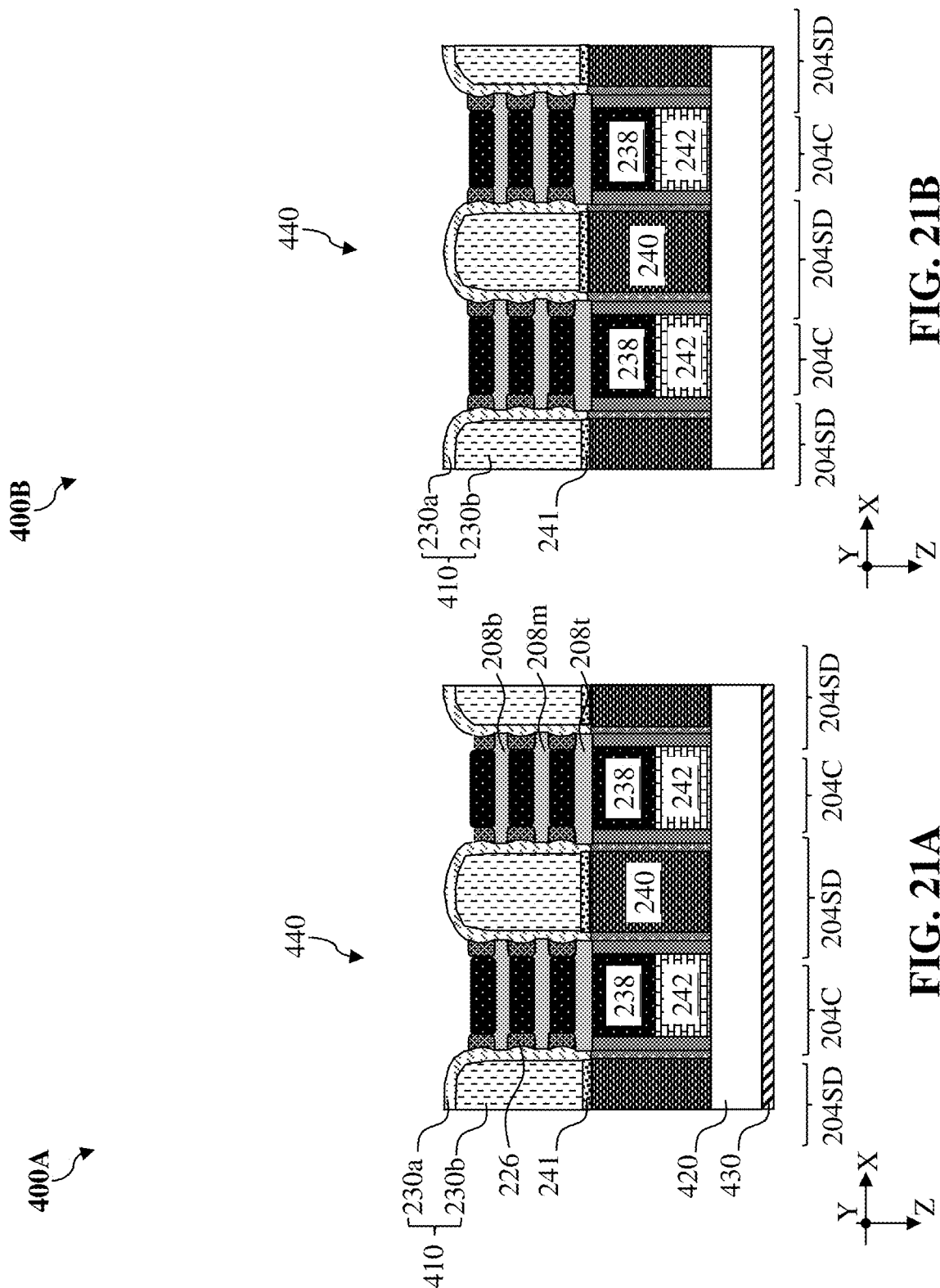

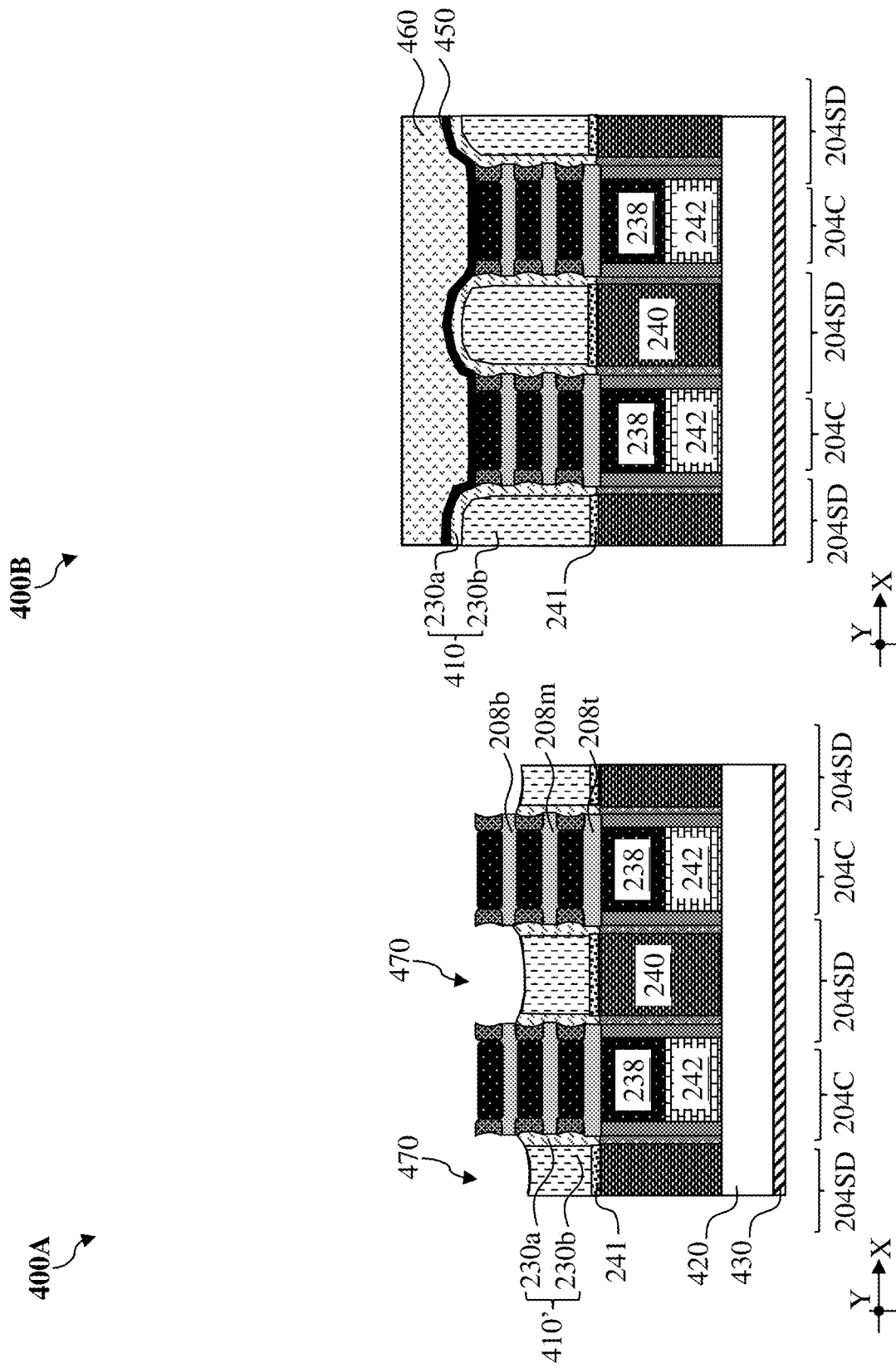

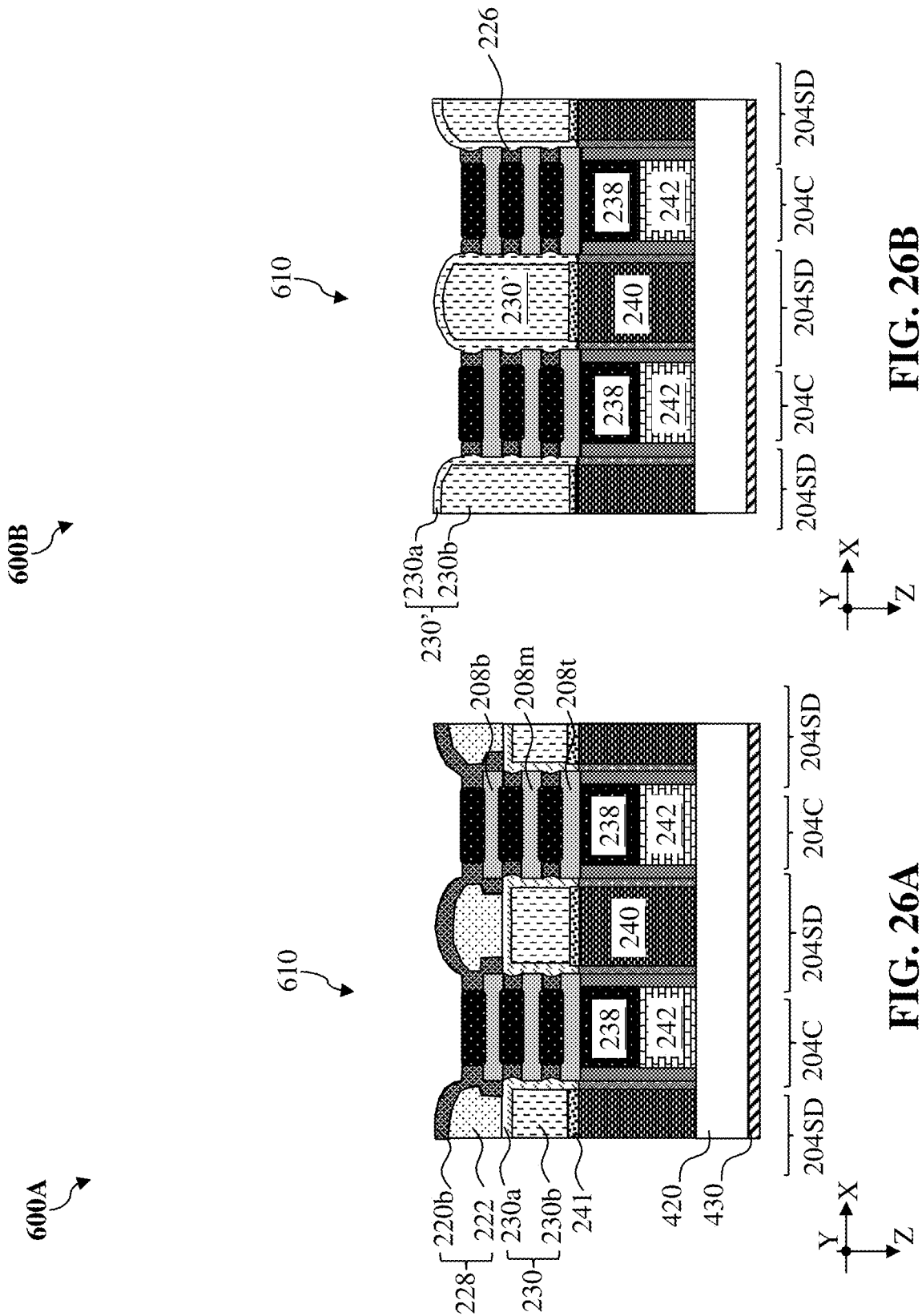

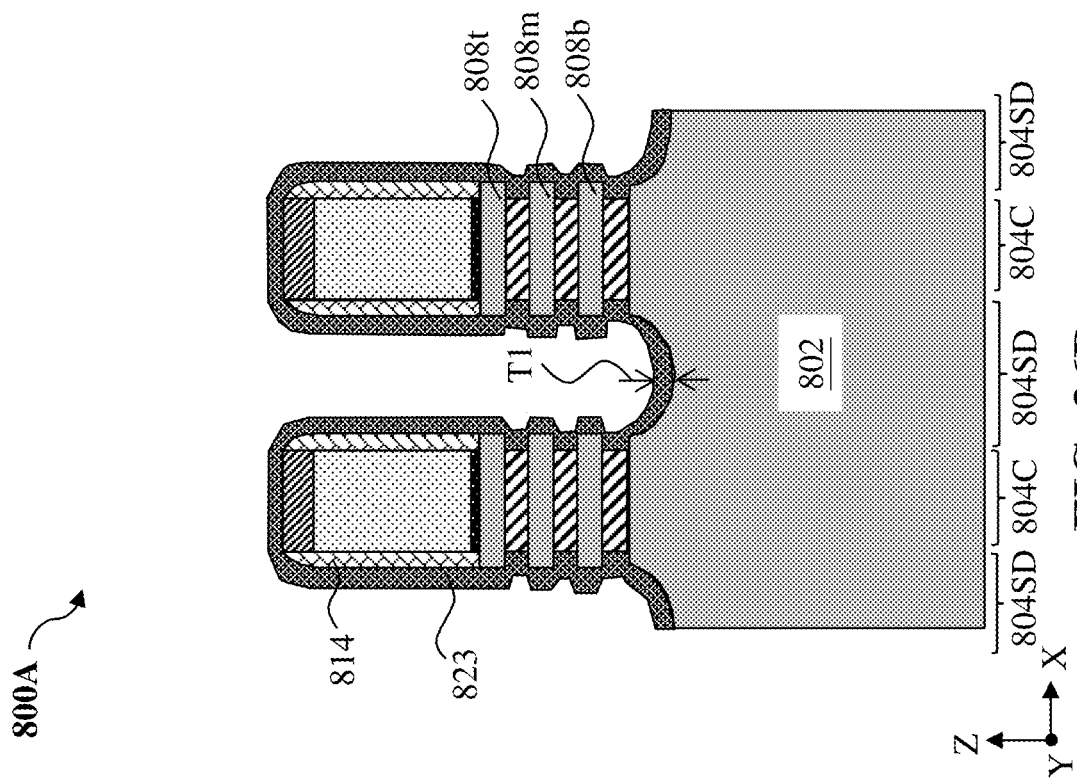
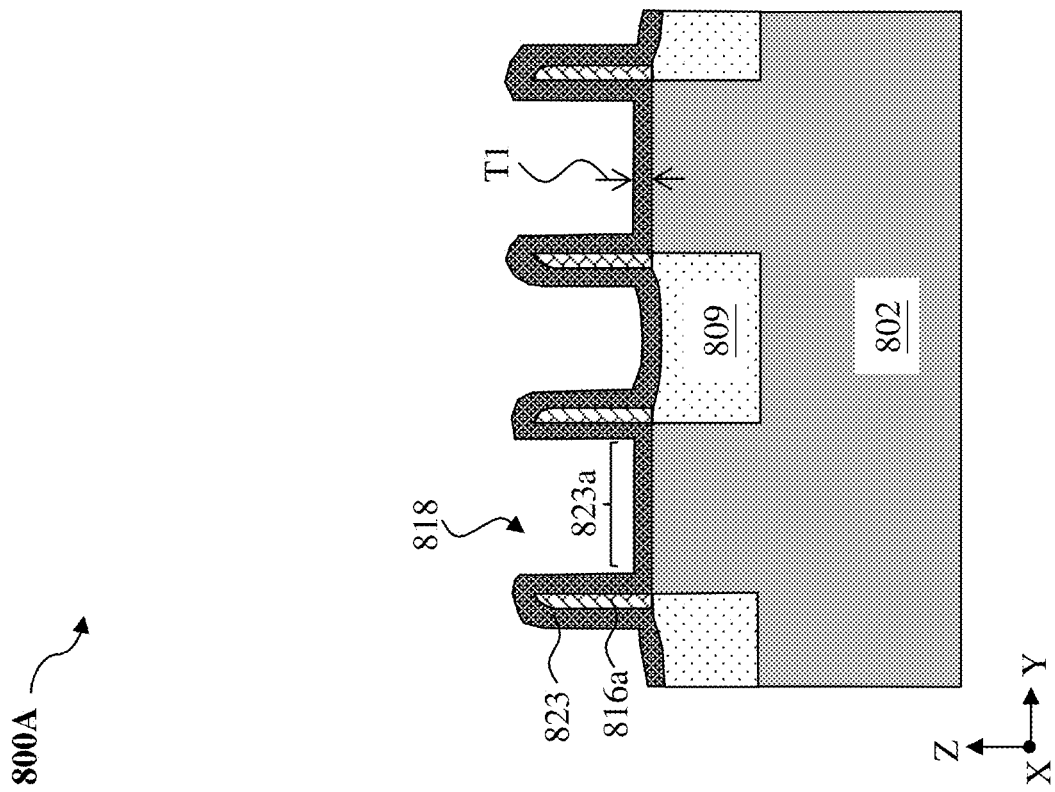
FIG. 36B
FIG. 36A

MULTI-GATE DEVICES AND METHOD OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices are introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures.

As semiconductor IC may generally include a variety of different device types with different performance requirements. As such, providing a multi-gate device (e.g., such as a GAA transistor) that is able to meet such diverse device performance requirements remains a challenge. Thus, existing techniques have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A, and 15A (FIGS. 3A-15A) illustrate fragmentary cross-sectional views of the workpiece taken along line A-A' as shown in FIG. 2 during various fabrication stages in the method of FIG. 1, according to one or more aspects of the present disclosure.

FIGS. 3B, 4B, 5B, 6B, 7B, 8B, 9B, 10B, 11B, 12B, 13B, 14B, and 15B (FIGS. 3B-15B) illustrate fragmentary cross-sectional views of the workpiece taken along line B-B' as shown in FIG. 2 during various fabrication stages in the method of FIG. 1, according to various aspects of the present disclosure.

FIGS. 17A, 18A, 19A, 20A, 21A, 22A, and 23A (FIGS. 17A-23A) illustrate fragmentary cross-sectional views of the workpiece taken along line A-A' as shown in FIG. 2 during various fabrication stages in the method of FIG. 16, according to one or more aspects of the present disclosure.

FIGS. 17B, 18B, 19B, 20B, 21B, 22B, and 23B (FIGS. 17B-23B) illustrate fragmentary cross-sectional views of the workpiece taken along line B-B' as shown in FIG. 2 during various fabrication stages in the method of FIG. 16, according to various aspects of the present disclosure.

FIGS. 25A, 26A, 27A, and 28A (FIGS. 25A-28A) illustrate fragmentary cross-sectional views of the workpiece taken along line A-A' as shown in FIG. 2 during various fabrication stages in the method of FIG. 24, according to one or more aspects of the present disclosure.

FIGS. 25B, 26B, 27B, and 28B (FIGS. 25B-28B) illustrate fragmentary cross-sectional views of the workpiece taken along line B-B' as shown in FIG. 2 during various fabrication stages in the method of FIG. 24, according to various aspects of the present disclosure.

FIGS. 31A, 32A, 33A, 34A, 35A, 36A, 37A, and 38A (FIGS. 31A-38A) illustrate fragmentary cross-sectional views of the workpiece taken along line A-A' as shown in FIG. 30 during various fabrication stages in the method of FIG. 29, according to one or more aspects of the present disclosure.

FIGS. 31B, 32B, 33B, 34B, 35B, 36B, 37B, and 38B (FIGS. 31B-38B) illustrate fragmentary cross-sectional views of the workpiece taken along line B-B' as shown in FIG. 30 during various fabrication stages in the method of FIG. 29, according to various aspects of the present disclosure.

DETAILED DESCRIPTION

Figure 1:
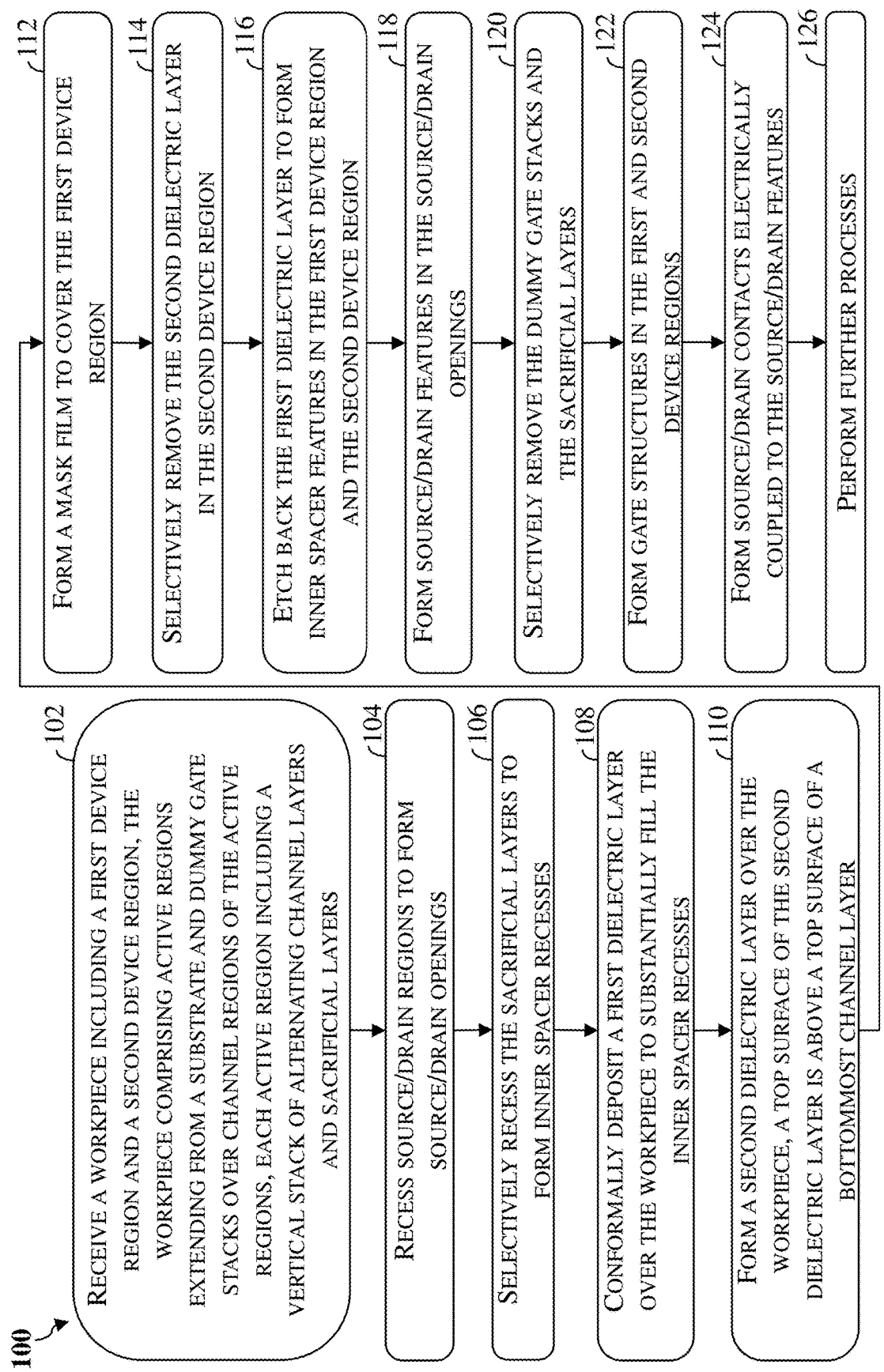
FIG. 1 illustrates a flow chart of a method for forming a semiconductor structure, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

GAA transistors have wide applications. In some implementations (e.g., low power consumption devices), GAA transistors may be designed to provide low leakage current to reduce power consumption, while in some other implementations (e.g., high performance devices), GAA transistors may be designed to have high drive current. Fabricating GAA transistors to meet different application requirements can involve complicated processes associated with high cost.

The present disclosure provides GAA transistors having a number of channel layers selected based on the application and methods of forming the same. For example, for GAA transistor implemented in low power consumption applications, the GAA transistor may have a fewer number of channel layers; and for GAA transistor implemented in high performance applications, the GAA transistor may have a greater number of channel layers. In an embodiment, a workpiece includes a first GAA transistor for low power consumption applications and a second GAA transistor for high performance applications. The first GAA transistor includes a dielectric feature covering a sidewall surface of a bottommost channel layer of the number of channel layers. As such, the source/drain feature of the first GAA transistor will be coupled to a fewer number of channel layers compared to that of the source/drain feature of the second GAA transistor. By forming the dielectric feature in the first GAA transistor, different characteristic requirements may be met by different GAA transistors, respectively, and those GAA transistors may be simultaneously formed from either a same active region or different active regions.

The various aspects of the present disclosure will now be described in more detail with reference to the figures. In that regard, FIG. 1 is a flowchart illustrating method 100 of forming a semiconductor structure according to embodiments of the present disclosure. Method 100 is described below in conjunction with FIGS. 2, 3A-15A, and 3B-15B, which are fragmentary top/cross-sectional views of a workpiece 200 at different stages of fabrication according to embodiments of method 100. FIG. 16 is a flowchart illustrating a first alternative method 300 of forming a semiconductor structure according to embodiments of the present disclosure. Method 300 is described below in conjunction with FIGS. 17A-23A and 17B-23B, which are fragmentary cross-sectional views of a workpiece 400 at different stages of fabrication according to embodiments of method 300. FIG. 24 is a flowchart illustrating a second alternative method 500 of forming a semiconductor structure according to embodiments of the present disclosure. Method 500 is described below in conjunction with FIGS. 25A-28A and 25B-28B, which are fragmentary cross-sectional views of a workpiece 600 at different stages of fabrication according to embodiments of method 500. FIG. 29 is a flowchart illustrating another method 700 of forming a semiconductor structure according to embodiments of the present disclosure. Method 700 is described below in conjunction with FIGS. 30, 31A-38A, 31B-38B, 31C-38C, and 31D-38D, which are fragmentary top/cross-sectional views of a workpiece 800 at different stages of fabrication according to embodiments of method 700.

Methods 100, 300, 500, and 700 are merely examples and are not intended to limit the present disclosure to what is explicitly illustrated therein. Additional steps may be provided before, during and after the method 100/300/500/700, and some steps described can be replaced, eliminated, or moved around for additional embodiments of the method. Not all steps are described herein in detail for reasons of simplicity. Because the workpiece 200/400/600/800 will be fabricated into a semiconductor structure upon conclusion of the fabrication processes, the workpiece 200/400/600/800 may be referred to as the semiconductor structure 200/400/600/800 as the context requires. For avoidance of doubts, the X, Y and Z directions in FIGS. 2, 3A-15A, 3B-15B, 17A-23A, 17B-23B, 25A-28A, 25B-28B, 30, 31A-38A, 31B-38B, 31C-38C, and 31D-38D are perpendicular to one another and are used consistently throughout the present disclosure. Throughout the present disclosure, like reference numerals denote like features unless otherwise excepted.

Referring to FIGS. 1, 2, 3A, and 3B, method 100 includes a block 102 where a workpiece 200 is received. The workpiece 200 includes a substrate 202. In an embodiment, the substrate 202 is a bulk silicon substrate (i.e., including bulk single-crystalline silicon). The substrate 202 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator substrate, a silicon germanium-on-insulator substrate, or a germanium-on-insulator substrate.

Figure 2:
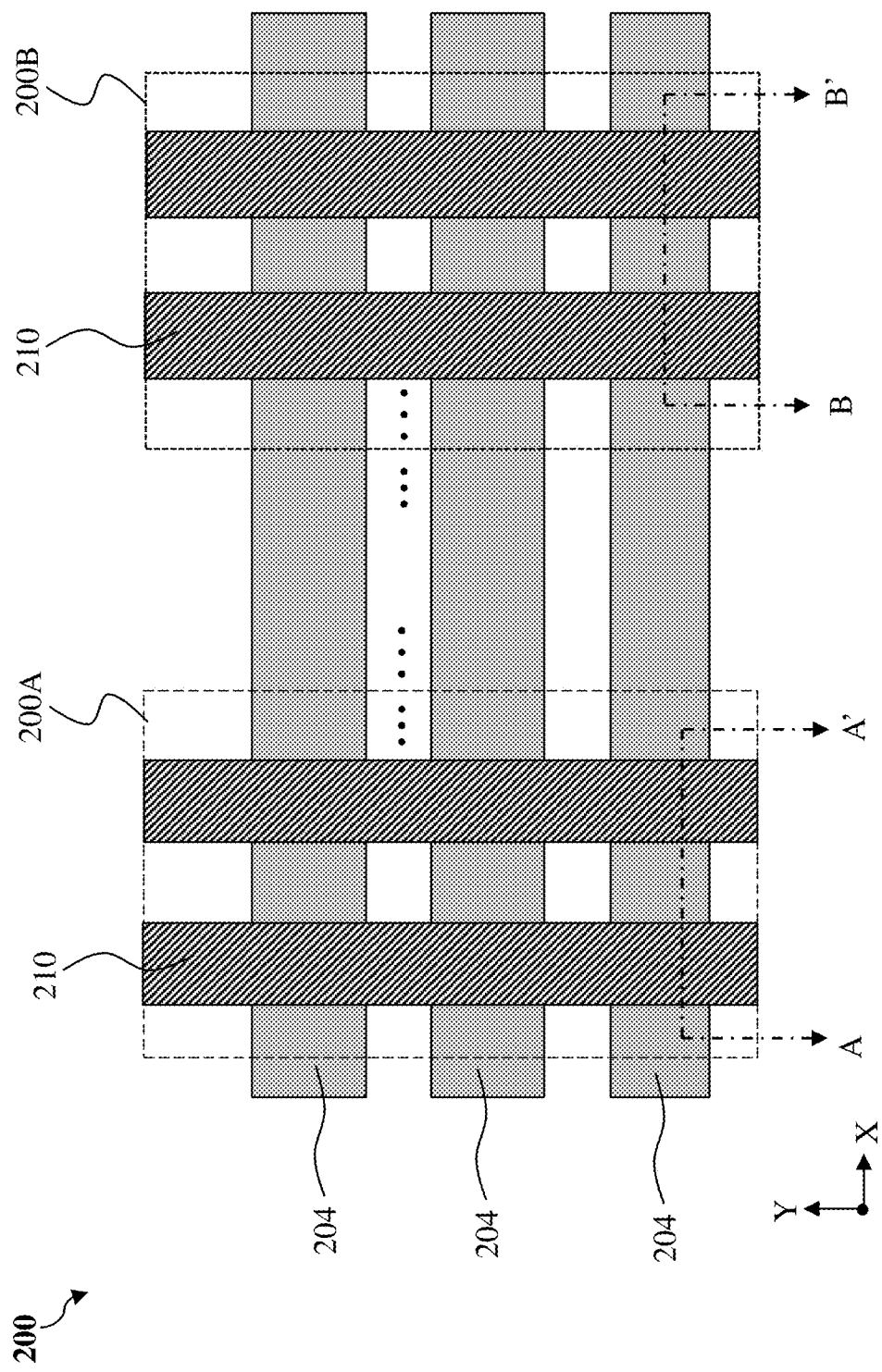
FIG. 2 illustrates a fragmentary top view of an exemplary workpiece to undergo various stages of operations in the method of FIG. 1, according to various aspects of the present disclosure.

The workpiece 200 includes a number of fin-shaped active regions 204 disposed over the substrate 202. As shown in FIG. 2, each of the fin-shaped active regions 204 is a continuous active region and extends lengthwise along the X direction. The fin-shaped active region 204 is divided into channel regions 204C overlapped by dummy gate stacks 210 (to be described below) and source/drain regions 204SD adjacent to the channel regions 204C. Source/drain region(s) may refer to a source or a drain, individually or collectively dependent upon the context. Source/drain region(s) may also refer to a region that provides a source and/or drain for multiple devices. In this depicted example, the workpiece 200 includes a first device region 200A and a second device region 200B. Upon completion of the method 100, the channel regions 204C of semiconductor devices formed in the first device region 200A will be different from the channel regions 204C of semiconductor devices formed in the second device region 200B such that those semiconductor devices will have different performances such as different drive currents and different leakage currents. In the present embodiments, semiconductor devices that will be formed in the first device region 200A may have, for example, less leakage current and less device capacitance, and semiconductor devices that will be formed in the second device region 200B may have, for example, larger drive current. Two channel regions 204C are shown in each of the first device region 200A and the second device region 200B, but the first device region 200A and/or the second device region 200B may include more source/drain regions and channel regions.

In the embodiments represented in FIGS. 3A-3B, the fin-shaped active region 204 is formed from a portion 202t of the substrate 202 and a vertical stack 205 of alternating semiconductor layers 206 and 208 using a combination of lithography and etch steps. In the depicted embodiment, the vertical stack of alternating semiconductor layers 206 and 208 may include a number of channel layers 208 interleaved by a number of sacrificial layers 206. The channel layer 208 may be formed of silicon (Si) and the sacrificial layer 206 may be formed of silicon germanium (SiGe). The channel layers 208 and the sacrificial layers 206 may be epitaxially deposited on the substrate 202 using molecular beam epitaxy (MBE), vapor-phase epitaxy (VPE), ultra-high vacuum chemical vapor deposition (UHV-CVD), and/or other suitable epitaxial growth processes. In the present embodiments, the fin-shaped active region 204 includes three pairs of alternating sacrificial layers 206 and channel layers 208. The channel layers 208 include a bottommost channel layer 208b, a topmost channel layer 208t, and a middle channel layer 208m disposed between the bottommost channel layer 208b and the topmost channel layer 208t. The bottommost channel layer 208b, a topmost channel layer 208t, and a middle channel layer 208m may be collectively or separately referred to as channel layers 208 or the channel layer 208. In some embodiments, the fin-shaped active region 204 may include a total of three to ten pairs of alternating sacrificial layers 206 and channel layers 208; of course, other configurations may also be applicable depending upon specific design requirements.

While not explicitly shown in FIGS. 2, 3A, and 3B, the workpiece 200 also includes an isolation feature formed around each fin-shaped active region 204 to isolate the fin-shaped active region 204 from an adjacent fin-shaped active region. The isolation feature may also be referred to as a shallow trench isolation (STI) feature and may include silicon oxide, silicon oxynitride, fluorine-doped silicate glass (FSG), a low-k dielectric, combinations thereof, and/or other suitable materials.

Still referring to FIGS. 2, 3A, and 3B, the workpiece 200 also includes dummy gate stacks 210 disposed over channel regions 204C of the fin-shaped active region 204. The channel regions 204C and the dummy gate stacks 210 also define source/drain regions 204SD that are not vertically overlapped by the dummy gate stacks 210. Two dummy gate stacks 210 are shown in each of the first device region 200A and the second device region 200B, but the first device region 200A and the second device region 200B may include more dummy gate stacks 210. In this embodiment, a gate replacement process (or gate-last process) is adopted where the dummy gate stacks 210 serve as placeholders for functional gate structures 238 (shown in FIGS. 14A-14B). Other processes and configuration are possible. The dummy gate stack 210 includes a dummy dielectric layer 211, a dummy gate electrode layer 212 over the dummy dielectric layer 211, and a gate-top hard mask layer 213 over the dummy gate electrode layer 212. The dummy dielectric layer 211 may include silicon oxide. The dummy gate electrode layer 212 may include polysilicon. The gate-top hard mask layer 213 may be a multi-layer structure that includes a silicon oxide layer and silicon nitride layer formed on the silicon oxide layer. Suitable deposition process, photolithography and etching process may be employed to form the dummy gate stack 210. As shown in FIGS. 3A-3B, the workpiece 200 also includes gate spacers 214 extending along sidewalls of the dummy gate stacks 210 and the gate-top hard mask layer 213. The gate spacers 214 may include silicon carbonitride, silicon nitride, zirconium oxide, aluminum oxide, combinations thereof, or other suitable dielectric materials.

Referring to FIGS. 1, 4A, and 4B, method 100 includes a block 104 where source/drain regions 204SD of the fin-shaped active region 204 in the first device region 200A and the second device region 200B are recessed to form source/drain openings 216. In some embodiments, the source/drain regions 204SD are anisotropically etched by a dry etching or other suitable etching process to form source/drain openings 216. An exemplary dry etching process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In embodiments represented in FIGS. 4A and 4B, the source/drain openings 216 extend through the vertical stack 205 and partially extend into the substrate 202. As illustrated in FIGS. 4A and 4B, sidewalls of the channel layers 208 and the sacrificial layers 206 are exposed in the source/drain openings 216.

Referring to FIGS. 1, 5A, and 5B, method 100 includes a block 106 where the sacrificial layers 206 are selectively recessed to form inner spacer recesses 218. After the formation of the source/drain openings 216, the sacrificial layers 206 are exposed in the source/drain openings 216. As shown in FIGS. 5A-5B, the sacrificial layers 206 are selectively and partially recessed to form inner spacer recesses 218, while the exposed channel layers 208 are substantially unetched. In embodiments where the channel layers 208 consist essentially of silicon (Si) and sacrificial layers 206 consist essentially of silicon germanium (SiGe), the selective and partial recess of the sacrificial layers 206 may include use of a selective isotropic etching process (e.g., a selective dry etching process or a selective wet etching process), and the extent at which the sacrificial layers 206 are recessed is controlled by duration of the etching process.

Referring to FIGS. 1, 6A, and 6B, method 100 includes a block 108 where a first dielectric layer 220 is conformally deposited over the workpiece 200, including in the inner spacer recesses 218, by ALD, CVD, or any other suitable deposition process. The term "conformally" may be used herein for ease of description of a layer having substantially uniform thickness over various regions of the workpiece 200. In the present embodiments, the thickness of the first dielectric layer 220 is selected such that the first dielectric layer 220 substantially fills the inner spacer recesses 218. It is noted that, due to the conformal deposition of the first dielectric layer 220, a shape of the first dielectric layer 220 tracks the shape of the workpiece 200, and a portion of the first dielectric layer 220 is in direct contact with the substrate 202. The first dielectric layer 220 may include silicon oxide, silicon nitride, silicon oxycarbide, silicon oxycarbonitride, silicon carbonitride, metal nitride, or a suitable dielectric material.

Referring to FIGS. 1, 7A, and 7B, method 100 includes a block 110 where a second dielectric layer 222 is formed over the workpiece 200. In some embodiments, the second dielectric layer 222 may be formed by performing consecutive steps of depositing and etching process. In an embodiment, the second dielectric layer 222 may include silicon oxide, silicon nitride, silicon oxycarbide, silicon oxycarbonitride, silicon carbonitride, metal nitride, or a suitable dielectric material. A composition of the second dielectric layer 222 may be different from a composition of the first dielectric layer 220. In the present embodiments, after the performing of the consecutive steps of depositing and etching process, a top surface 222t of the second dielectric layer 222 is above or coplanar with a top surface of the bottommost channel layer 208b and is below a bottom surface of the middle channel layer 208m. In embodiments where the fin-shaped active region 204 includes more than three channel layers 208, the thickness of the second dielectric layer 222 may be configured based on a desired performance of the semiconductor devices to be formed in the first device region 200A. For example, in embodiments where the fin-shaped active region 204 includes four channel layers interleaved by four sacrificial layers, the second dielectric layer 222 may cover sidewall surfaces of one or more channel layers of the four channel layers.

A portion of the first dielectric layer 220 that is in direct contact with the second dielectric layer 222 may be referred to as a bottom portion 220b of the first dielectric layer 220. A bottom surface of the second dielectric layer 222 generally tracks the shape of the top surface of the bottom portion 220b of the first dielectric layer 220. Because the sacrificial layers 206 are selectively recessed and the first dielectric layer 220 is conformally deposited, a cross-sectional view of the second dielectric layer 222 formed in the source/drain opening may have a non-uniform width bottom to up. For example, an upper portion of the second dielectric layer 222 has a width along the X direction that is smaller than a width of a lower portion of the second dielectric layer 222.

Referring to FIGS. 1, 8A, and 8B, method 100 includes a block 112 where a patterned mask film 224 is formed to cover the first device region 200A while the second device region 200B is not covered. In some embodiments, a mask film 224 is deposited over the workpiece 200 using CVD or ALD and then a photoresist layer 225 is deposited over the mask film 224 using spin-on coating or a suitable process. The photoresist layer 225 is patterned using photolithography process to form a patterned photoresist layer 225. The patterned photoresist layer 225 is then applied as an etch mask in an etching process to pattern the mask film 224. As shown in FIGS. 8A-8B, the patterned photoresist layer 225 and the patterned mask film 224 cover/protect the first device region 200A while the second device region 200B is exposed.

Figure 9B:
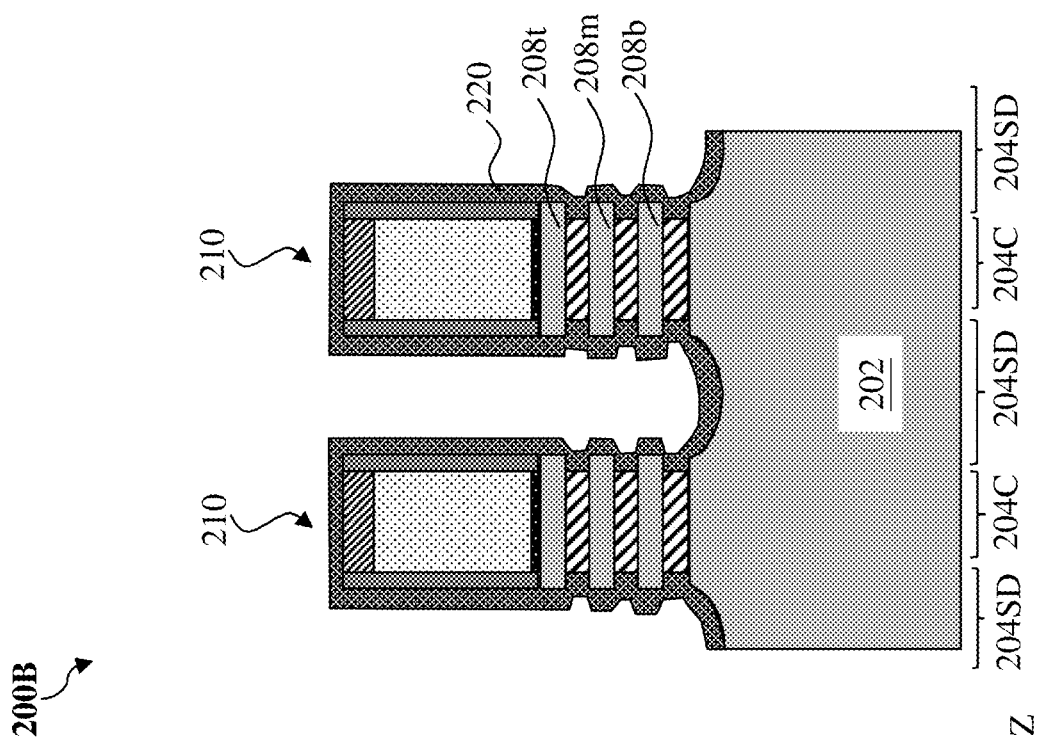
Figure 9A:
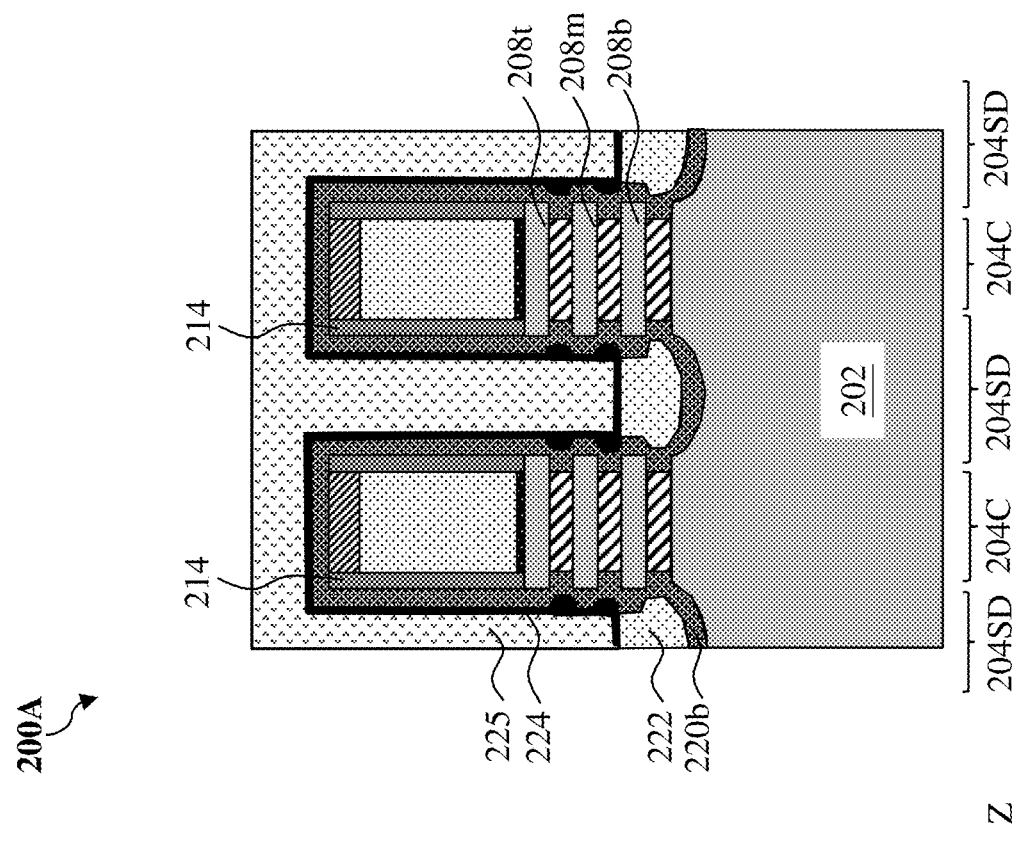

Referring to FIGS. 1, 9A, and 9B, method 100 includes a block 114 where the second dielectric layer 222 in the second device region 200B is selectively removed. With the patterned mask film 224 and the patterned photoresist layer 225 covering the first device region 200A, an etching process is then performed to selectively remove the second dielectric layer 222 in the second device region 200B. After the removing of the second dielectric layer 222 in the second device region 200B, as shown in FIG. 10A and FIG. 10B, the patterned photoresist layer 225 and the patterned mask film 224 may be selectively removed, leaving the second dielectric layer 222 formed in the first device region 200A.

Referring to FIGS. 1, 11A, and 11B, method 100 includes a block 116 where the first dielectric layer 220 is etched back to form inner spacer features 226 in the first device region 200A and the second device region 200B. An etching process may be performed to etch back the first dielectric layer 220 to remove excess portions of the first dielectric layer 220 over, for example, sidewalls of the channel layers 208 and sidewall surfaces of the gate spacers 214, thereby forming the inner spacer features 226 as shown in FIGS. 11A-11B. In some embodiments, the etch back process at block 116 may be a dry etching process and in a way similar to the dry etching process used in the formation of the source/drain openings 216.

Since the bottom portion 220b of the first dielectric layer 220 in the first device region 200A is covered by the second dielectric layer 222, after the etch back process, the bottom portion 220b is still in the first device region 200A. On the contrary, the bottom portion 220b of the first dielectric layer 220 in the second device region 200B is not covered by the second dielectric layer 222 and has been removed during the etch back process. The bottom portion 220b of the first dielectric layer 220 and the second dielectric layer 222 may be collectively referred to as a dielectric feature 228. In embodiments represented in FIGS. 11A and 11B, at least sidewall surfaces of the bottommost channel layer 208b in the first device region 200A are covered by the dielectric feature 228, thereby disabling or insulating the bottommost channel layer 208b. Sidewall surfaces of the middle channel layer 208m and topmost channel layer 208t in the first device region 200A are exposed in the source/drain openings 216, and sidewall surfaces of each of the channel layers 208 in the second device region 200B are exposed in the source/drain openings 216.

Referring to FIGS. 1, 12A and 12B, method 100 includes a block 118 where source/drain features 230 and 230' are formed in the source/drain openings 216 in the first device region 200A and the second device region 200B, respectively. In this illustrated example, the source/drain feature 230/230' includes a second epitaxial semiconductor layer 230b embedded in a first epitaxial semiconductor layer 230a. Both the first epitaxial semiconductor layer 230a and the second epitaxial semiconductor layer 230b are exposed from a top surface of the source/drain feature 230/230'. A concentration of dopants in the second epitaxial semiconductor layer 230b is greater than a concentration of dopants in the first epitaxial semiconductor layer 230a. Depending on the conductivity type of the to-be-formed transistor, the source/drain features 230/230' may be n-type source/drain features or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process.

In the present embodiment, due to the formation of the dielectric feature 228 in the first device region 200A, a volume of the source/drain feature 230 in the first device region 200A is smaller than a volume of the source/drain feature 230' in the second device region 200B. The source/drain feature 230 in the first device region 200A is spaced apart from the substrate 202 by the dielectric feature 228 and is in direct contact with the middle channel layer 208m and the topmost channel layer 208t, and the source/drain feature 230' in the second device region 200B is in direct contact with the substrate 202 and is further in direct contact with each of the channel members 208b, 208m, and 208t.

Referring to FIGS. 1 and 13A-13B, method 100 includes a block 120 where the dummy gate stacks 210 and the sacrificial layers 206 are selectively removed in a sequential order. In an embodiment, a contact etch stop layer (CESL) 234 and an interlayer dielectric (ILD) layer 236 are deposited over the workpiece 200. The CESL 234 may include silicon nitride, silicon oxynitride, and/or other materials known in the art and may be formed by ALD, plasma-enhanced chemical vapor deposition (PECVD) process and/or other suitable deposition or oxidation processes. The ILD layer 236 is deposited by a PECVD process or other suitable deposition technique over the workpiece 200 after the deposition of the CESL 234. The ILD layer 236 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A planarization process, such a chemical mechanical polishing (CMP) process may be performed to the workpiece 200 to remove excess materials and expose top surfaces of the dummy gate electrode layers 212 in the dummy gate stacks 210.

With the exposure of the dummy gate electrode layers 212, block 120 proceeds to removal of the dummy gate stacks 210. The removal of the dummy gate stacks 210 may include one or more etching process selective to the materials in the dummy gate stacks 210. For example, the removal of the dummy gate stacks 210 may be performed using a selective wet etch, a selective dry etch, or a combination thereof. After the removal of the dummy gate stacks 210, the sacrificial layers 206 are selectively removed to release the channel layers 208 as channel members 208 in the channel regions 204C. The selective removal of the sacrificial layers 206 may be implemented by a selective dry etch, a selective wet etch, or other selective etching process.

In some embodiments, the selective wet etching includes an APM etch (e.g., ammonia hydroxide-hydrogen peroxide-water mixture).

Figures 14A, 14B:
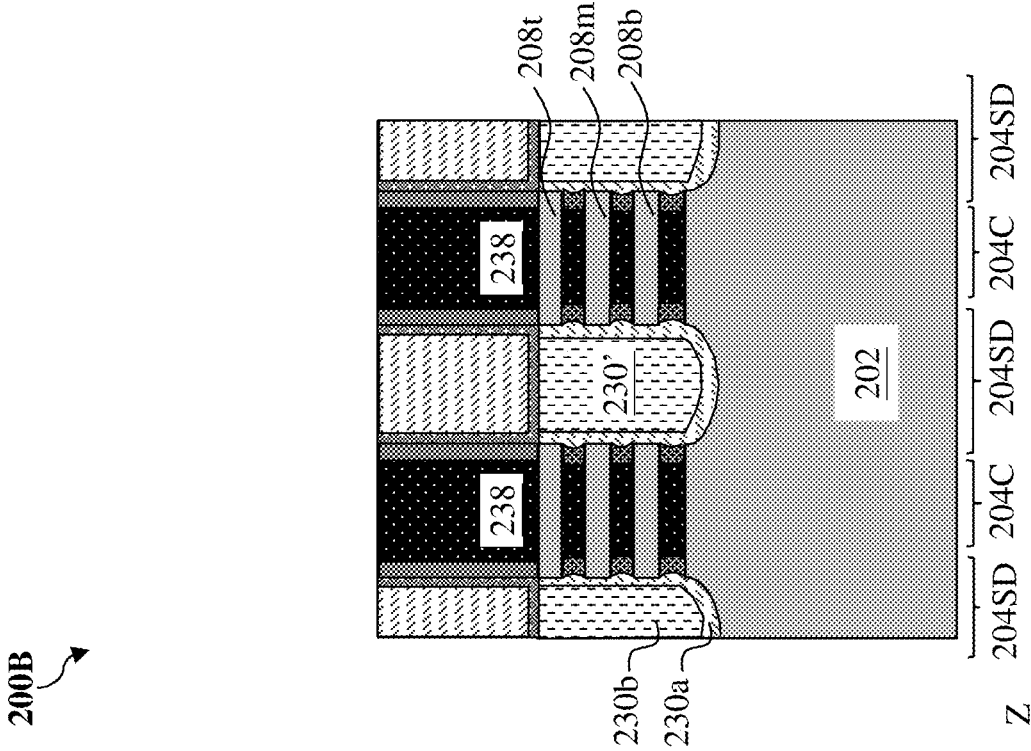

Referring to FIGS. 1 and 14A-14B, method 100 includes a block 122 where gate structures 238 are formed in the first and second device regions 200A and 200B. The gate structures 238 are deposited to wrap over the channel members 208. Although not separately labeled, each of the gate structures 238 may include a gate dielectric layer and a gate electrode layer over the gate dielectric layer. In some embodiments, the gate dielectric layer includes an interfacial layer disposed on the channel members 208 and a high-k dielectric layer over the interfacial layer. Here, a high-k dielectric layer refers to a dielectric material having a dielectric constant greater than that of silicon dioxide, which is about 3.9. In some embodiments, the interfacial layer includes silicon oxide. The high-k dielectric layer is then deposited over the interfacial layer using ALD, CVD, and/or other suitable methods. The high-k dielectric layer may include hafnium oxide. Alternatively, the high-k dielectric layer may include other high-k dielectrics, such as titanium oxide, hafnium zirconium oxide, tantalum oxide, hafnium silicon oxide, zirconium silicon oxide, lanthanum oxide, aluminum oxide, yttrium oxide, $SrTiO_3$, $BaTiO_3$, $BaZrO$, hafnium lanthanum oxide, lanthanum silicon oxide, aluminum silicon oxide, hafnium tantalum oxide, hafnium titanium oxide, (Ba,Sr)TiO3 (BST), silicon nitride, silicon oxynitride, combinations thereof, or other suitable material.

The gate electrode layer is then deposited over the gate dielectric layer using atomic layer deposition (ALD), physical vapor deposition (PVD), chemical vapor deposition (CVD), e-beam evaporation, or other suitable methods. The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride, titanium aluminum, titanium aluminum nitride, tantalum nitride, tantalum aluminum, tantalum aluminum nitride, tantalum aluminum carbide, tantalum carbonitride, aluminum, tungsten, nickel, titanium, ruthenium, cobalt, platinum, tantalum carbide, tantalum silicon nitride, copper, other refractory metals, or other suitable metal materials or a combination thereof. Further, where the semiconductor structure 200 includes n-type transistors and p-type transistors, different gate electrode layers may be formed separately for n-type transistors and p-type transistors, which may include different work function metal layers (e.g., for providing different n-type and p-type work function metal layers). As a result of the formation of the dielectric feature 228 in the first device region 200A, a leakage current of the semiconductor device formed in the first device region 200A is less than a leakage current of the semiconductor device formed in the second device region 200B. Also, the number of channel layers that are in direct contact with the source/drain feature 230 is different from (i.e., less than) the number of channel layers that are in direct contact with the source/drain feature 230', thus, the drive current of the semiconductor device formed in the second device region 200B is greater than that of the semiconductor device formed in the first device region 200A.

Figure 15A:
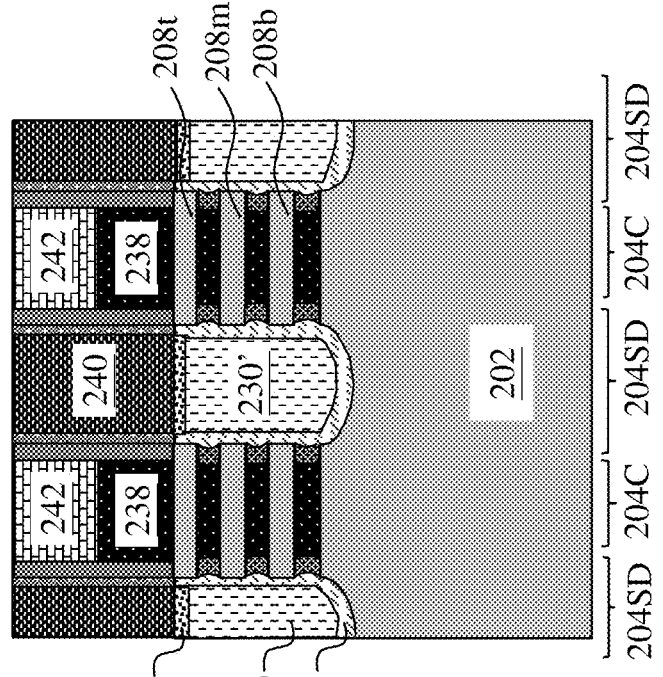
Figure 15B:
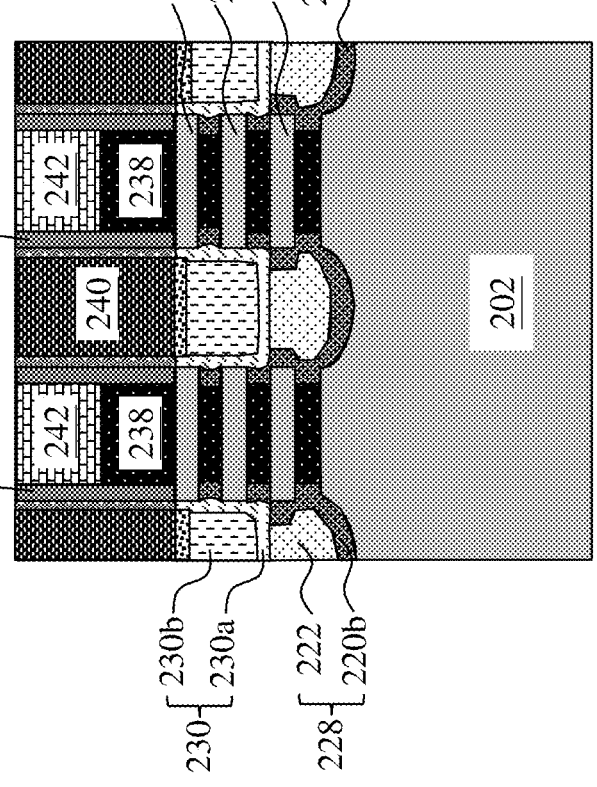
Figure 16:
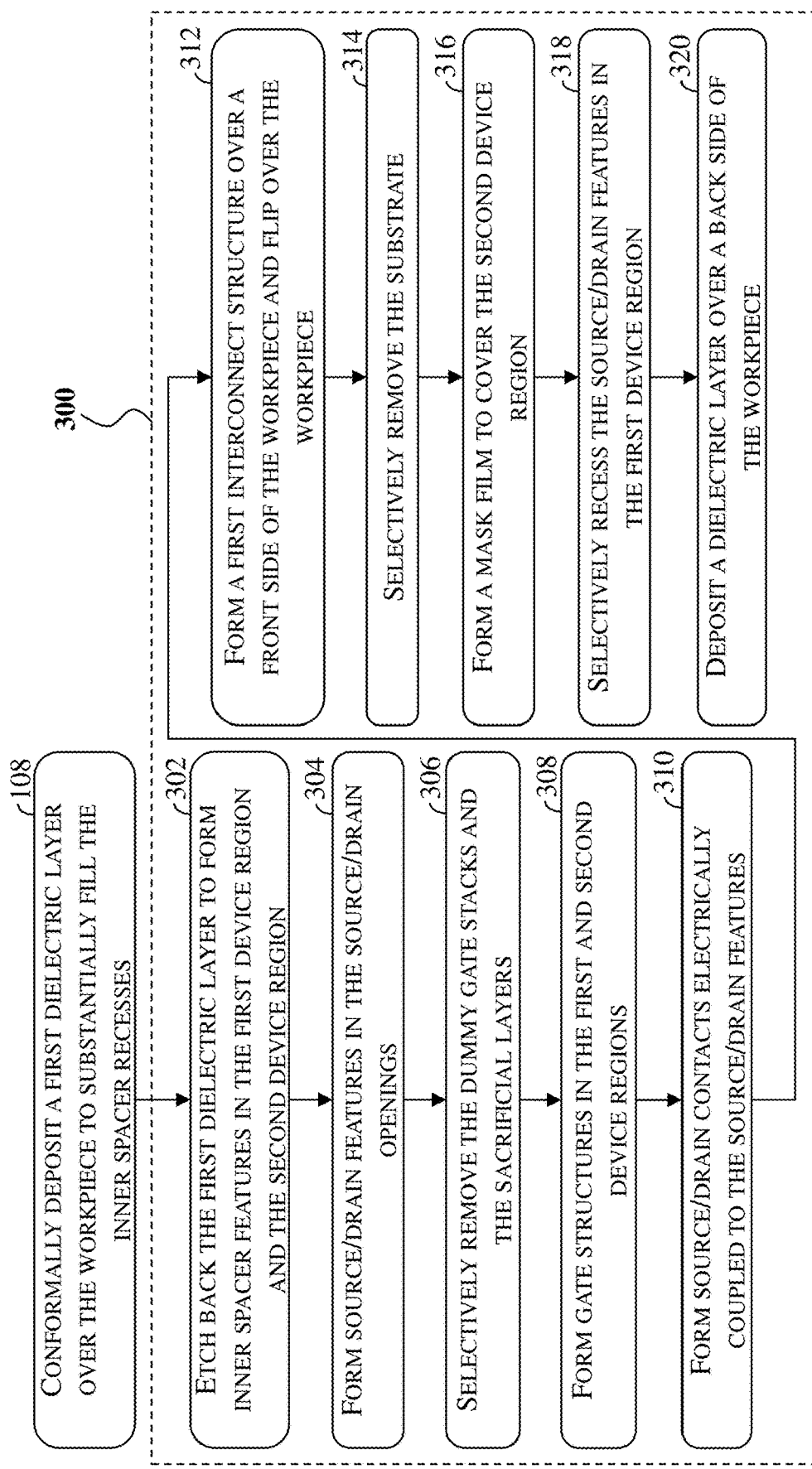
FIG. 16 illustrates a flow chart of a first alternative method for forming a semiconductor structure, according to one or more aspects of the present disclosure.

Referring to FIGS. 1 and 15A-15B, method 100 includes a block 124 where source/drain contacts 240 are formed to electrically couple to the source/drain features 230/230'. The formation of a source/drain contact 240 includes selectively removing portions of the ILD layer 236 and the CESL 234 formed directly over the source/drain features 230/230' to form a source/drain contact opening. After forming the source/drain contact opening, a silicide layer 241 is then formed to reduce a contact resistance between the source/drain feature 230/230' and the source/drain contact 240. The silicide layer 241 may include nickel silicide. After the formation of the silicide layer 241, the source/drain contact 240 may be formed in the source/drain contact opening. The source/drain contact 240 may include titanium, titanium nitride, aluminum, rhodium, ruthenium, copper, iridium, tungsten, other suitable materials, or combinations thereof.

Referring to FIG. 1, method 100 includes a block 126 where further processes are performed. Such further processes may include selectively recessing the gate structure 238 and forming a self-aligned capping layer 242 (shown in FIGS. 15A-15B) on the recessed gate structure. The self-aligned capping layer 242 may be formed before the forming of the source/drain opening. Such further processes may include forming a multi-layer interconnect (MLI) structure (not depicted) over the workpiece 200. The MLI may include various interconnect features, such as vias and conductive lines, disposed in dielectric layers, such as etch-stop layers and ILD layers. In some embodiments, the vias are vertical interconnect features configured to interconnect device-level contacts, such as gate contacts (not depicted) formed over the gate structure 238.

In methods and structures depicted above, the second dielectric layer 222 is formed after the forming of the first dielectric layer 220, and the first dielectric layer 220 is etched back to form inner spacer features after the forming of the second dielectric layer 222. Other alternative methods may also be used to form a semiconductor structure that includes different semiconductor devices. For example, in an alternative embodiment, after the forming of the first dielectric layer 220, the first dielectric layer 220 may be etched back to form inner spacer features. After forming those inner spacers, the second dielectric layer 222 may be deposited and etched back to form dielectric features in the first device region 200A and the second device region 200B, and the dielectric features formed in the second device region 200B may be removed, leaving the dielectric features remaining in first device region 200A. In such embodiments, the dielectric features of a final structure of a semiconductor device formed in the first device region 200A may include portions of the second dielectric layer 222 and may be free of the first dielectric layer 220 (e.g., the bottom portion 220b). That is, the dielectric features in the first device region 200A may be in direct contact with a top surface of the substrate 202 and a sidewall surface of the bottommost channel layer 208b. Other alternative methods are also possible. More specifically, a first alternative method 300 is described with reference to FIG. 16 in conjunction with FIGS. 2, 6A-6B, 17A-23A, and 17B-23B.

In the present embodiments, after performing operations (i.e., conformally depositing a first dielectric layer 220 over the workpiece 200) in block 108 of method 100, method 300 is applied to the workpiece 200 shown in FIGS. 6A-6B to form an alternative semiconductor structure. For ease of description, the workpiece 200 shown in FIGS. 6A-6B in this embodiment will be referred to as a workpiece 400, and the workpiece 400 includes a first device region 400A and a second device region 400B. Referring to FIGS. 16, 6A-6B, and 17A-17B, method 300 includes a block 302 where, after the depositing of the first dielectric layer 220, the first dielectric layer 220 is etched back to form inner spacer features 226 in the first device region 400A and the second device region 400B. In embodiments represented in FIGS. 17A-17B, after forming the inner spacer features 226, the source/drain openings 216 in the first device region 400A and second device region 400B expose portions of the top surface of the substrate 202.

Referring to FIGS. 16 and 18A-18B, method 300 includes a block 304 where source/drain features 410 are formed to fill the source/drain openings in the first and second device regions 400A and 400B. The formation and composition of the source/drain features 410 are in a way similar to those of the source/drain features 230' described with reference to FIGS. 12A-12B, and repeated description is omitted for reason of simplicity. In the present embodiments, the source/drain feature 410 in the first device region 400A may be substantially the same as the source/drain feature 410 in the second device region 400B.

Still Referring to FIGS. 16 and 18A-18B, method 300 includes a block 306 where the dummy gate stacks 210 and sacrificial layers 206 are selectively removed. The processes of the selectively removal of dummy gate stacks 210 and sacrificial layers 206 are in a way similar to those described with reference to FIGS. 13A-13B, and repeated description is omitted for reason of simplicity.

Figures 19A, 19B:
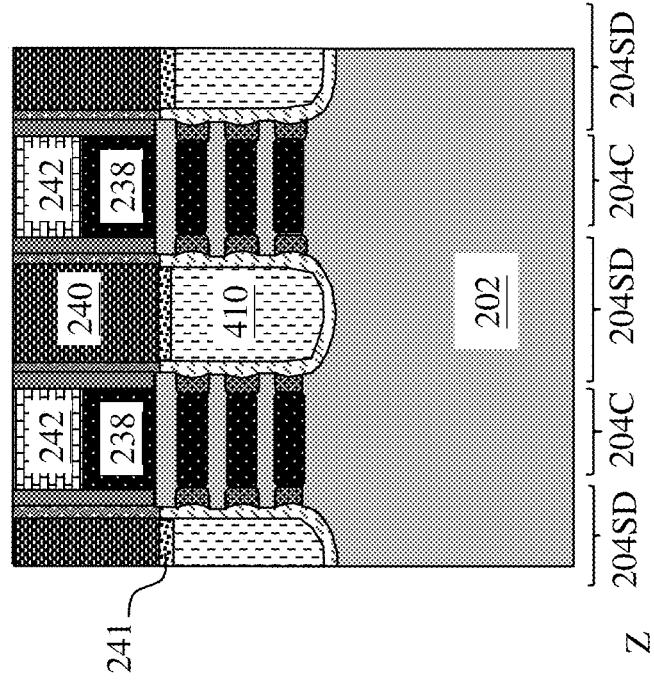

Referring to FIGS. 16 and 19A-19B, method 300 includes a block 308 where gate structures 238 are formed in the first and second device regions 400A and 400B and a block 310 where source/drain contacts 240 are formed to electrically couple to the source/drain features 230. The formations of the gate structures 238 and source/drain contacts 240 have been described above with reference to FIGS. 14A-14B and 15A-15B, and repeated description is omitted for reason of simplicity.

Referring to FIGS. 16 and 20A-20B, method 300 includes a block 312 where a first interconnect structure 420 is formed over the workpiece 400. In some embodiments, the first interconnect structure 420 may include multiple intermetal dielectric (IMD) layers and multiple metal lines or contact vias in each of the IMD layers. In some instances, the IMD layers and the ILD layer 236 may share similar composition. The metal lines and contact vias in each IMD layer may be formed of metal, such as aluminum, tungsten, ruthenium, or copper. In some embodiments, the metal lines and contact vias may be lined by a barrier layer to insulate the metal lines and contact vias from the IMD layers and to prevent electro-migration. Because the first interconnect structure 420 is formed over the front side of the workpiece 400, the first interconnect structure 420 may also be referred to as a frontside interconnect structure 420. Still referring to FIGS. 20A-20B, a carrier substrate 430 is bonded to the first interconnect structure 420. In some embodiments, the carrier substrate 430 may be bonded to the workpiece 400 by fusion bonding, by use of an adhesion layer, or a combination thereof. In some instances, the carrier substrate 430 may include semiconductor materials (such as silicon), sapphire, glass, polymeric materials, or other suitable materials. Once the carrier substrate 430 is bonded to the first interconnect structure 420 of the workpiece 400, the workpiece 400 is flipped over, as represented in FIGS. 20A-20B, the substrate 202 is at the top and is disposed over the channel members 208.

Referring to FIGS. 16 and 21A-21B, method 300 includes a block 314 where the substrate 202 is selectively removed. In some embodiments, the substrate 202 may be planarized and then selectively removed by a wet etching process to form trenches 440. For example, in embodiments where the substrate 202 includes silicon, alkaline etchants may be used to selectively remove the silicon substrate 202. The trenches 440 expose the source/drain features 410, the inner spacer features 226, and the gate structures 238.

Referring to FIGS. 16 and 22A-22B, method 300 includes a block 316 where a patterned mask film 450 is formed to cover the second device region 400B. The formation of the patterned mask film 450 may be in a way similar to the formation of the patterned mask film 224 described above with reference to FIGS. 8A-8B. For example, a mask film 450 is deposited over the workpiece 400 using CVD or ALD and then a photoresist layer 460 is deposited over the mask film 450 using spin-on coating or a suitable process. The photoresist layer 460 is patterned using photolithography process to form a patterned photoresist layer 460. The patterned photoresist layer 460 is then applied as an etch mask in an etching process to pattern the mask film 450.

Still referring to FIGS. 16 and 22A-22B, method 300 includes a block 318 where the source/drain features 410 in the first device region 400A are selectively recessed to form trenches 470. While using the patterned mask film 450 as an etch mask, an etching process may be performed to selectively recess the source/drain features 410 in the first device region 400A to form trenches 470. The trenches 470 expose both the first epitaxial semiconductor layer 230a and the second epitaxial semiconductor layer 230b of the source/drain features 410. The duration of the etching process may be controlled such that the trenches 470 expose sidewall surfaces of the bottommost channel layers 208b. That is, the etching process may be stopped after the sidewall surfaces of the bottommost channel layers 208b being fully exposed in the trenches 470. Due to the selectively recess of the source/drain features 410 in the first device region 400A, a volume of the partially recessed source/drain feature 410 in the first device region 400A is less than a volume of the source/drain feature 410 in the second device region 400B. The partially recessed source/drain features 410 in the first device region 400A may be referred to as source/drain features 410'. In embodiments presented in FIG. 22A, the bottommost channel layer 208b is not in direct contact with the source/drain feature 410'. That is, the source/drain feature 410' is electrically coupled to the middle channel layer 208m and the topmost channel layer 208t. The patterned photoresist layer 460 and patterned mask film 450 may be selectively removed after the forming of the source/drain features 410'.

Figure 23A:
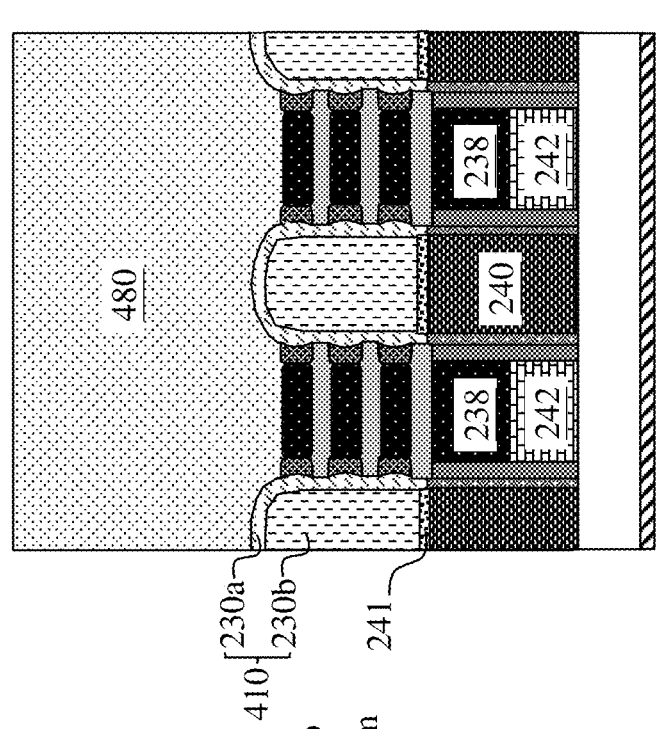
Figure 23B:
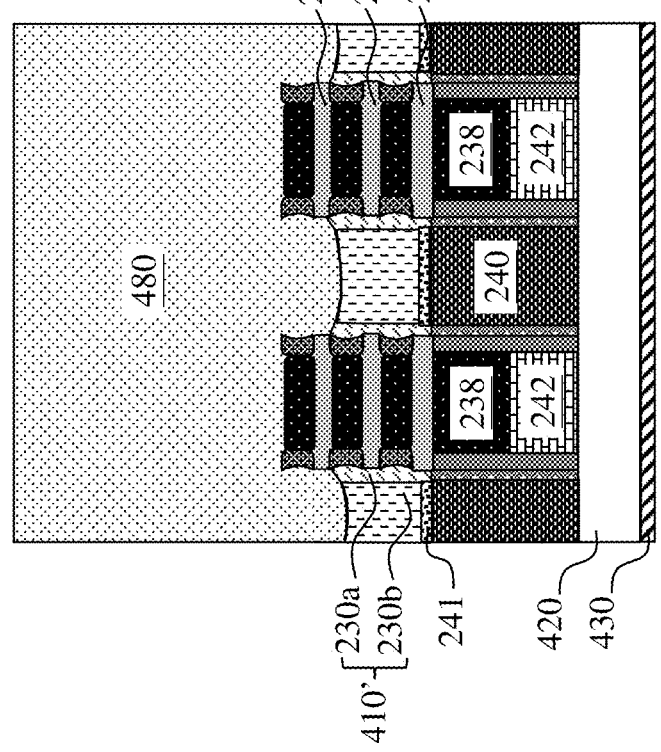
Figure 24:
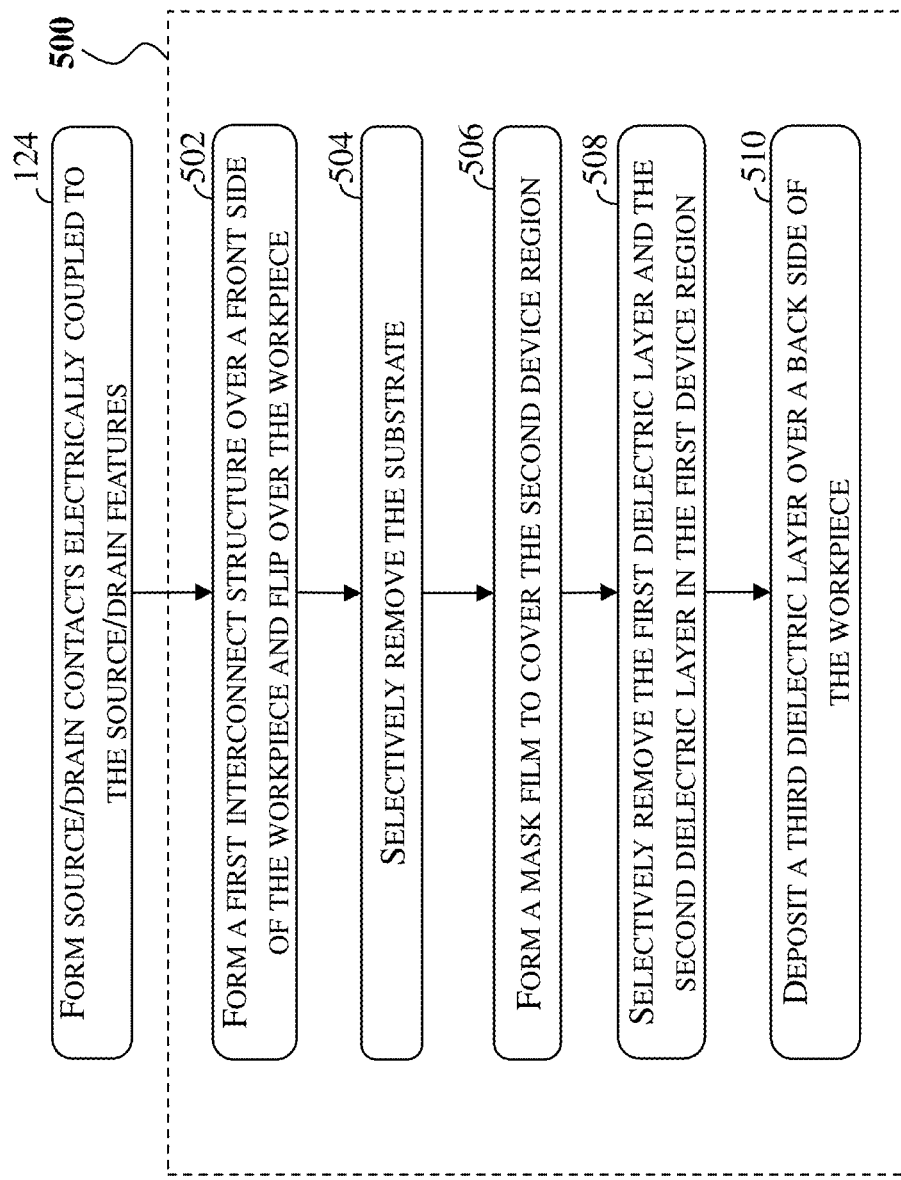
FIG. 24 illustrates a flow chart of a second alternative method for forming a semiconductor structure, according to one or more aspects of the present disclosure.

Referring to FIGS. 16 and 23A-23B, method 300 includes a block 320 where a dielectric layer 480 is deposited over the workpiece 400 to fill the trenches 470 and trenches 440. The dielectric layer 480 may be deposited over a back side of the workpiece 400 by flowable CVD (FCVD), CVD, plasma enhanced CVD (PECVD), spin-on coating, or a suitable process. In some instances, the dielectric layer 480 may include silicon oxide, silicon nitride, silicon oxycarbide, silicon oxycarbonitride, silicon carbonitride, metal nitride, or a suitable dielectric material. As shown in FIG. 23A, after the dielectric layer 480 is formed, the bottommost channel layers 208b in the first device region 400A are laterally in direct contact with the dielectric layer 480. In other words, the dielectric layer 480 covers the entirety of sidewall surfaces of the bottommost channel layers 208b. Each of the first and second epitaxial semiconductor layers 230a and 230b of the source/drain feature 410' is in direct contact with the dielectric layer 480. In addition, sidewall surfaces of some of the inner spacer features 226 in the first device region 400A are in direct contact with the dielectric layer 480. In embodiments represented in FIG. 23B, the bottom surface of the source/drain feature 410 in the second device region 400B is in direct contact with the dielectric layer 480, and the second epitaxial semiconductor layer 230b is spaced apart from the dielectric layer 480 by the first epitaxial semiconductor layer 230a. A planarization process, such as a CMP process, may be performed to planarize the back side of the workpiece 400 to provide a planar surface.

In methods and structures depicted above with reference to FIGS. 16, 17A-23A and 17B-23B, the dielectric layer 480 is formed after flipping over the workpiece 400, removing the substrate 202, and recessing the source/drain feature 410 in the first device region 400A. The depth of the trench 470 is determined by the duration of the etching process used to recess the source/drain feature 410. A second alternative method 500 that can provide a better depth control may be used to form a semiconductor structure. The second alternative method 500 is described with reference to FIG. 24 in conjunction with FIGS. 1, 25A-28A, and 25B-28B. For ease of description, the workpiece 200 shown in FIGS. 15A-15B in this alternative embodiment may be referred to as a workpiece 600, and the workpiece 600 includes a first device region 600A and a second device region 600B.

Figures 25A, 25B:
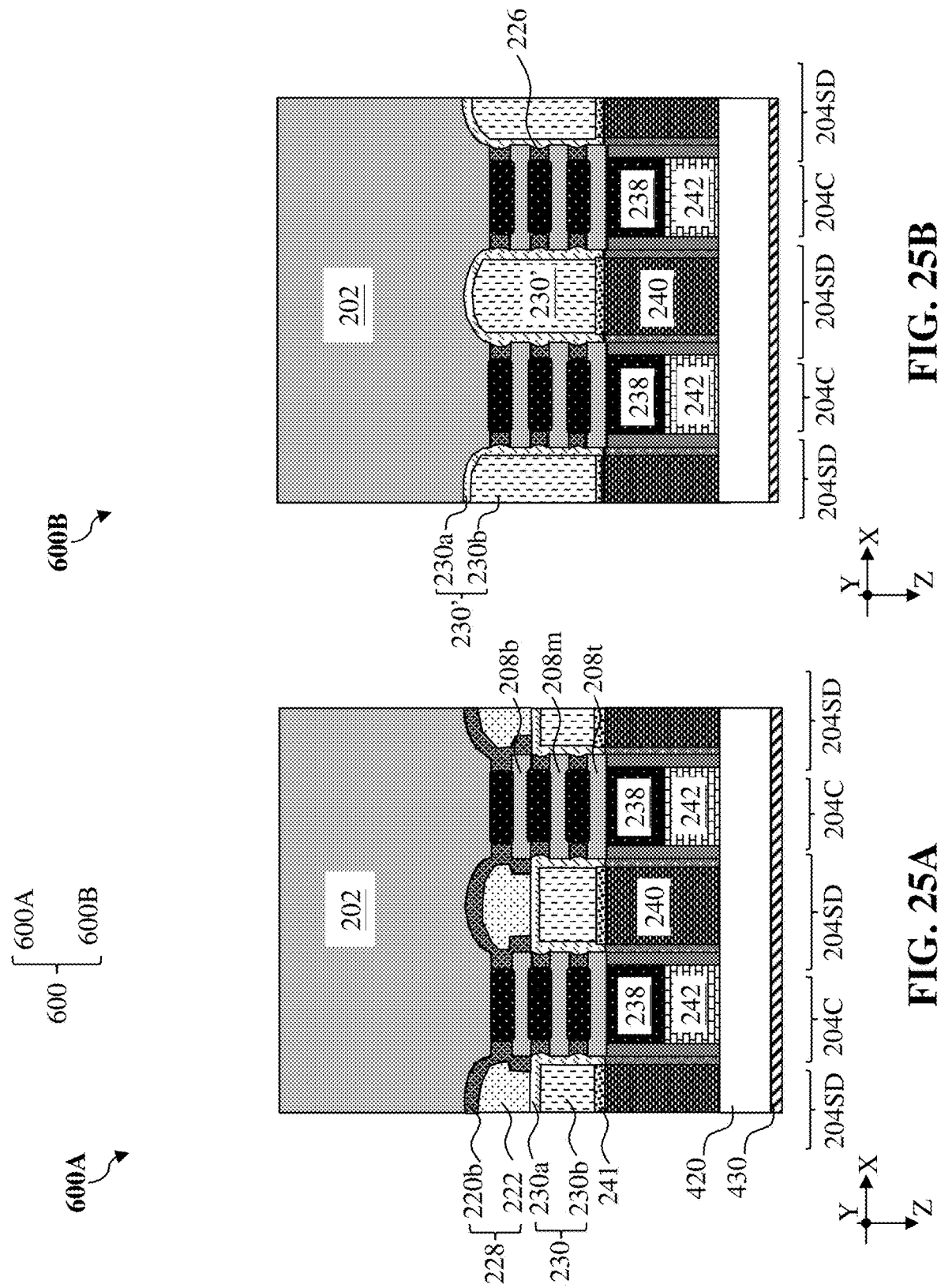

Referring to FIGS. 24 and 25A-25B, method 500 includes a block 502 where the first interconnect structure 420 is formed over the workpiece 600. After forming the first interconnect structure 420, the carrier substrate 430 is bonded to the first interconnect structure 420. The formations of the first interconnect structure 420 and the carrier substrate 430 have been described with reference to FIGS. 20A-20B, and repeated description is omitted for reason of simplicity. Once the carrier substrate 430 is bonded to the first interconnect structure 420 of the workpiece 600, the workpiece 600 is flipped over, as shown in FIGS. 25A-25B, the substrate 202 is at the top and is disposed over the channel members 208.

Referring to FIGS. 24 and 26A-26B, method 500 includes a block 504 where the substrate 202 is selectively removed. In some embodiments, the substrate 202 may be planarized by a planarization process and then selectively removed by a wet etching process to form trenches 610. For example, in embodiments where in the substrate 202 includes silicon, alkaline etchants may be used to selectively remove the silicon substrate 202. The trenches 610 in the first device region 600A expose the bottom portion 220b of the first dielectric layer 220 and the gate structures 238. The trenches 610 in the second device region 600B expose the source/drain features 230', the inner spacer features 226, and the gate structures 238.

Figures 27A, 27B:
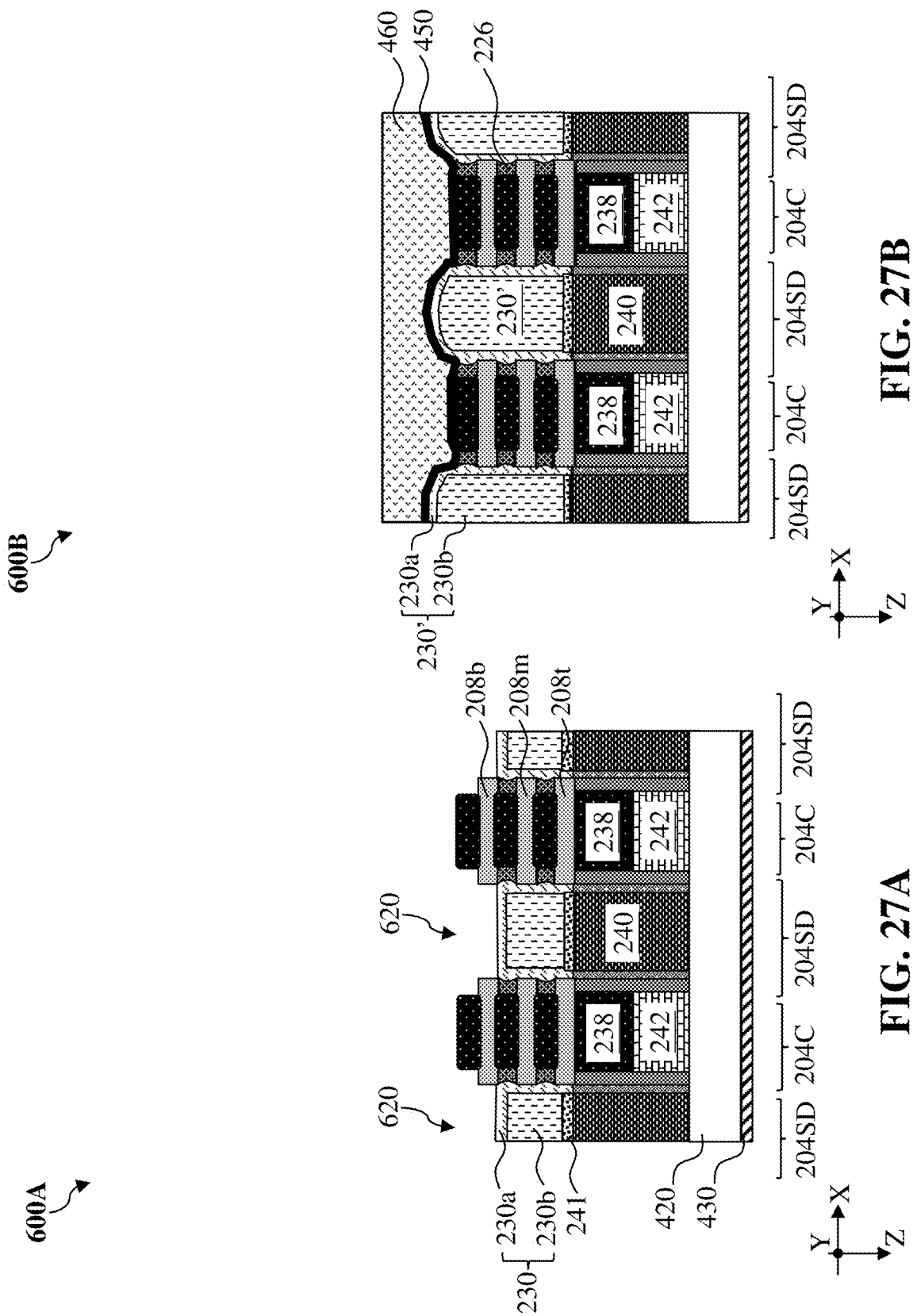

Referring to FIGS. 24 and 27A-27B, method 500 includes a block 506 where the patterned mask film 450 is formed to cover the second device region 600B. The formation of the patterned mask film 450 may be in a way similar to the formation of the patterned mask film 224 described above with reference to FIGS. 8A-8B.

Still referring to FIGS. 24 and 27A-27B, method 500 includes a block 508 where the dielectric features 228 in the first device region 600A are selectively removed to form trenches 620. While using the patterned mask film 450 as an etch mask, an etching process may be performed to selectively remove the dielectric features 228 (including the bottom portion 220b of the first dielectric layer 220 and the second dielectric layer 222) in the first device region 600A to form trenches 620. In the present embodiments, the dielectric feature 228 acts as a placeholder for a functional dielectric feature that will be formed later. By selectively removing the dielectric feature 228, a depth of the trench 620 may be substantially equal to a depth of the dielectric feature 228. The trenches 620 expose the first epitaxial semiconductor layer 230a of the source/drain feature 230. In the present embodiments, due to the removal of the first dielectric layer 220, the trenches 620 further expose the entire sidewall surfaces and portions of the bottom surfaces of the bottommost channel layers 208b. After forming the trenches 620, the patterned mask film 450 and the patterned photoresist layer 460 may be selectively removed.

Figure 28B:
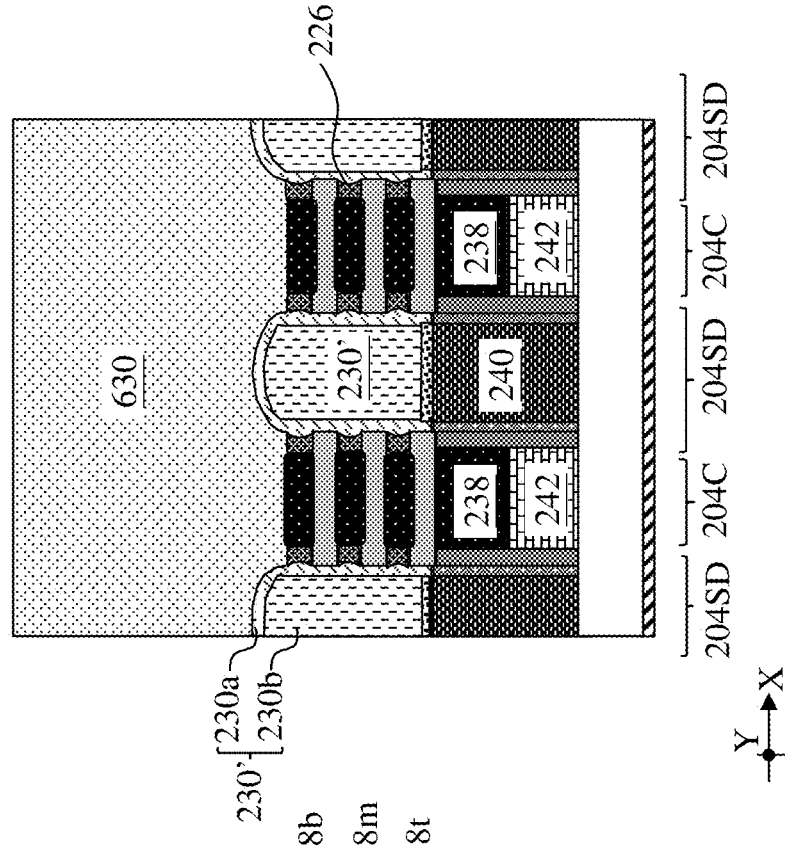
Figure 28A:
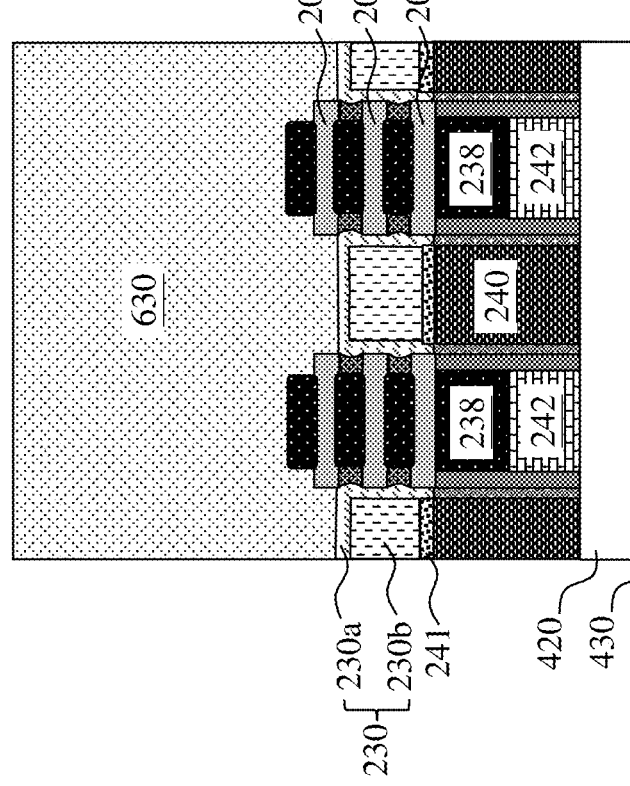
Figure 29:
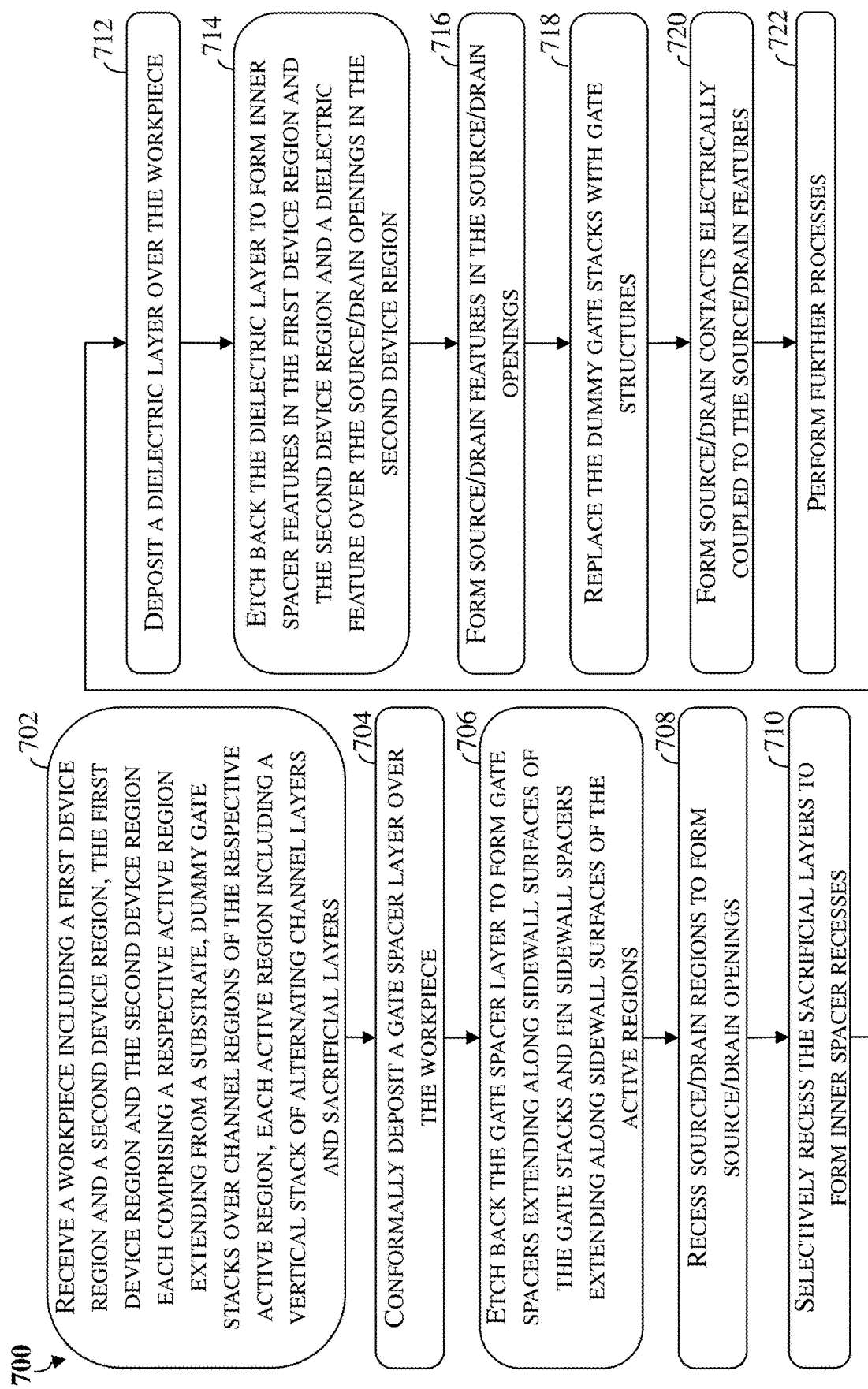
FIG. 29 illustrates a flow chart of a method for forming another semiconductor structure, according to one or more aspects of the present disclosure.

Referring to FIGS. 24 and 28A-28B, method 500 includes a block 510 where a dielectric layer 630 is deposited over the workpiece 600 to fill the trenches 610 and trenches 620. The dielectric layer 630 may be formed in a way similar to the formation of the dielectric layer 480. In some instances, a composition of the dielectric layer 630 may be different from a composition of the dielectric feature 228. As shown in FIG. 28A, after the dielectric layer 630 is formed, the bottommost channel layers 208b in the first device region 600A are laterally and vertically in direct contact with the dielectric layer 630. The bottommost portion of the gate structure 238 in the first device region 600A is embedded in the dielectric layer 630. The second epitaxial semiconductor layers 230b in the first device region 600A and the second epitaxial semiconductor layers 230b in the second device region 600B are spaced apart from the dielectric layer 630 by the first epitaxial semiconductor layer 230a.

Figure 30:
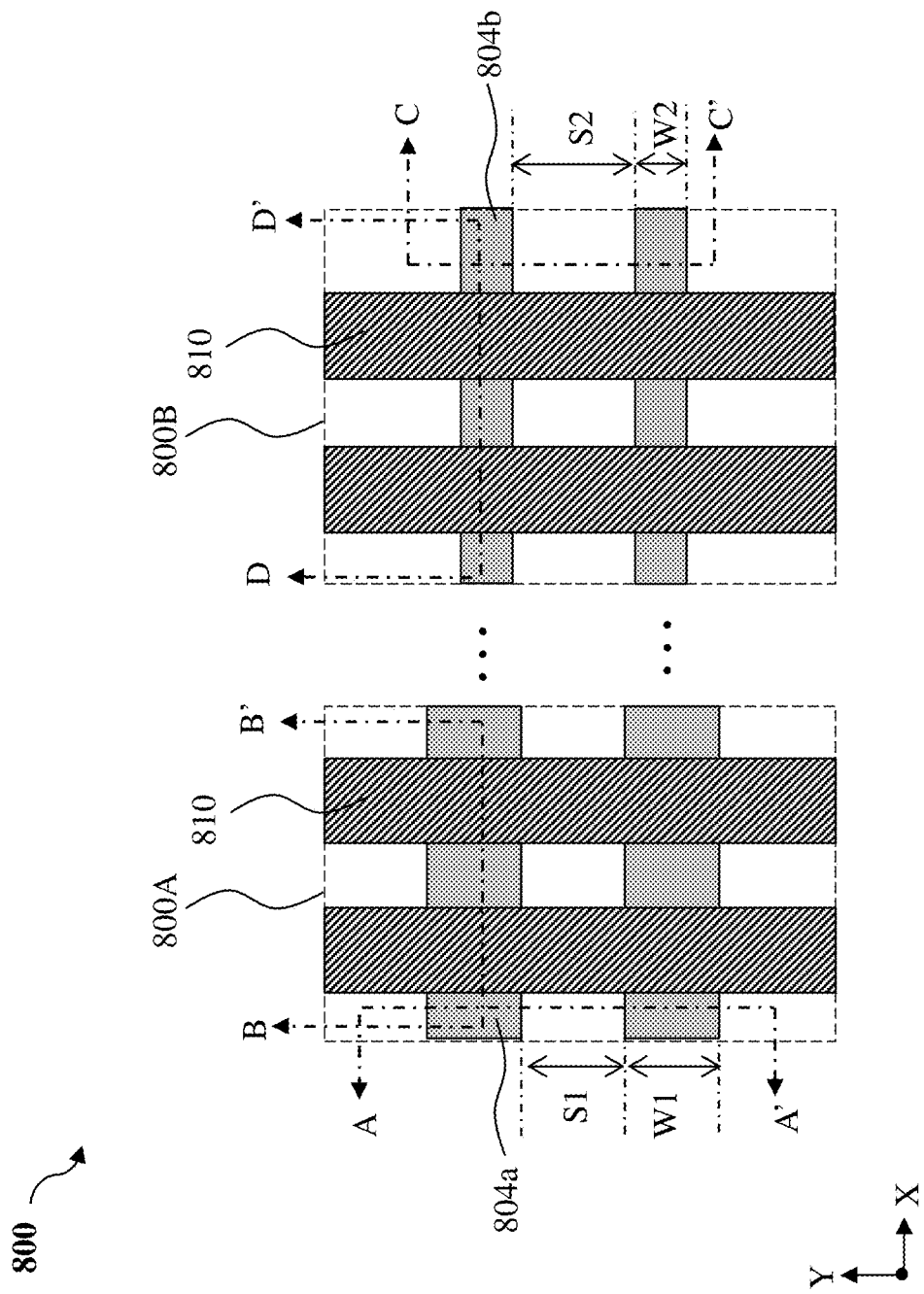
FIG. 30 illustrates a fragmentary top view of an exemplary workpiece to undergo various stages of operations in the method of FIG. 29, according to various aspects of the present disclosure.

In the embodiments described above with reference to FIGS. 1, 16, and 24, the first device region 200A/400A/600A and the second device region 200B/400B/600B are formed from active regions that have a uniform width. The first device region 200A/400A/600A and the second device region 200B/400B/600B are formed from continuous active regions 204. In some other implementations, the first device region for forming first semiconductor devices and the second device region for forming second semiconductor devices may have different active region configurations. A method 700 is described with reference to FIG. 29 in conjunction with FIGS. 30, 31A-38A, 31B-38B, and 31C-38C, and 31D-38D. FIG. 30 illustrates a fragmentary top view of a workpiece 800 to undergo various stages of operations in the method of FIG. 29. FIGS. 31A-38A, 31B-38B, 31C-38C, and 31D-38D illustrate fragmentary cross-sectional views of the workpiece 800 taken along line A-A', B-B', C-C', and D-D' as shown in FIG. 30 during various fabrication stages in the method of FIG. 29, respectively.

Referring to FIGS. 29, 30, 31A-31D, method 700 includes a block 702 where a workpiece 800 is received. The workpiece 800 includes a substrate 802. In an embodiment, the substrate 802 is in a way similar to the substrate 202 and related description is omitted for reason of simplicity. The workpiece 800 includes a first device region 800A for forming first semiconductor devices and a second device region 800B for forming second semiconductor devices. In the present embodiments, semiconductor devices that will be formed in the first device region 800A may have, for example, larger drive current, and semiconductor devices that will be formed in the second device region 800B may have, for example, less leakage current and less device capacitance.

The first device region 800A includes a number of fin-shaped active regions 804a disposed over the substrate 802 and each of the fin-shaped active regions 804a extends lengthwise along the X direction. The second device region 800B includes a number of fin-shaped active regions 804b disposed over the substrate 802 and each of the fin-shaped active regions 804b extends lengthwise along the X direction. In embodiments represented in FIGS. 31A-31D, each of the fin-shaped active region 804a and the fin-shaped active region 804b is formed from a portion 802t of substrate 802 and a vertical stack 805 of alternating semiconductor layers 806 and 808 using a combination of lithography and etch steps. In the depicted embodiment, the vertical stack 805 of alternating semiconductor layers 806 and 808 may include a plurality of channel layers 808 interleaved by a plurality of sacrificial layers 806. The channel layers 808 and sacrificial layers 806 may be in a way similar to the channel layer 208 and the sacrificial layers 206, respectively, and repeated description is omitted for reason of simplicity. For example, the channel layers 808 include a bottommost channel layer 808b, a topmost channel layer 808t, and a middle channel layer 808m disposed between the bottommost channel layer 808b and the topmost channel layer 808t. The bottommost channel layer 808b, the topmost channel layer 808t, and the middle channel layer 808m may be collectively or separately referred to as channel layers 808 or the channel layer 808.

The active region 804a has a width W1 (shown in FIG. 30) along the Y direction, and two adjacent active regions 804a is separated by a spacing S1. The active region 804b has a width W2 along the Y direction, and two adjacent active regions 804b is separated by a spacing S2. In the present embodiments, W1 is greater than W2, and S1 is smaller than S2. Each of the fin-shaped active regions 804a/804b is divided into channel regions 804C overlapped by dummy gate stacks 810 and source/drain regions 804SD adjacent to the channel regions 804C.

Figure 31B:
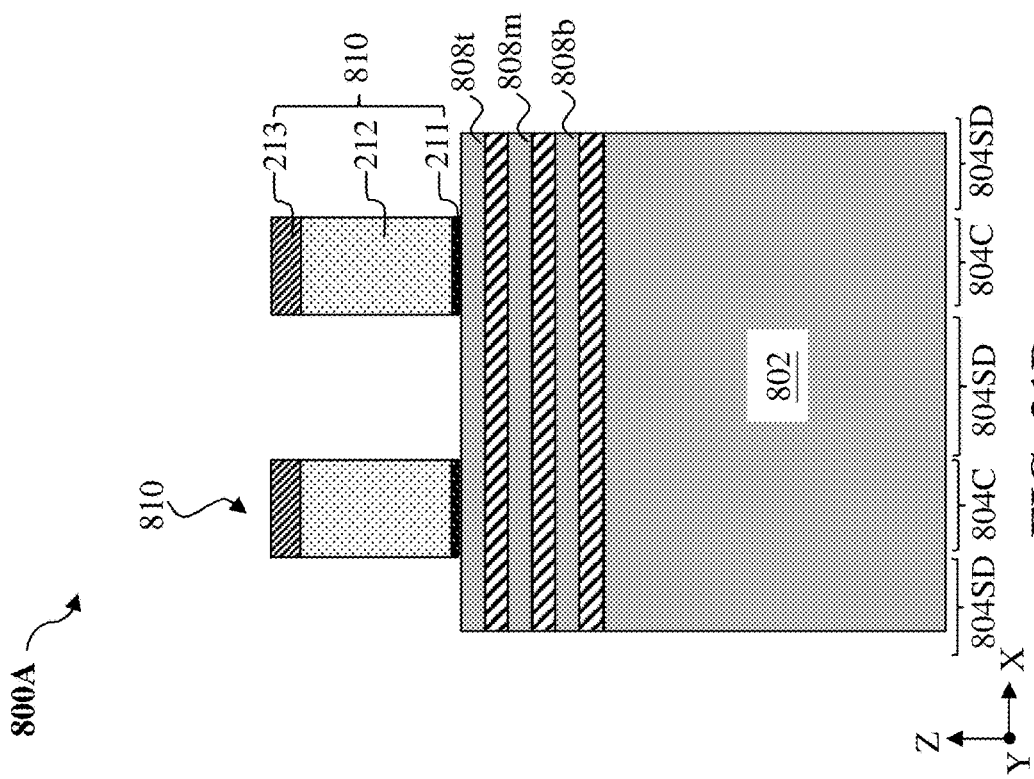
Figure 31A:
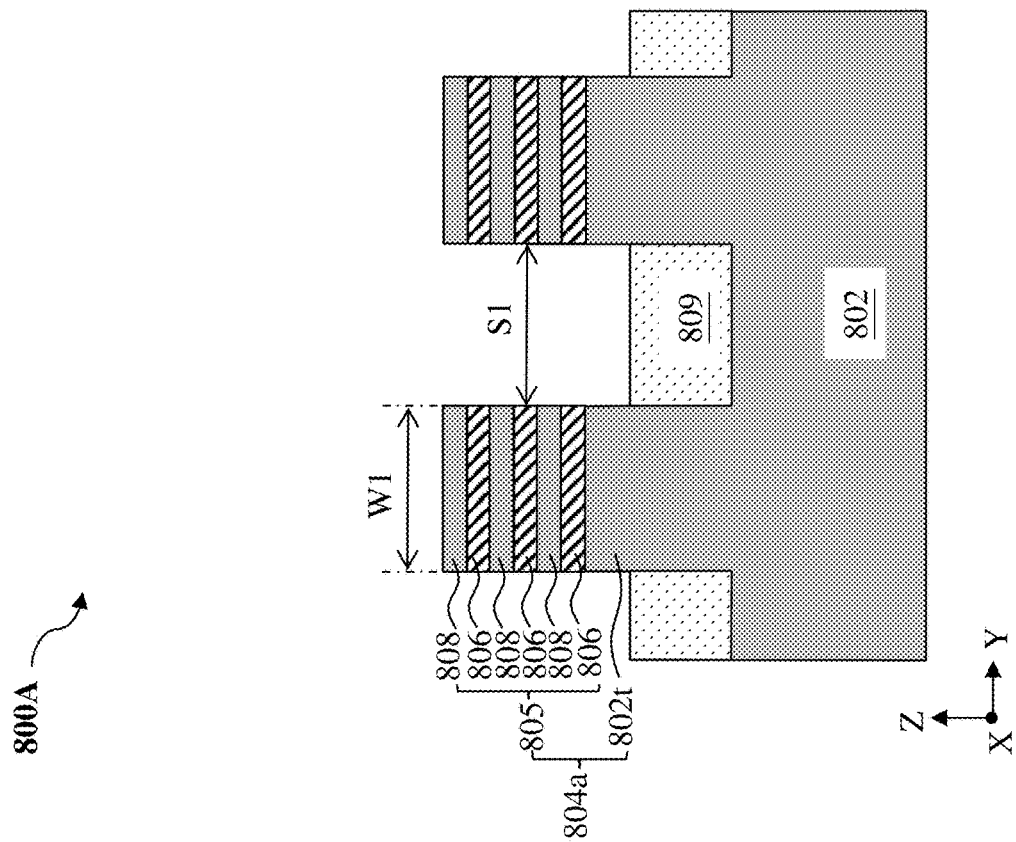
Figure 31C:
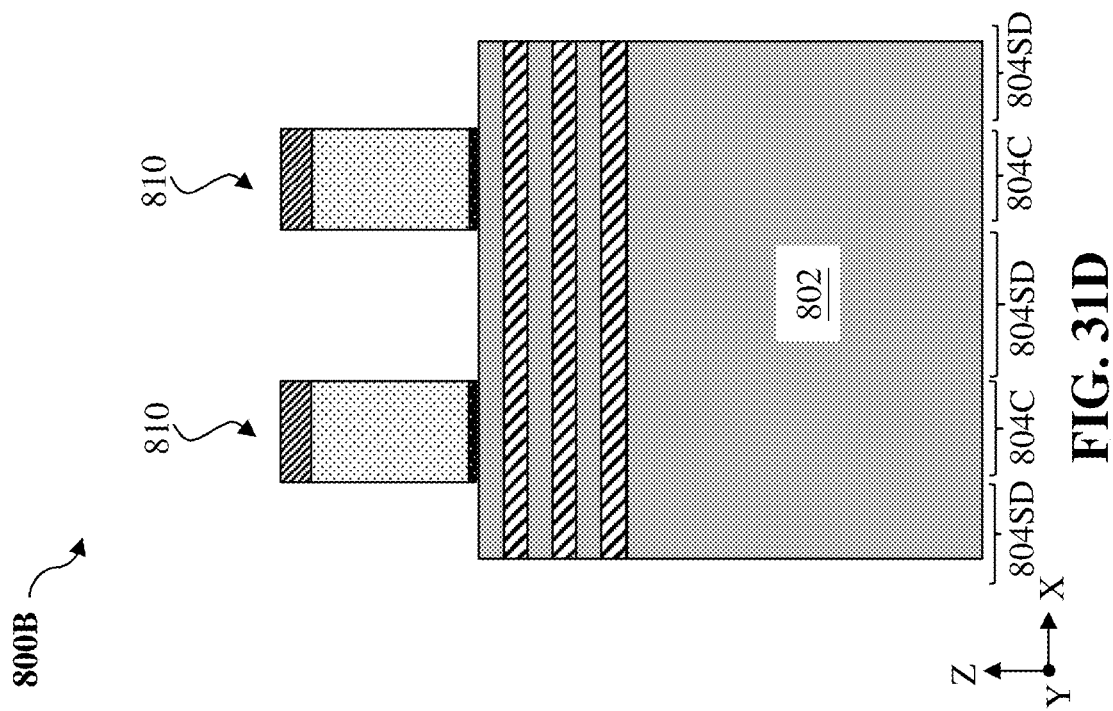
FIGS. 31C, 32C, 33C, 34C, 35C, 36C, 37C, and 38C (FIGS. 31C-38C) illustrate fragmentary cross-sectional views of the workpiece taken along line C-C' as shown in FIG. 30 during various fabrication stages in the method of FIG. 29, according to one or more aspects of the present disclosure.
Figure 31D:
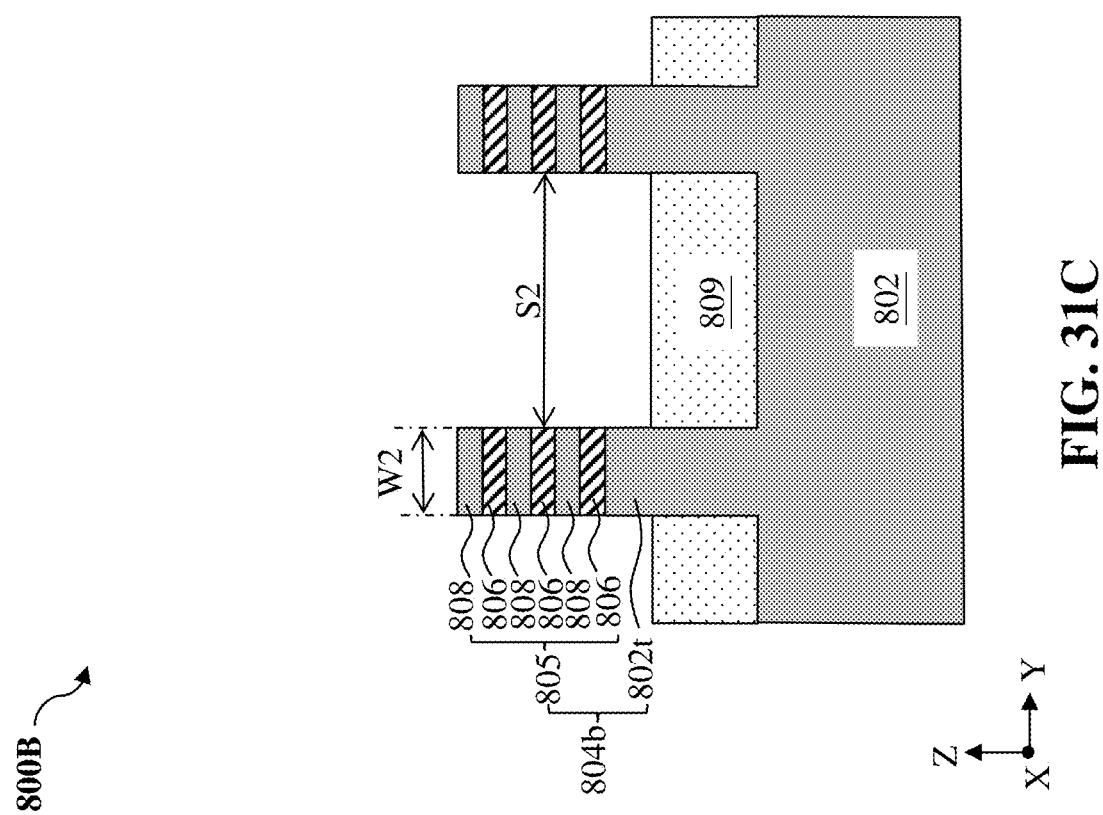
FIGS. 31D, 32D, 33D, 34D, 35D, 36D, 37D, and 38D (FIGS. 31D-38D) illustrate fragmentary cross-sectional views of the workpiece taken along line D-D' as shown in FIG. 30 during various fabrication stages in the method of FIG. 29, according to various aspects of the present disclosure.
Figure 32B:
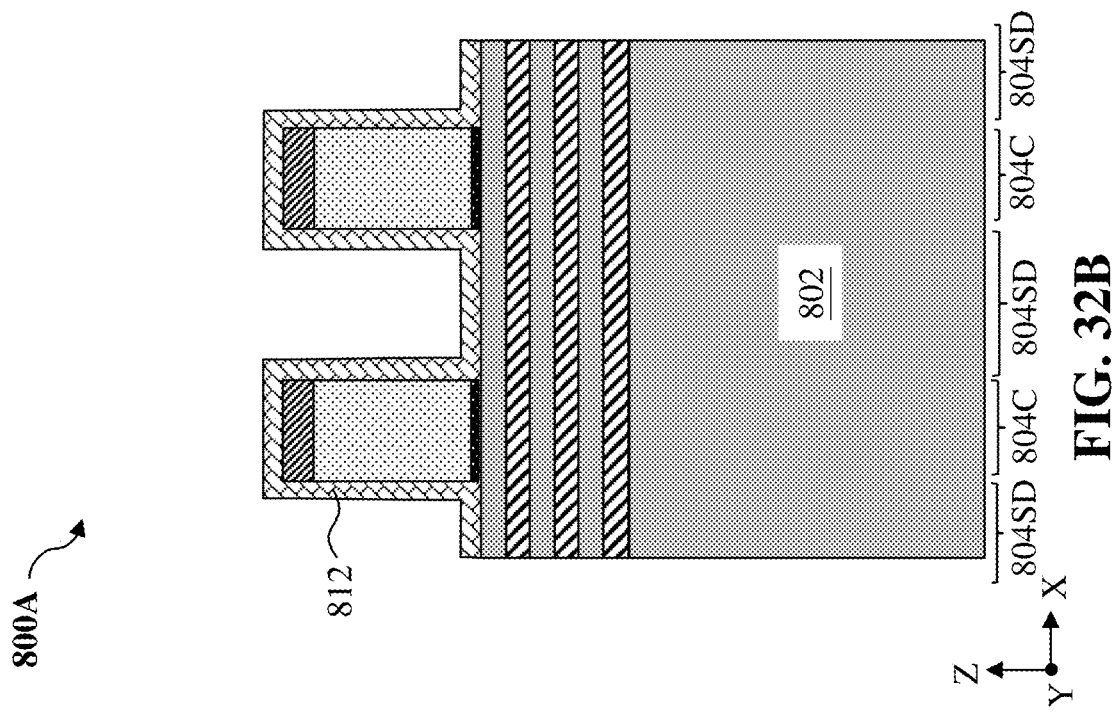
Figure 32A:
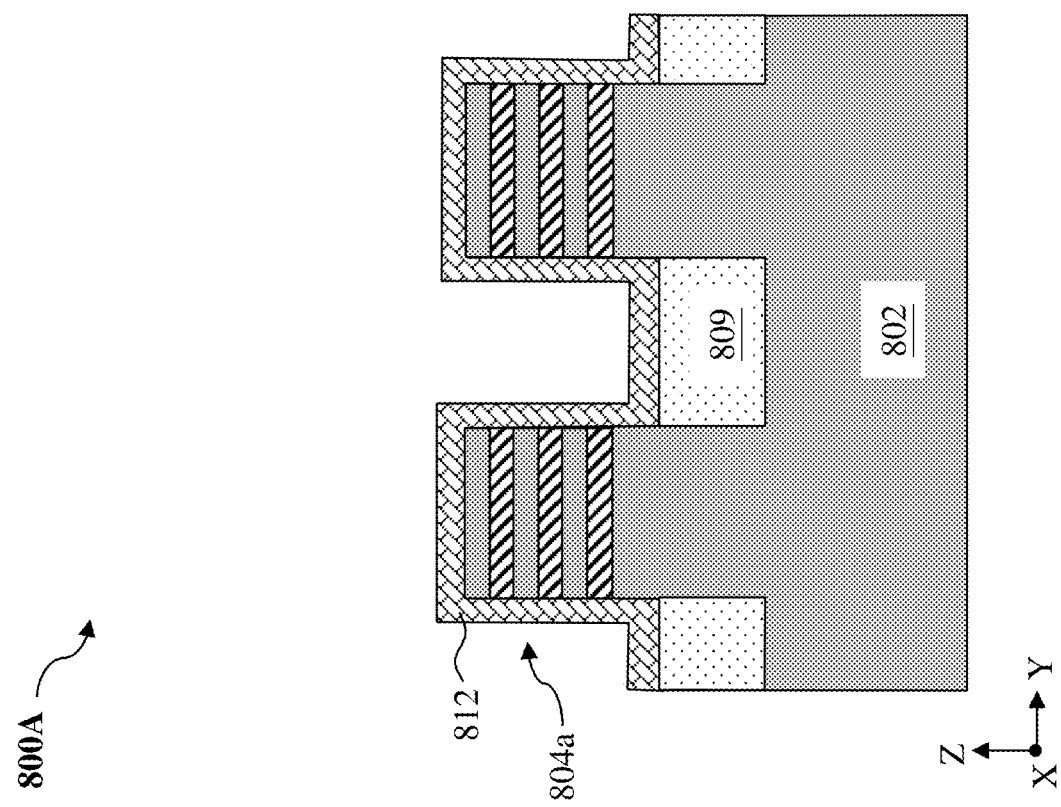
Figure 32D:
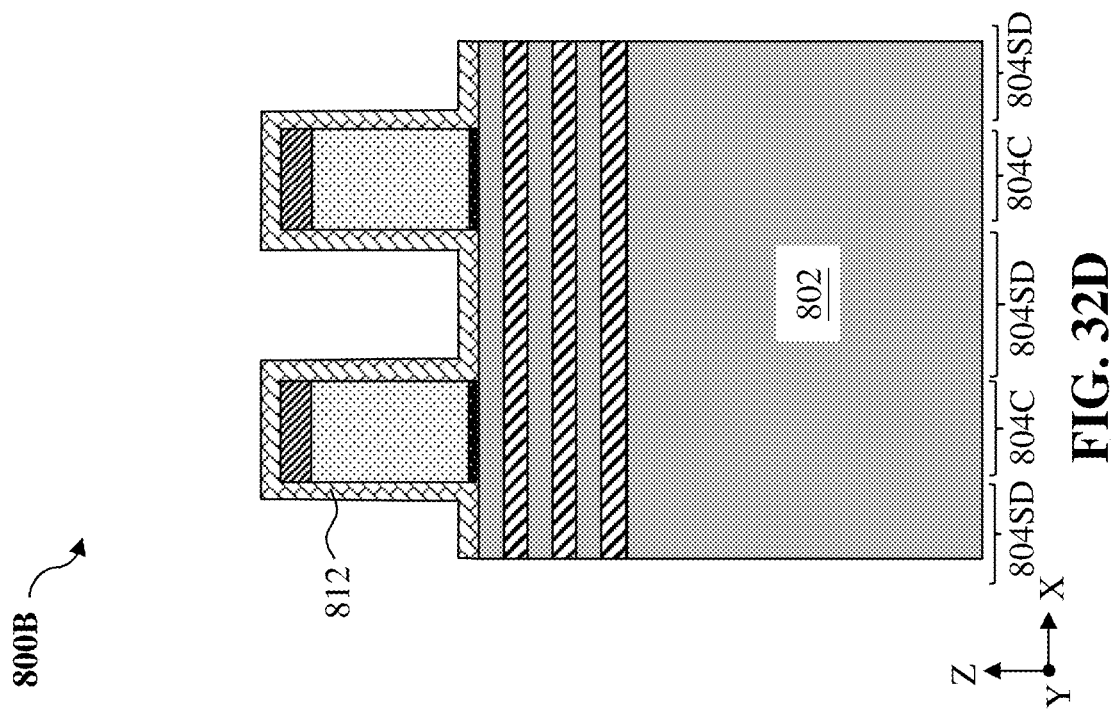
Figure 32C:
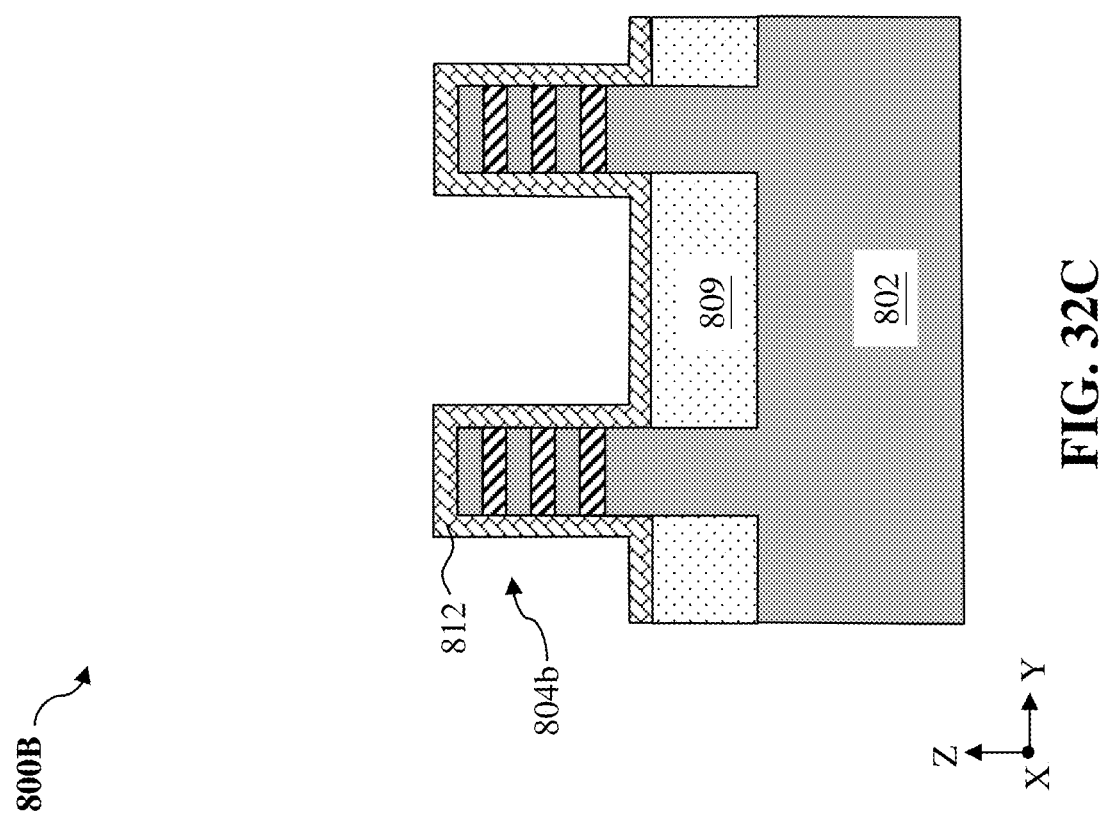

As shown in FIGS. 31A and 31C, the workpiece 800 also includes an isolation feature 809 formed around each fin-shaped active region 804a/804b to isolate the fin-shaped active region from an adjacent fin-shaped active region. The isolation feature 809 may also be referred to as a shallow trench isolation (STI) feature and may include silicon oxide, silicon oxynitride, fluorine-doped silicate glass (FSG), a low-k dielectric, combinations thereof, and/or other suitable materials.

Still referring to FIGS. 30 and 31A-31D, the workpiece 800 also includes dummy gate stacks 810 (shown in FIGS. 31B and 31D) disposed over channel regions 804C of the fin-shaped active regions 804a and the fin-shaped active regions 804b. The channel regions 804C and the dummy gate stacks 810 also define source/drain regions 804SD that are not vertically overlapped by the dummy gate stacks 810. In this embodiment, a gate replacement process (or gate-last process) is adopted where the dummy gate stacks 810 serve as placeholders for functional gate structures. Other processes and configuration are possible. In an embodiment, the dummy gate stack 810 is in a way similar to the dummy gate stack 210 and includes the dummy dielectric layer 211, the dummy gate electrode layer 212 over the dummy dielectric layer 211, and the gate-top hard mask layer 213 over the dummy gate electrode layer 212.

Referring to FIGS. 29, 32A, 32B, 32C, and 32D, method 700 includes a block 704 where a gate spacer layer 812 is conformally deposited over the workpiece 800. In some embodiments, the formation of the gate spacer layer 812 includes conformal deposition of one or more dielectric layers over the workpiece 800. In some embodiments, the gate spacer layer 812 may be deposited using CVD, sub-atmospheric CVD (SACVD), or ALD and may include silicon oxide, silicon nitride, silicon carbide, silicon oxynitride, silicon carbonitride, silicon oxycarbide, silicon oxycarbonitride, combinations thereof, or other suitable materials.

Figure 33B:
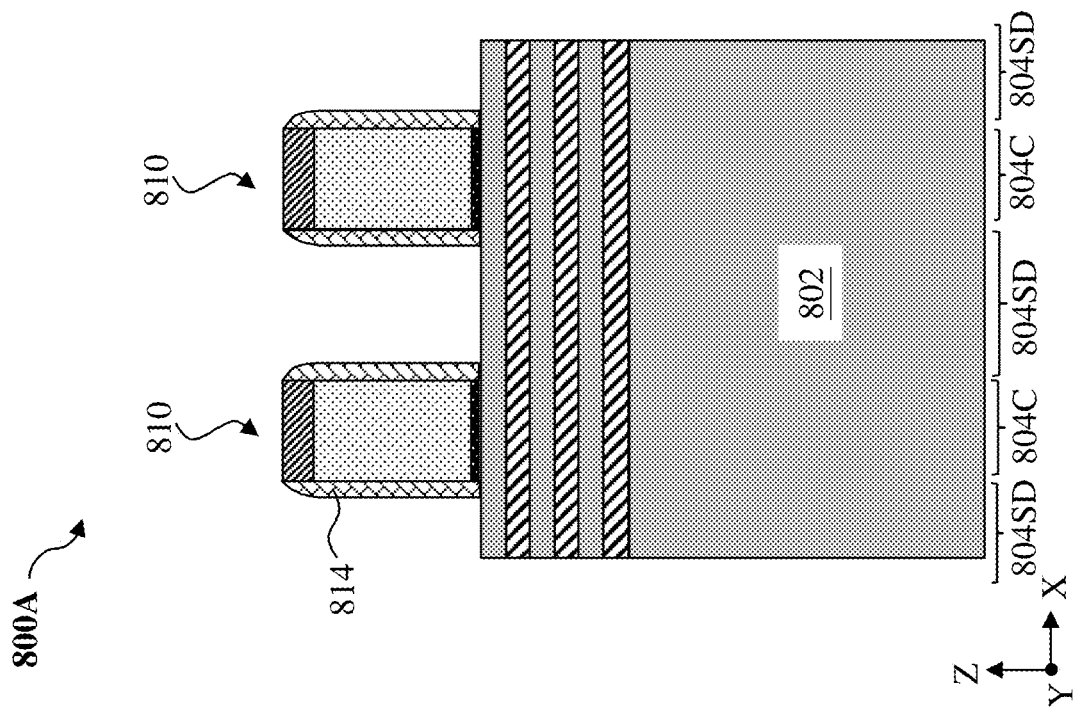
Figure 33A:
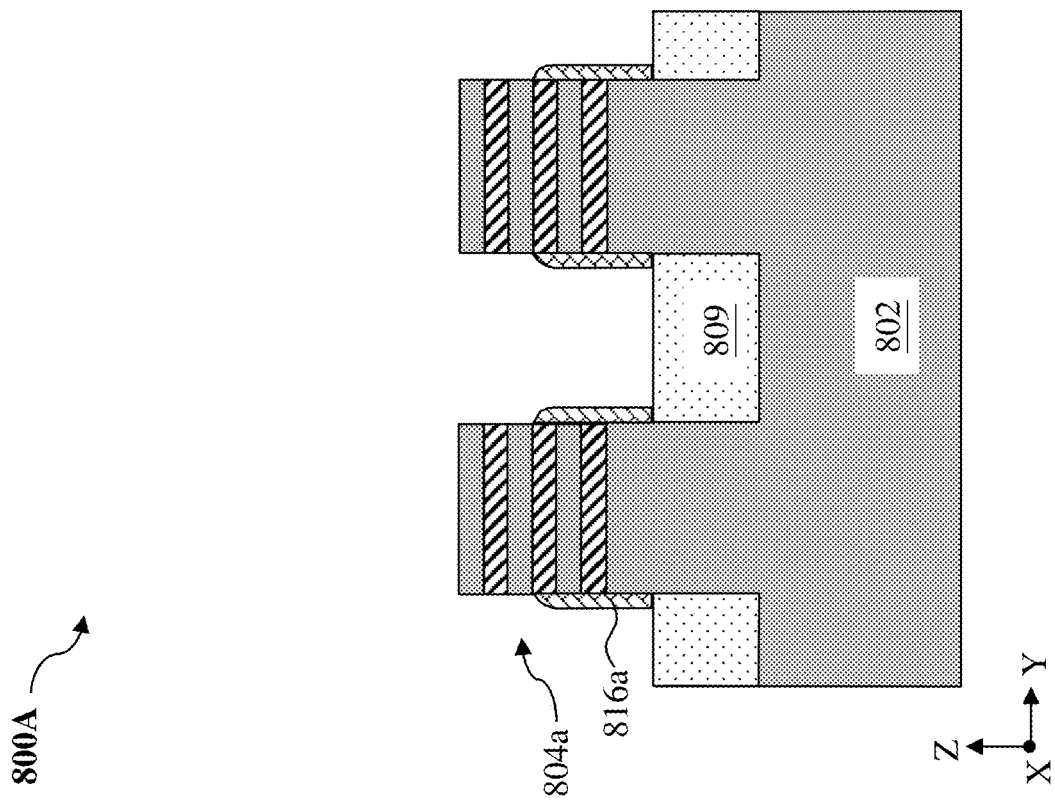
Figure 33D:
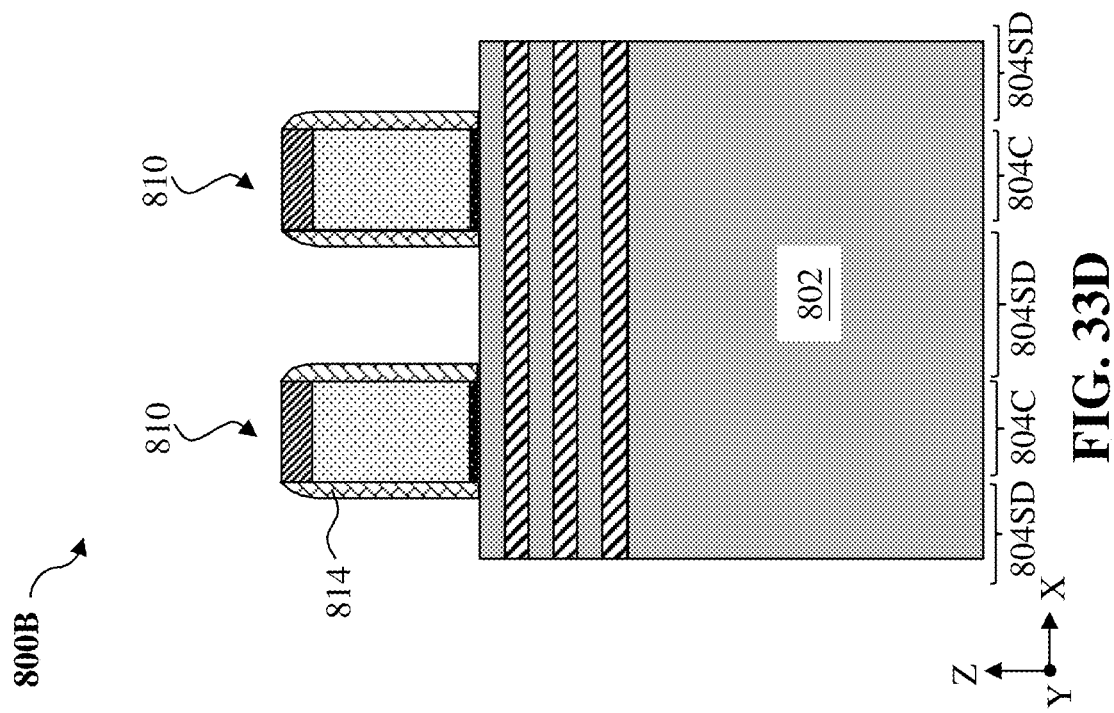
Figure 33C:
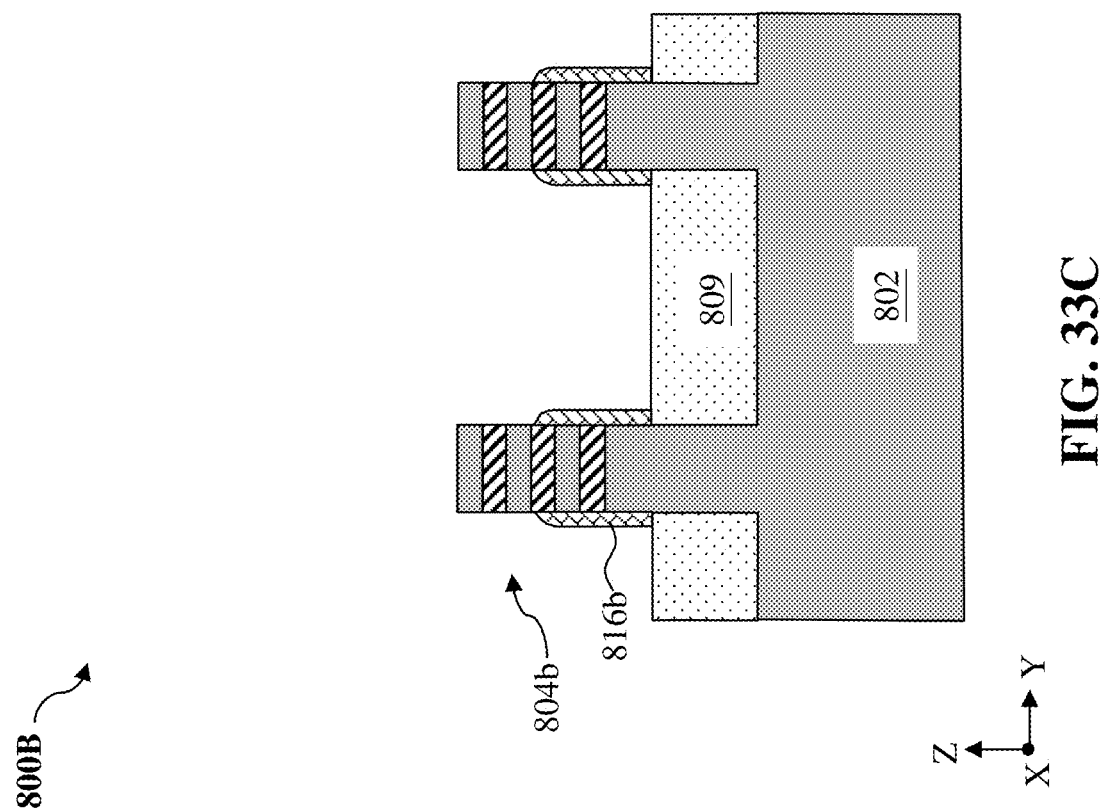
Figure 34B:
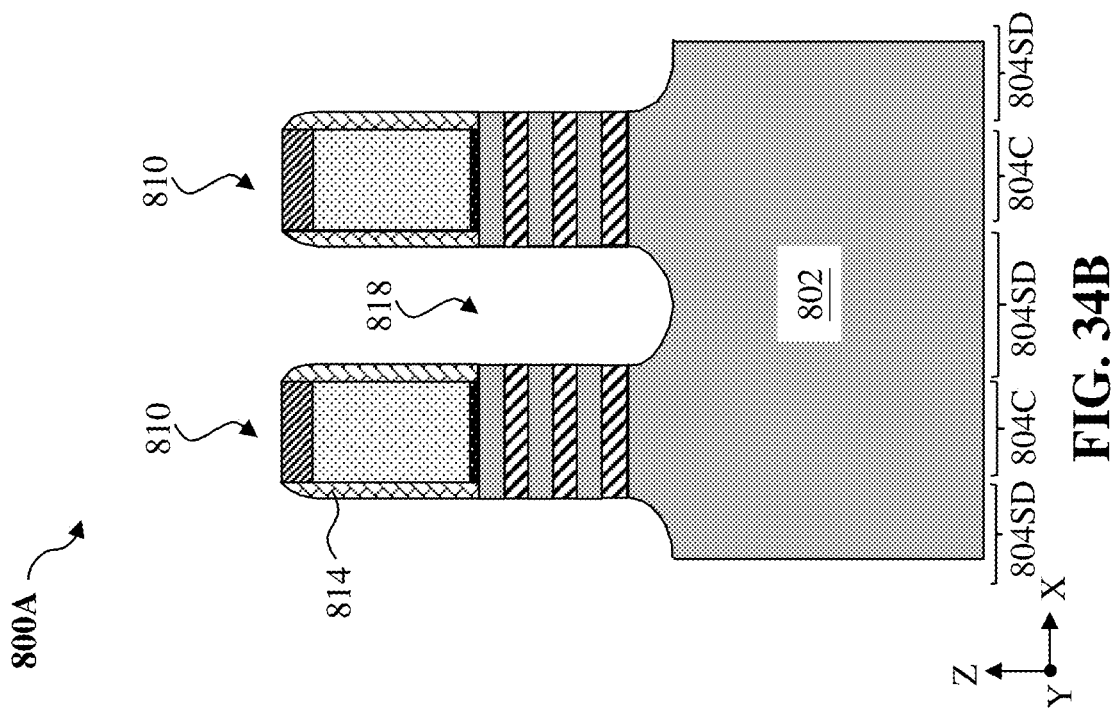
Figure 34A:
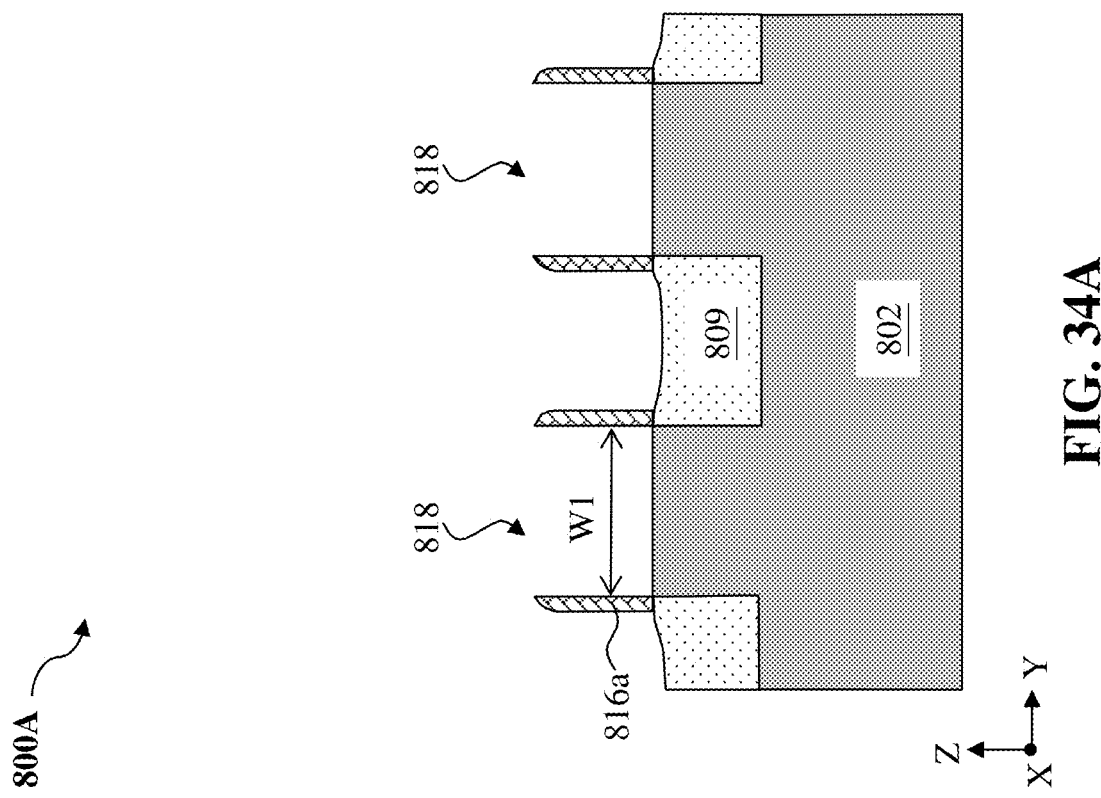
Figure 34D:
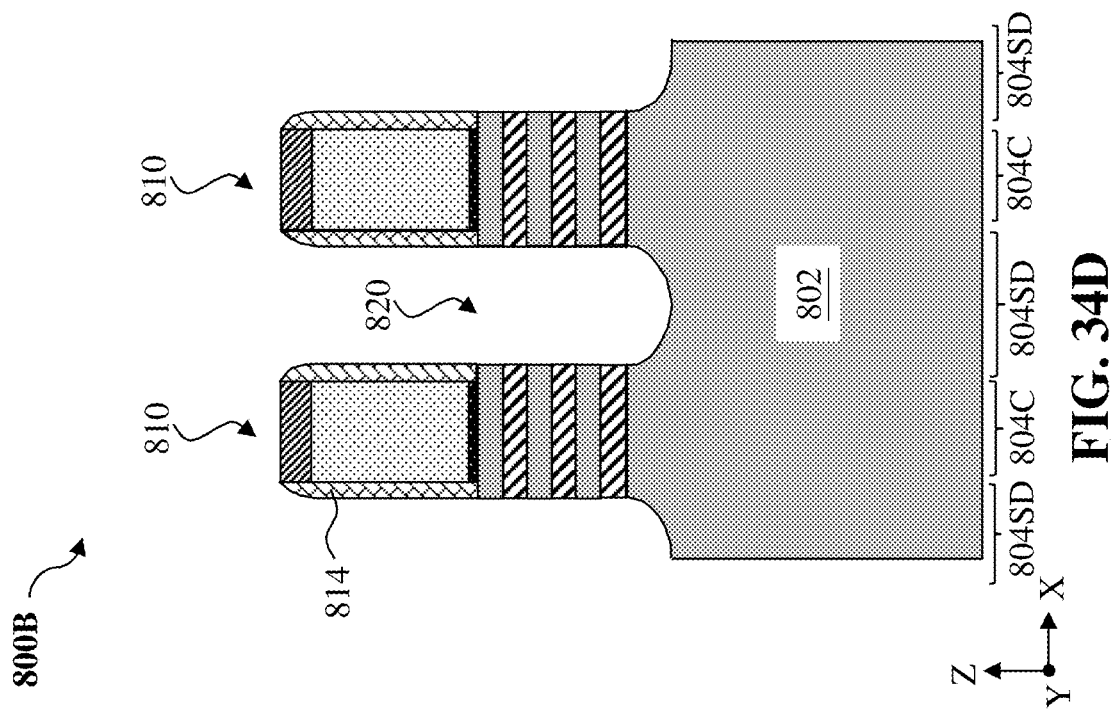
Figure 34C:
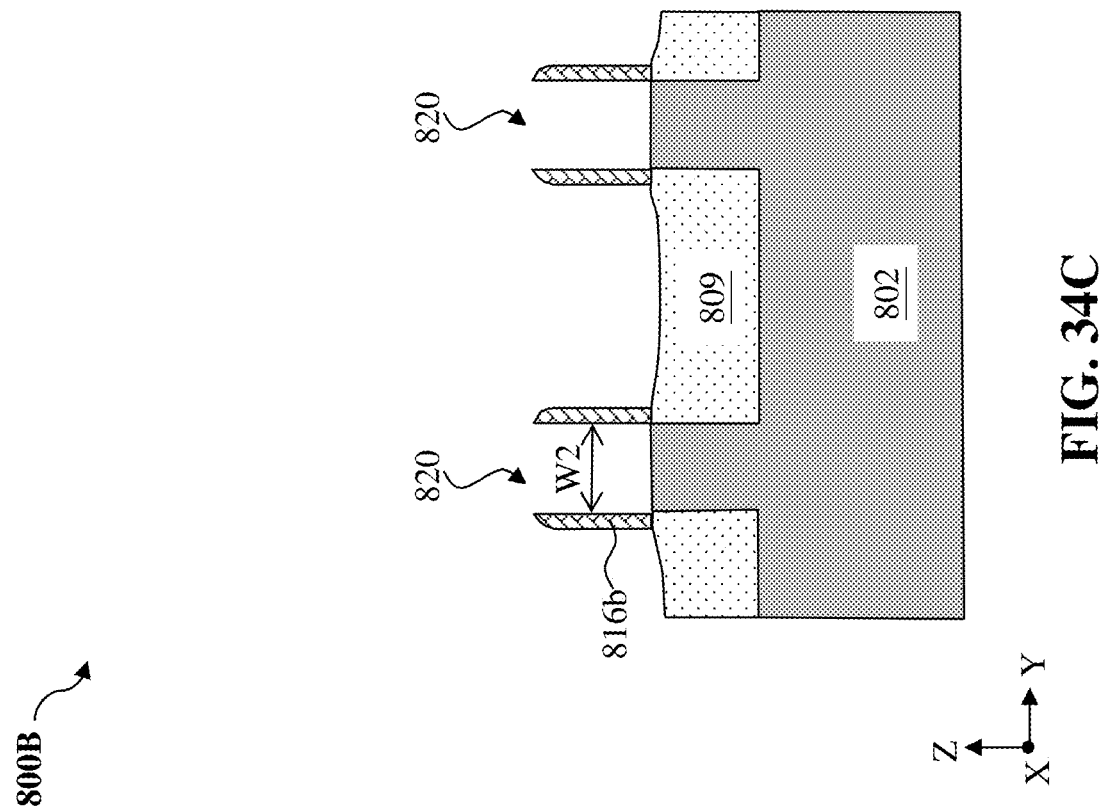
Figure 35B:
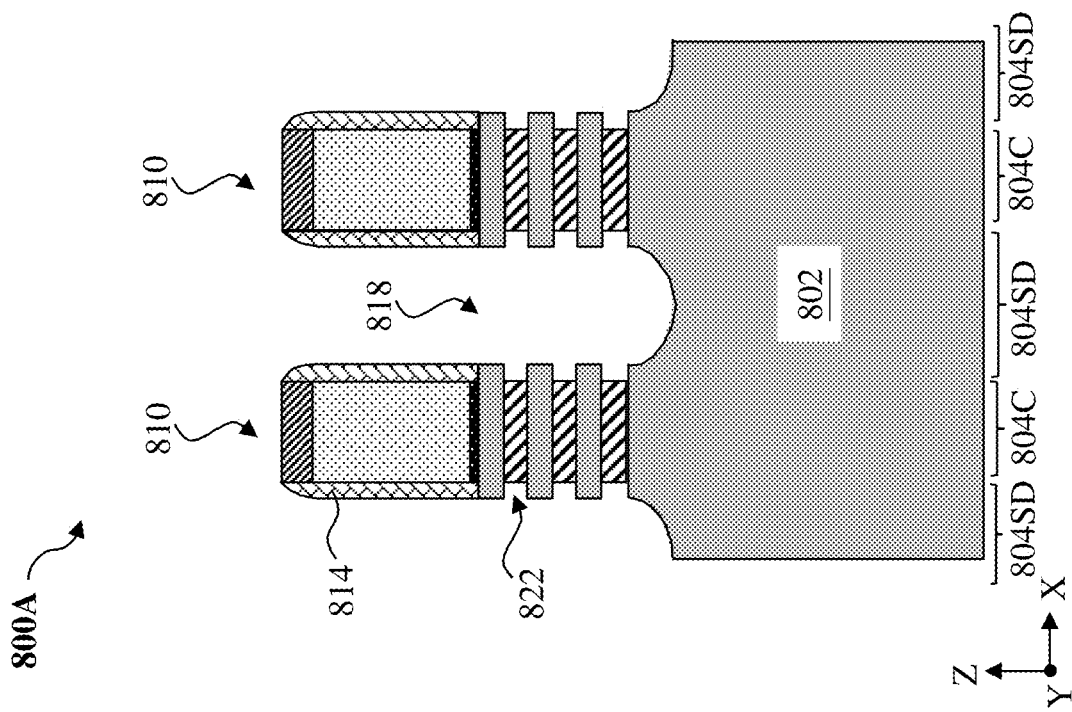
Figure 35A:
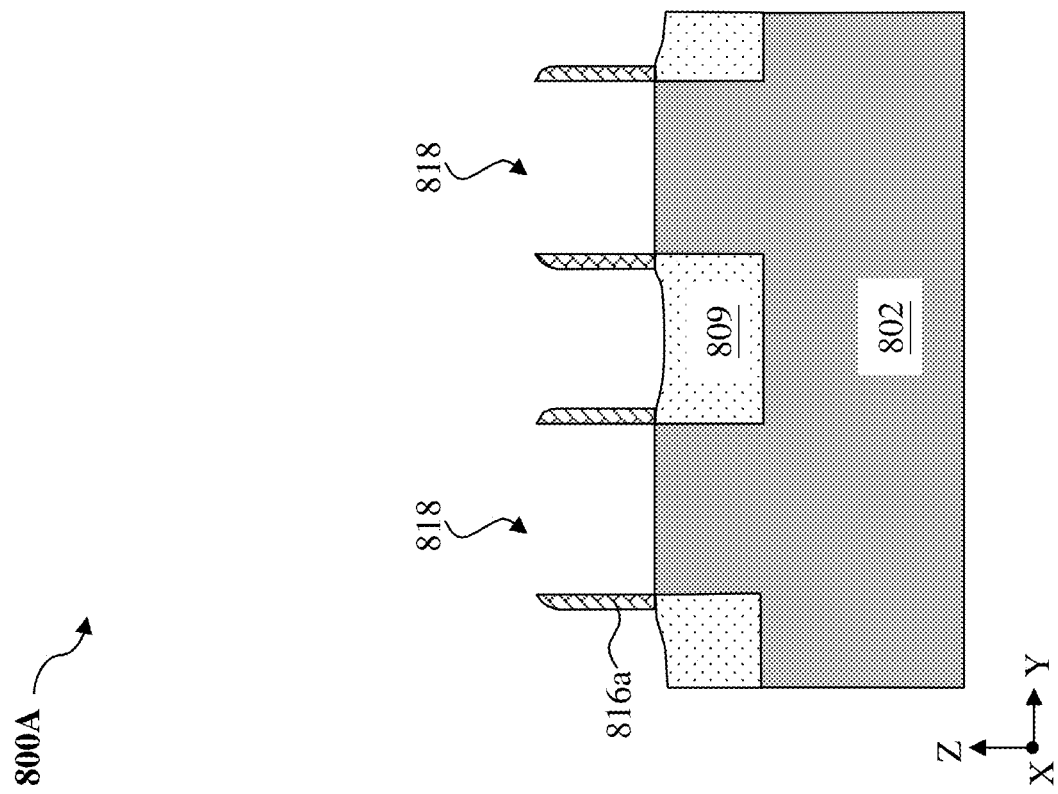
Figure 35D:
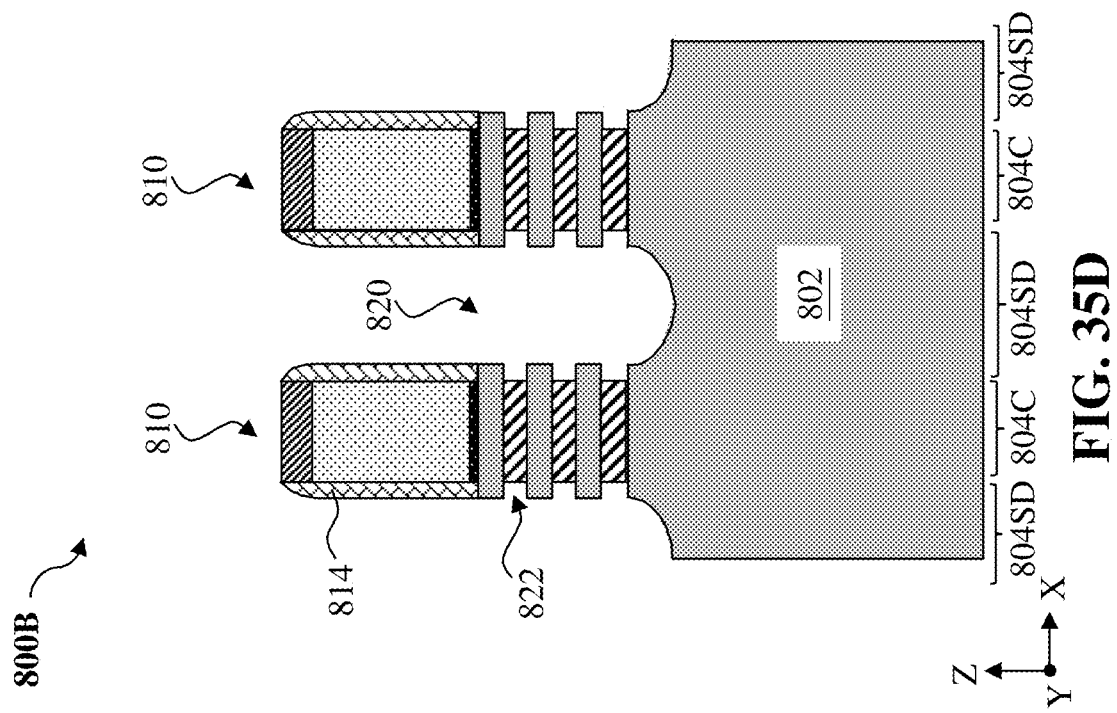
Figure 35C:
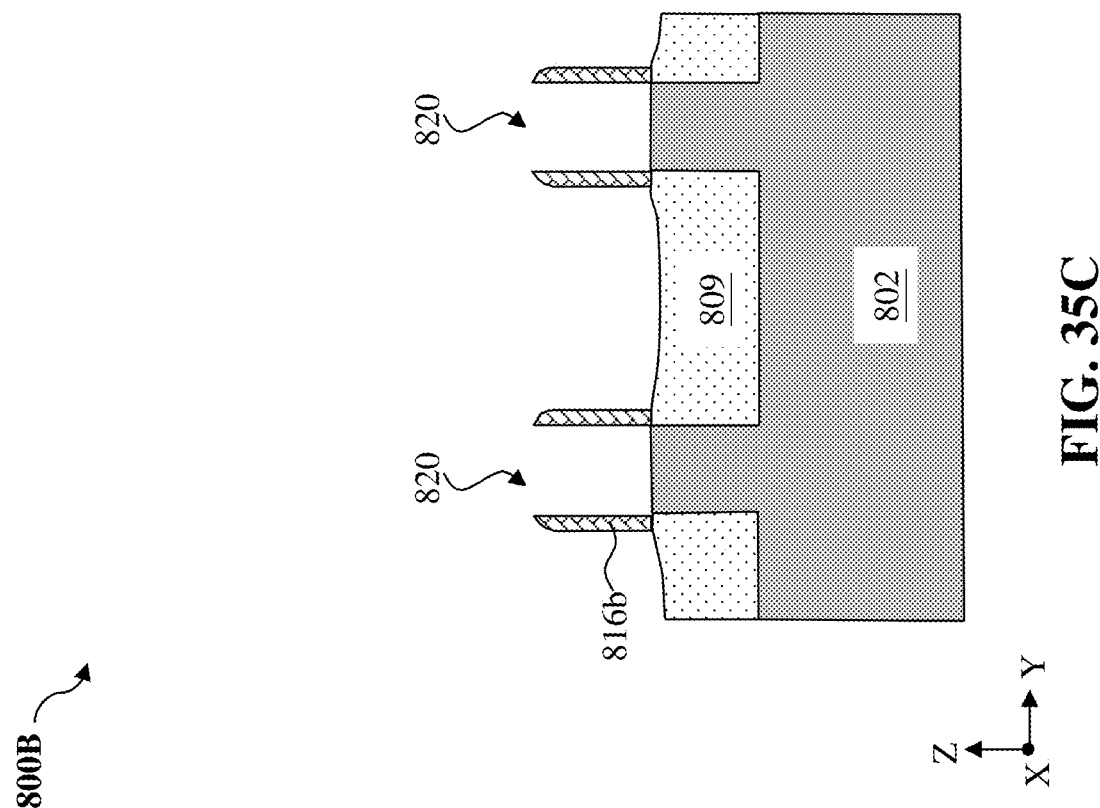

Referring to FIGS. 29, 33A, 33B, 33C, and 33D, method 700 includes a block 706 where the gate spacer layer 812 is etched back to form gate spacers 814 extending along sidewall surface of the gate stacks 810 and fin sidewall spacers 816*a*/816*b* extending along sidewall surfaces of the active regions 804*a*/804*b*. As shown in FIGS. 33A-33D, the gate spacer layer 812 is etched back to remove the gate spacer layer 812 from, for example, the top surfaces of the gate-top hard mask layers 213, the active regions 804*a* and 804*b*, and the isolation feature 809 to form the gate spacers 814 (shown in FIGS. 33B and 33D) extending along sidewall surface of the gate stacks 810. In some embodiments, the etch back of the gate spacer layer 812 may include performing an anisotropic etching process. The etch back of the gate spacer layer 812 also forms fin sidewall spacers 816*a* (shown in FIG. 33A) extending along sidewall surfaces of the active regions 804*a* in the first device region 800A and fin sidewall spacers 816*b* (shown in FIG. 33C) extending along sidewall surfaces of the active regions 804*b* in the second device region 800B, as represented in FIGS. 33A and 33C. The fin sidewall spacers 816*a*/816*b* are in direct contact with top surfaces of the isolation features 809.

Referring to FIGS. 29, 34A, 34B, 34C, and 34D, method 700 includes a block 708 where source/drain regions 804SD of the active regions 804*a* and 804*b* are recessed to form source/drain openings 818 and 820, respectively. More specifically, the source/drain regions 804SD of the active regions 804*a* in the first device region 800A are recessed to form the source/drain openings 818 (shown in FIG. 34A), and the source/drain regions 804SD of the active regions 804*b* in the second device region 800B are recessed to form the source/drain openings 820 (shown in FIG. 34C). The formation of the source/drain openings 818/820 are in a way similar to the formation of the source/drain openings 216 and repeated description is omitted for reason of simplicity. In the present embodiments, due to the different widths of the active regions 804*a* and the active regions 804*b*, the source/drain opening 818 in the first device region 800A spans a width W1 along the Y direction greater than a width W2 of the source/drain opening 820 in the second device region 800B.

Referring to FIGS. 29, 35A, 35B, 35C, and 35D, method 700 includes a block 710 where sacrificial layers 806 are selectively recessed to form inner spacer recesses 822. The formation of the inner spacer recesses 822 is in a way similar to the formation of the inner spacer recesses 218 and repeated description is omitted for reason of simplicity.

Figure 36D:
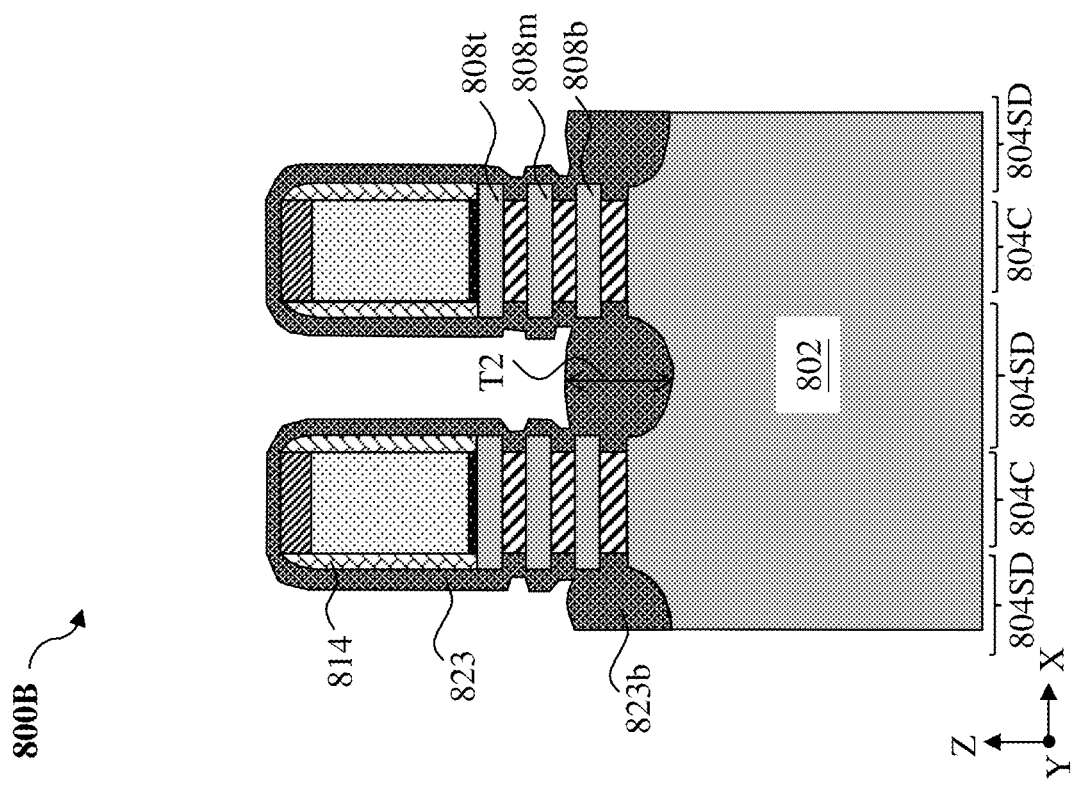
Figure 36C:
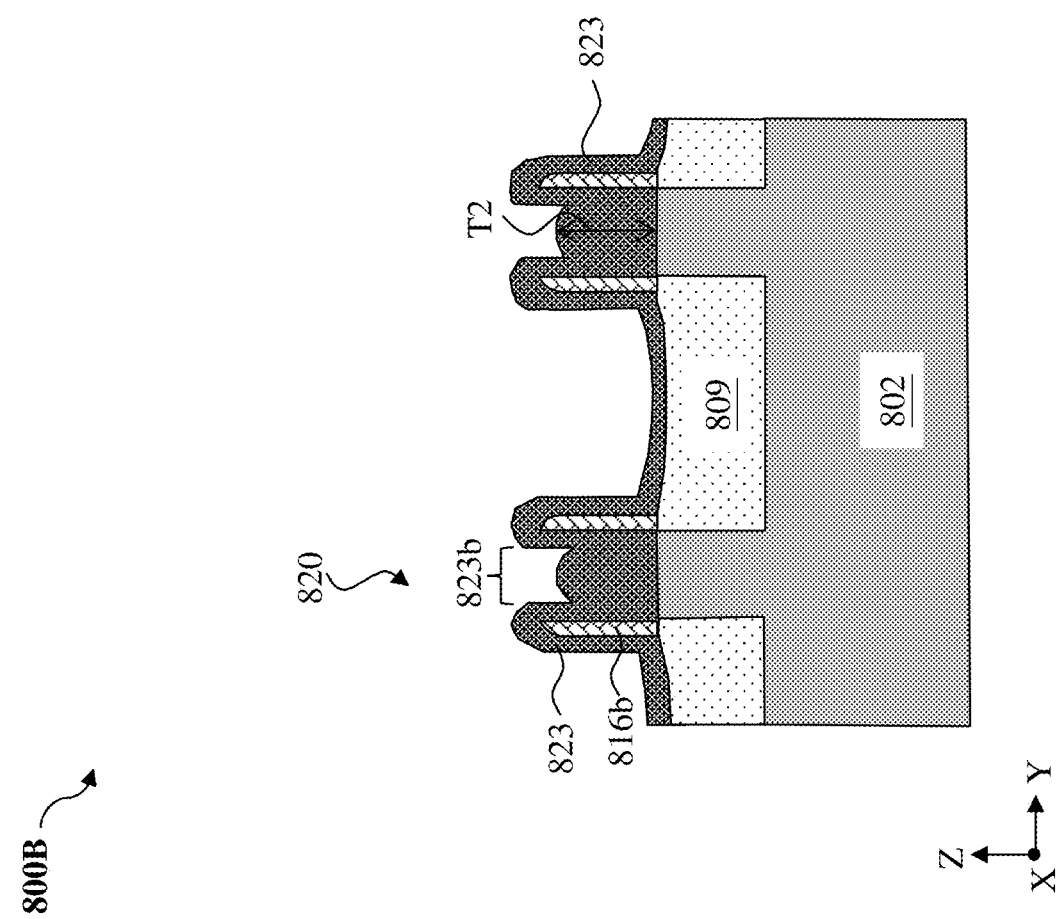

Referring to FIGS. 29, 36A, 36B, 36C, and 36D, method 700 includes a block 712 where a dielectric layer 823 is deposited over the workpiece 800. The dielectric layer 823 is deposited over the workpiece 800 by ALD, CVD, or any other suitable deposition process, including in the inner spacer recesses 822 as shown in FIGS. 36B and 36D and the source/drain openings 818 and 820 as show in FIGS. 36A and 36C. In the present embodiments, a deposition thickness T1 of the dielectric layer 823 is selected such that the dielectric layer 823 substantially fills the inner spacer recesses 822. The dielectric layer 823 may include silicon oxide, silicon nitride, silicon oxycarbide, silicon oxycarbonitride, silicon carbonitride, metal nitride, or a suitable dielectric material. In the present embodiments, due to loading effect and due to the width relationship between the source/drain opening 818 and source/drain opening 820 (i.e., W1>W2), a thickness T2 of a portion 823*b* of the dielectric layer 823 formed in the source/drain opening 820 shown in FIG. 36C is greater than a thickness T1 of a portion 823*a* of the dielectric layer 823 formed in the source/drain opening 818 shown in FIG. 36A. In the present embodiments, the deposition thickness of the dielectric layer 823 is further controlled such that a top surface of the portion 823*b* (shown in FIG. 36D) of the dielectric layer 823 is above a top surface of the bottommost channel layer 808*b*.

Figure 37B:
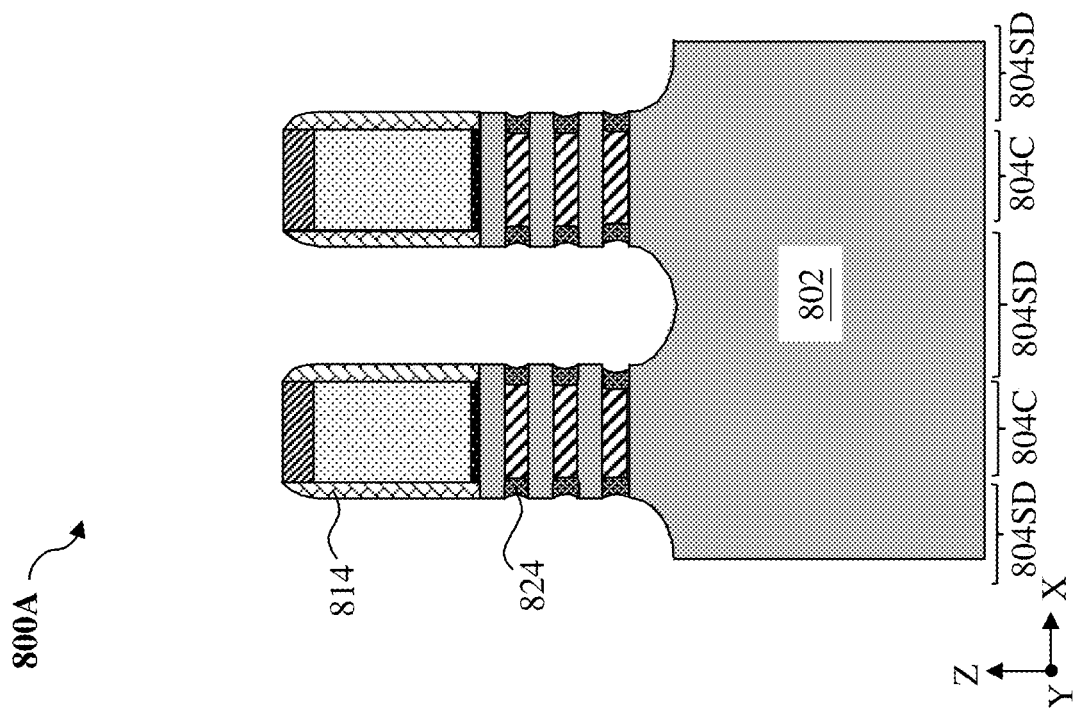
Figure 37A:
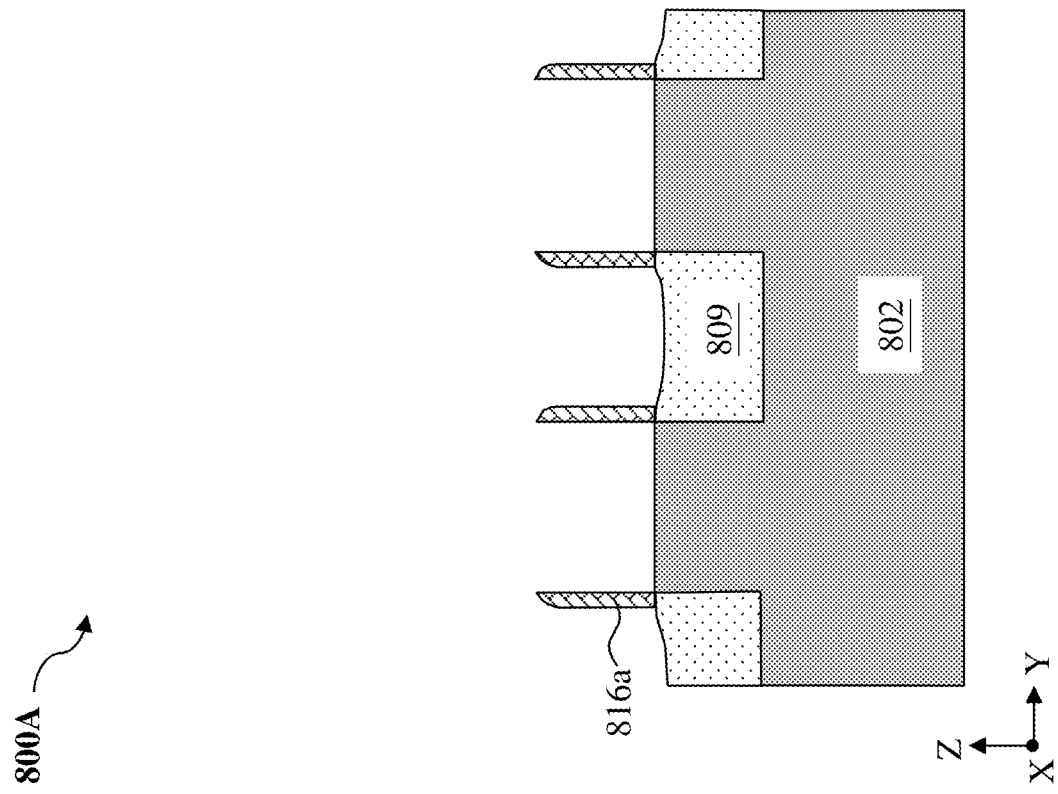
Figure 37D:
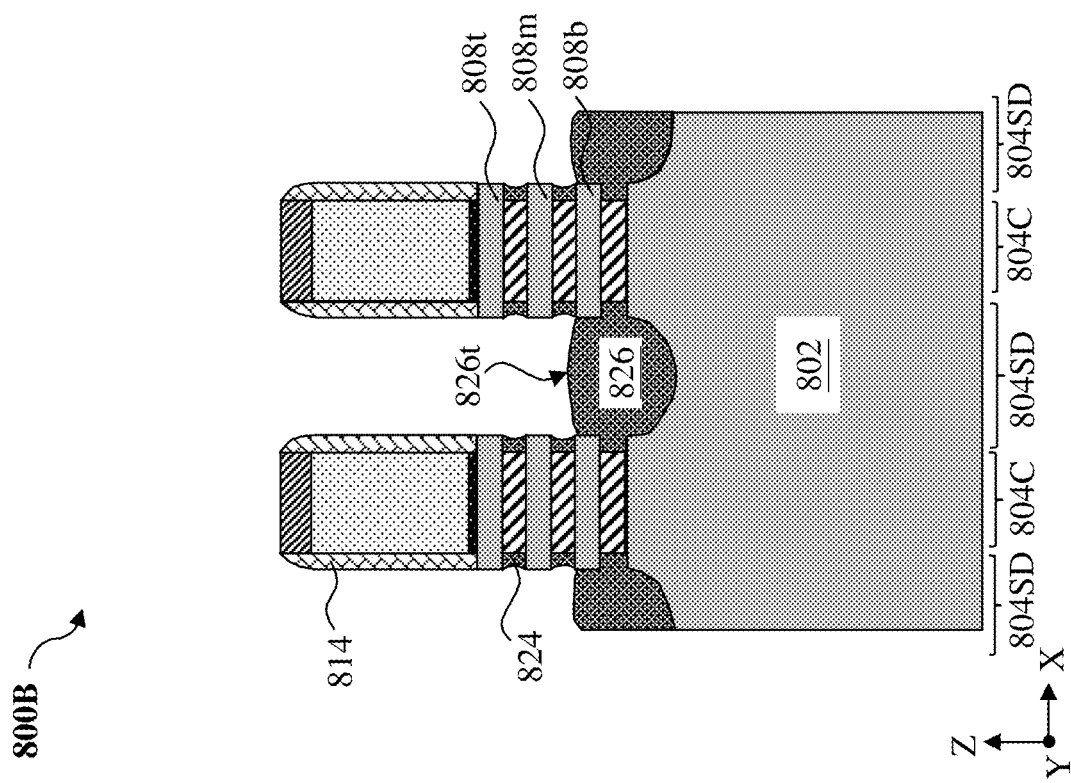
Figure 37C:
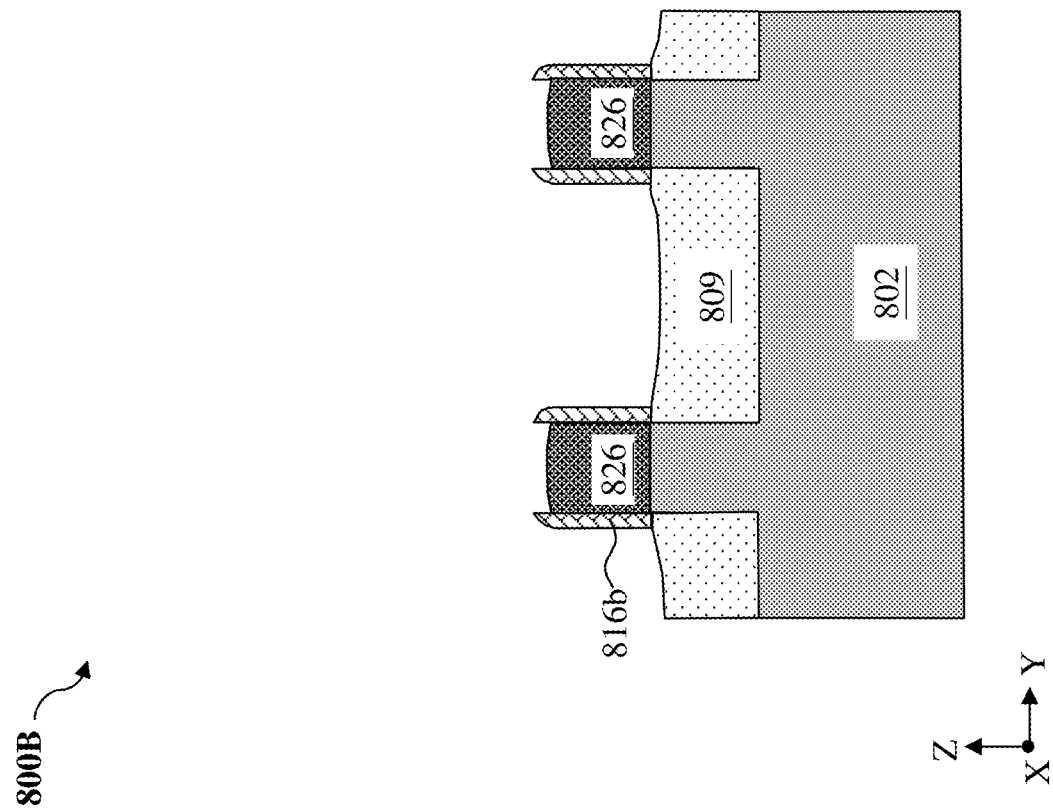
Figure 38B:
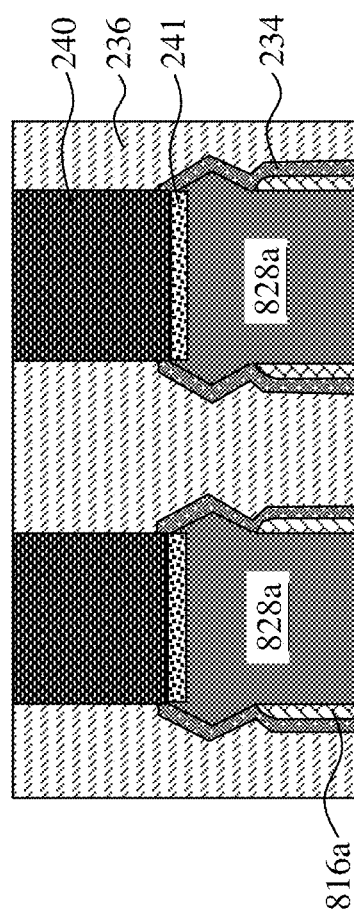
Figure 38A:
Figure 38D:
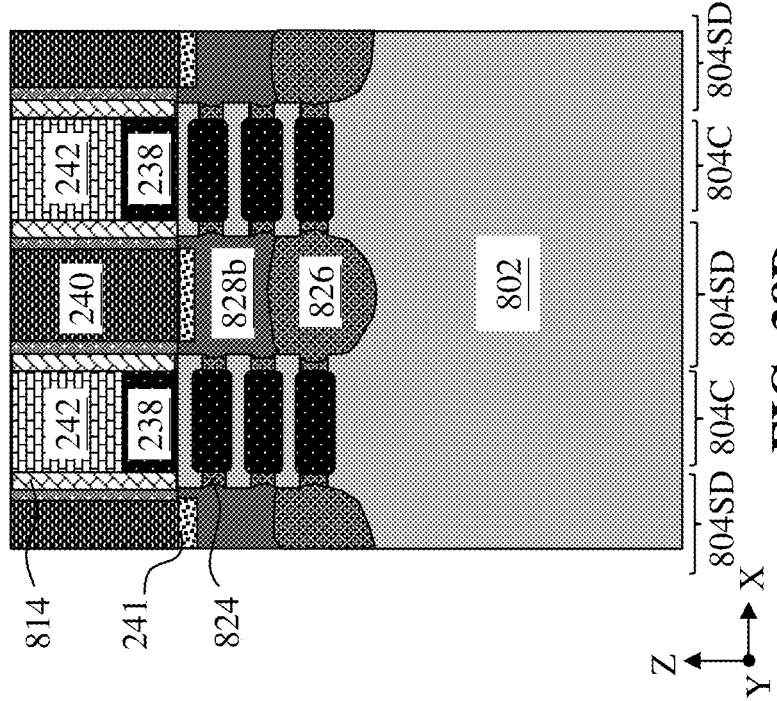
Figure 38C:
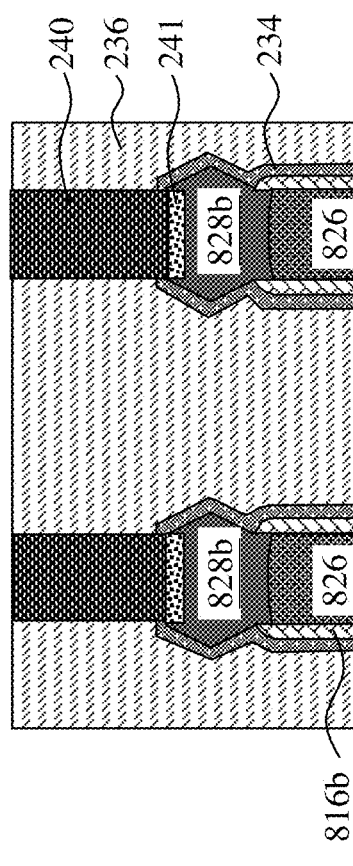

Referring to FIGS. 29, 37A, 37B, 37C, and 37D, method 700 includes a block 714 where the dielectric layer 823 is etched back to form inner spacer features 824 (shown in FIGS. 37B and 37D) in the first and second device regions 800A and 800B and dielectric features 826 (shown in FIG. 37C) in the second device region 800B. An etching process may be performed to etch back the dielectric layer 823 to remove excess dielectric layer 823 over, for example, sidewall surfaces of the channel layers 808, the gate stacks 810, and fin sidewall spacers 816*a*/816*b* and top surfaces of the gate stacks 810, thereby forming the inner spacer features 824 as shown in FIGS. 37B and 37D. Since the width W1 of the source/drain openings 818 in the first device region 800A is greater than the width W2 of the source/drain openings 820 in the second region device 800B, as a result of etch loading effect, the etching process may etch the portion 823*a* of the dielectric layer 823 at an etch rate greater than it etches the portion 823*b* of the dielectric layer 823. In addition, since the portion 823*b* is thicker than the portion 823*a*, after the etching process, as represented in FIG. 37A, the portion 823*a* may be substantially removed, and as represented in FIG. 37C, the portion 823*b* may be slightly recessed. The portion 823*b* after the etching process may be referred to as a dielectric feature 826 (shown in FIGS. 37C-37D). As shown in FIG. 37D, top surface 826*t* of the dielectric feature 826 is above a top surface of the bottommost channel layer 808*b*. In some embodiments, the top surface 826*t* the dielectric feature 826 may be lower than a top surface of the fin sidewall spacer 816*b*. In the present embodiments, without using photolithography technique, the dielectric feature 826 is formed in the second device region 800B without being formed in the first device region 800A. Therefore, the fabrication processes of forming the workpiece 800 that includes both the high-performance devices and low-leakage devices may be simplified, and associated cost may be advantageously reduced.

Referring to FIGS. 29, 38A, 38B, 38C, and 38D, method 700 includes a block 716 where source/drain features 828*a* are formed in the source/drain openings 818 of the first device region 800A and source/drain features 828*b* are formed in the source/drain openings 820 of the second device region 800B. The formation of the source/drain features 828*a* and 828*b* may be in a way similar to the formation of the source/drain features 230', and repeated description is omitted for reason of simplicity. In embodiments represented in FIGS. 38A-38B, a bottom portion of the source/drain feature 828*a* is confined along the Y direction by the fin sidewall spacers 816*a*, in direct contact with the substrate 802 along the Z direction, and in direct contact with the bottommost channel layer 808*b* along the X direction. In embodiments represented in FIGS. 38C-38D, the source/drain feature 828*b* is spaced apart from the substrate 802 by the dielectric feature 826 and is not in direct contact with the bottommost channel layer 808*b*. More specifically, the source/drain feature 828*b* is formed directly on the dielectric feature 826.

Referring to FIGS. 29, 38A, 38B, 38C, and 38D, method 700 includes a block 718 where the dummy gate stacks 810 are replaced by gate structures 238, a block 720 where source/drain contacts 240 are formed to electrically couple to the source/drain features 828*a*/828*b*, and a block 722 where further process may be performed. The formations of the gate structures 238, source/drain contacts 240, and other features (e.g., CESL 234, ILD layer 236, silicide layer 241, and self-aligned capping layer 242) have been described above with reference to FIGS. 13A-15B, and repeated description is omitted for reason of simplicity. As a result of the formation of the dielectric feature 826, a leakage current of the semiconductor device formed in the second device region 800B is less than a leakage current of the semiconductor device formed in the first device region 800A. Also, the number of channel layers that are in direct contact with the source/drain feature 828a is different from (i.e., greater than) the number of channel layers that are in direct contact with the source/drain feature 828b, thus, the drive current of the semiconductor device formed in the first device region 800A is greater than that of the semiconductor device formed in the second device region 800B.

Although not intended to be limiting, one or more embodiments of the present disclosure provide many benefits to a semiconductor structure and the formation thereof. The present disclosure provides methods and structures that can provide multi-gate devices (e.g., such as a GAA transistors) having a number of semiconductor channel layers selected based on the preferred performance (e.g., low leakage current or high drive current). The methods may be applied to active regions having same or different configurations (e.g., spacings and widths). In some embodiments, numbers of photolithography and masks used during the fabrication process may be reduced. By implementing the methods, different regions of a workpiece may be fabricated to GAAs having different performances.

The present disclosure provides for many different embodiments. Semiconductor structures and methods of fabrication thereof are disclosed herein. In one exemplary aspect, the present disclosure is directed to a method. The method includes receiving a workpiece that includes a channel region extending from a substrate and comprising a plurality of channel layers interleaved by a plurality of sacrificial layers, a source/drain region adjacent the channel region, and a dummy gate structure over the channel region. The method also includes recessing the source/drain region to form a source/drain opening, selectively etching the sacrificial layers to form inner spacer recesses, forming inner spacer features in the inner spacer recesses, forming a dielectric feature to fill a lower portion of the source/drain opening, wherein the dielectric feature substantially covers a sidewall surface of a bottommost channel layer of the plurality of channel layers, after the forming of the dielectric feature, forming a source/drain feature on the dielectric feature to fill an upper portion of the source/drain opening, removing the dummy gate structure, selectively removing the plurality of sacrificial layers, and forming a metal gate stack to wrap around each channel layer of the plurality of channel layers.

In some embodiments, the forming of the inner spacer features may include conformally depositing a first dielectric layer over the workpiece to fill the inner spacer recesses and etching back the first dielectric layer to form the inner spacer features. In some embodiments, the forming of the dielectric feature may include, after the conformally depositing of the first dielectric layer, performing consecutive steps of depositing and etching a second dielectric layer to form an inner portion of the dielectric feature. In some embodiments, the etching back of the first dielectric layer may be performed after the performing of the consecutive steps of depositing and etching of the second dielectric layer. In some embodiments, the etching back of the first dielectric layer may also form an outer portion of the dielectric feature, the inner portion of the dielectric feature may be embedded in the outer portion of the dielectric feature. In some embodiments, a composition of the second dielectric layer may be different than a composition of the first dielectric layer. In some embodiments, the dielectric feature may include an inner portion and an outer portion, a composition of the inner portion is different than a composition of the outer portion. In some embodiments, the forming of the source/drain feature on the dielectric feature may include forming a first semiconductor layer in the source/drain opening and forming a second semiconductor layer on the first semiconductor layer. The second semiconductor layer may be spaced apart from the inner spacer features and the dielectric feature by the first semiconductor layer. In some embodiments, the method may include, after the forming of the metal gate stack, selectively removing the substrate, after the selectively removing of the substrate, selectively removing the dielectric feature to expose a bottom surface of the source/drain feature and a sidewall surface of a bottommost channel layer of the channel layers, and forming a dielectric layer over the bottom surface of the source/drain feature.

In another exemplary aspect, the present disclosure is directed to a method. The method includes providing a workpiece that includes a substrate including a first region and a second region, a first channel region over the first region of the substrate, a first source/drain region adjacent the first channel region, a first gate structure over the first channel region, a second channel region over the second region of the substrate, a second source/drain region adjacent the second channel region, and a second gate structure over the second channel region. The method also include recessing the first and second source/drain regions to form a first source/drain opening and a second source/drain opening, respectively, forming a first dielectric feature to partially fill the first source/drain opening, forming a first source/drain feature in the first source/drain opening and on the first dielectric feature, forming a second source/drain feature in the second source/drain opening and on the substrate, and replacing the first and second gate structures with first and second gate stacks.

In some embodiments, the first channel region and the second channel region may be portions of a continuous active region, the continuous active region may include a plurality of channel layers interleaved by a plurality of sacrificial layers, a composition of the plurality of channel layers is different than composition of the plurality of sacrificial layers. In some embodiments, the first dielectric feature may be in direct contact with a bottommost channel layer of the plurality of channel layers, and a top surface of the first dielectric feature may be above a top surface of the bottommost channel layer of the channel layers. In some embodiments, the first dielectric feature may include an inner portion and an outer portion, the inner portion may be spaced apart from a bottommost channel layer of the plurality of channel layers by the outer portion. In some embodiments, the forming of the first dielectric feature may include, after the recessing of the first and second source/drain regions, depositing a conformal dielectric material layer over the workpiece, after the depositing of the conformal dielectric material layer, performing consecutive steps of depositing and etching a second dielectric layer and a third dielectric layer in the first and second source/drain openings, respectively, wherein a composition of the second dielectric layer is the same as a composition of the third dielectric layer, and after the performing of the consecutive steps of depositing and etching of the second dielectric layer and the third dielectric layer, etching back the conformal dielectric material layer to remove portions of the conformal dielectric material layer not covered by the second dielectric layer. In some embodiments, the method may also include, after the performing of the consecutive steps of depositing and etching of the second dielectric layer and the third dielectric layer and before the etching back of the conformal dielectric material layer, forming a mask film over the first region of the substrate to cover a portion of the conformal dielectric material layer over the first region of the substrate and expose a portion of the conformal dielectric material layer over the second region of the substrate, selectively removing the third dielectric layer in the second source/drain opening, and selectively removing the mask film.

In yet another exemplary aspect, the present disclosure is directed to a semiconductor structure. The semiconductor structure includes a first vertical stack of channel members disposed over a substrate, a first gate structure wrapping around each channel member of the first vertical stack of channel members, a dielectric feature disposed directly on the substrate and in direct contact with a portion of the first vertical stack of channel members, and a first source/drain feature disposed directly on the dielectric feature and electrically coupled to a remaining portion of the first vertical stack of channel members.

In some embodiments, the semiconductor structure may include a second vertical stack of channel members disposed over the substrate, a second gate structure wrapping around each channel member of the second vertical stack of channel members, and a second source/drain feature coupled to each channel member of the second vertical stack of channel members. In some embodiments, the dielectric feature may include an inner layer embedded in an outer layer, and the first source/drain feature may be in direct contact with top surfaces of the outer layer and inner layer. In some embodiments, the second source/drain feature may be in direct contact with the substrate. In some embodiments, the first vertical stack of channel members may include a first channel member, a second channel member over the first channel member, and a third channel member over the second channel member, the dielectric feature may cover a sidewall surface of the first channel member, and the first source/drain feature may be in direct contact with a sidewall surface of the second channel member and a sidewall surface of the third channel member.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving a workpiece comprising:
        a channel region extending from a substrate and comprising a plurality of channel layers interleaved by a plurality of sacrificial layers,
        a source/drain region adjacent the channel region, and
        a dummy gate structure over the channel region;
    recessing the source/drain region to form a source/drain opening;
    selectively etching the sacrificial layers to form inner spacer recesses;
    forming inner spacer features in the inner spacer recesses;
    forming a dielectric feature to fill a lower portion of the source/drain opening, wherein the dielectric feature substantially covers a sidewall surface of a bottommost channel layer of the plurality of channel layers;
    after the forming of the dielectric feature, forming a source/drain feature on the dielectric feature to fill an upper portion of the source/drain opening;
    removing the dummy gate structure;
    selectively removing the plurality of sacrificial layers; and
    forming a metal gate stack to wrap around each channel layer of the plurality of channel layers.

2. The method of claim 1, wherein the forming of the inner spacer features comprises:
    conformally depositing a first dielectric layer over the workpiece to fill the inner spacer recesses; and
    etching back the first dielectric layer to form the inner spacer features.

3. The method of claim 2, wherein the forming of the dielectric feature comprises:
    after the conformally depositing of the first dielectric layer, performing consecutive steps of depositing and etching a second dielectric layer to form an inner portion of the dielectric feature.

4. The method of claim 3,
    wherein the etching back of the first dielectric layer is performed after the performing of the consecutive steps of depositing and etching of the second dielectric layer.

5. The method of claim 4,
    wherein the etching back of the first dielectric layer further forms an outer portion of the dielectric feature, wherein the inner portion of the dielectric feature is embedded in the outer portion of the dielectric feature.

6. The method of claim 5, wherein a composition of the second dielectric layer is different than a composition of the first dielectric layer.

7. The method of claim 1, wherein the dielectric feature comprises an inner portion and an outer portion, a composition of the inner portion is different than a composition of the outer portion.

8. The method of claim 1, wherein the forming of the source/drain feature on the dielectric feature comprises:
    forming a first semiconductor layer in the source/drain opening; and
    forming a second semiconductor layer on the first semiconductor layer,
    wherein the second semiconductor layer is spaced apart from the inner spacer features and the dielectric feature by the first semiconductor layer.

9. The method of claim 1, further comprising:
    after the forming of the metal gate stack, selectively removing the substrate;
    after the selectively removing of the substrate, selectively removing the dielectric feature to expose a bottom surface of the source/drain feature and a sidewall surface of a bottommost channel layer of the channel layers; and
    forming a dielectric layer over the bottom surface of the source/drain feature.

10. A method, comprising:
    providing a workpiece comprising:
        a substrate including a first region and a second region,
        a first channel region over the first region of the substrate,
        a first source/drain region adjacent the first channel region,
        a first gate structure over the first channel region, a second channel region over the second region of the substrate, a second source/drain region adjacent the second channel region, and a second gate structure over the second channel region;

recessing the first and second source/drain regions to form a first source/drain opening and a second source/drain opening, respectively;

forming a first dielectric feature to partially fill the first source/drain opening;

forming a first source/drain feature in the first source/drain opening and on the first dielectric feature;

forming a second source/drain feature in the second source/drain opening and on the substrate; and replacing the first and second gate structures with first and second gate stacks.

11. The method of claim 10, wherein the first channel region and the second channel region are portions of a continuous active region, and wherein the continuous active region comprises a plurality of channel layers interleaved by a plurality of sacrificial layers, a composition of the plurality of channel layers is different than composition of the plurality of sacrificial layers.

12. The method of claim 11, wherein the first dielectric feature is in direct contact with a bottommost channel layer of the plurality of channel layers, and a top surface of the first dielectric feature is above a top surface of the bottommost channel layer of the channel layers.

13. The method of claim 11, wherein the first dielectric feature comprises an inner portion and an outer portion, wherein the inner portion is spaced apart from a bottommost channel layer of the plurality of channel layers by the outer portion.

14. The method of claim 13, wherein the forming of the first dielectric feature comprises:

after the recessing of the first and second source/drain regions, depositing a conformal dielectric material layer over the workpiece;

after the depositing of the conformal dielectric material layer, performing consecutive steps of depositing and etching a second dielectric layer and a third dielectric layer in the first and second source/drain openings, respectively, wherein a composition of the second dielectric layer is the same as a composition of the third dielectric layer; and after the performing of the consecutive steps of depositing and etching of the second dielectric layer and the third dielectric layer, etching back the conformal dielectric material layer to remove portions of the conformal dielectric material layer not covered by the second dielectric layer.

15. The method of claim 14, further comprising:

after the performing of the consecutive steps of depositing and etching of the second dielectric layer and the third dielectric layer and before the etching back of the conformal dielectric material layer, forming a mask film over the first region of the substrate to cover a portion of the conformal dielectric material layer over the first region of the substrate and expose a portion of the conformal dielectric material layer over the second region of the substrate;

selectively removing the third dielectric layer in the second source/drain opening; and selectively removing the mask film.

16. A method, comprising:

forming a fin-shaped structure over a substrate, the fin-shaped structure comprising a vertical stack of alternating channel layers and sacrificial layers;

forming a trench extending through the fin-shaped structure, the trench exposing sidewall surfaces of the channel layers and sacrificial layers;

after the forming of the trench, forming a dielectric feature extending along a sidewall surface of a bottommost channel layer of the channel layers; and after the forming of the dielectric feature, forming a source/drain feature in the trench and electrically coupled to a topmost channel layer of the channel layers, wherein a bottom surface of the source/drain feature is above a top surface of the bottommost channel layer.

17. The method of claim 16, further comprising:

after the forming of the trench, selectively recessing the sacrificial layers to form inner spacer recesses, wherein the dielectric feature further substantially fills a bottommost inner spacer recess of the inner spacer recesses.

18. The method of claim 17, further comprising:

forming an inner spacer feature in a topmost inner spacer recess of the inner spacer recesses, wherein the inner spacer feature and the dielectric feature have a same composition and are formed simultaneously.

19. The method of claim 16, further comprising:

forming a dielectric layer on the dielectric feature, thereby substantially filling a lower portion of the trench, wherein the dielectric layer and the dielectric feature have different compositions.

20. The method of claim 16, further comprising:

selectively removing the recessed sacrificial layers to form openings; and forming a gate structure in the openings and over the topmost channel layer of the channel layers.

* * * * *